US012701972B2

(12) United States Patent
Huang et al.

(10) Patent No.: US 12,701,972 B2
(45) Date of Patent: Aug. 4, 2026

(54) SEMICONDUCTOR STRUCTURE AND MANUFACTURING METHOD THEREOF

(71) Applicant: TAIWAN SEMICONDUCTOR MANUFACTURING COMPANY, LTD., Hsinchu (TW)

(72) Inventors: Yu-Lien Huang, Hsinchu County (TW); Chih-Cheng Liu, Hsinchu (TW); Tze-Liang Lee, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 644 days.

(21) Appl. No.: 17/896,726

(22) Filed: Aug. 26, 2022

(65) Prior Publication Data

US 2024/0087890 A1 Mar. 14, 2024

(51) Int. Cl.

| | |
|---|---|
| ***H10P 76/40*** | (2026.01) |
| ***G03F 7/004*** | (2006.01) |
| ***G03F 7/20*** | (2006.01) |
| ***H10P 50/00*** | (2026.01) |
| ***H10P 50/26*** | (2026.01) |
| ***H10P 50/28*** | (2026.01) |

(52) U.S. Cl.

CPC ........ *H10P 76/4085* (2026.01); *H10P 50/267* (2026.01); *H10P 50/283* (2026.01); *H10P 50/287* (2026.01); *H10P 50/71* (2026.01); *H10P 50/73* (2026.01); *G03F 7/0043* (2013.01); *G03F 7/2004* (2013.01)

(58) Field of Classification Search

None

See application file for complete search history.

(56) References Cited

U.S. PATENT DOCUMENTS

| | | | | |
|---|---|---|---|---|
| 11,094,543 | B1 * | 8/2021 | Han | H10P 76/204 |
| 11,605,539 | B2 * | 3/2023 | Han | H10P 76/204 |
| 2015/0132965 | A1 * | 5/2015 | deVilliers | H10P 50/73<br>438/703 |
| 2020/0006082 | A1 * | 1/2020 | Su | H10P 50/73 |
| 2021/0217614 | A1 * | 7/2021 | Lutker-Lee | H10P 76/2041 |
| 2021/0389670 | A1 * | 12/2021 | Chen | G03F 7/0382 |
| 2022/0005687 | A1 * | 1/2022 | Liu | G03F 7/167 |
| 2022/0019149 | A1 * | 1/2022 | Piumi | G03F 7/70783 |
| 2022/0382159 | A1 * | 12/2022 | Clark | G03F 7/0045 |

(Continued)

OTHER PUBLICATIONS

Hiroki Yamamoto et al., "Polymer-Structure Dependence of Acid Generation in Chemically Amplified Extreme Ultraviolet Resists", Japanese Journal of Applied Physics vol. 46, No. 7, 2007, pp. L142-L144.

(Continued)

*Primary Examiner* — Dale E Page
*Assistant Examiner* — Rohit Parthasarathy
(74) *Attorney, Agent, or Firm* — Birch, Stewart, Kolasch & Birch, LLP

(57) ABSTRACT

A method includes depositing a photoresist layer over a target layer, the photoresist layer comprising an organometallic material; exposing the photoresist layer to an extreme ultraviolet (EUV) radiation; developing the exposed photoresist layer to form a photoresist pattern; forming a spacer on a sidewall of the photoresist pattern; removing the photoresist pattern; after removing the photoresist pattern, patterning the target layer through the spacer.

20 Claims, 23 Drawing Sheets

(56) References Cited

U.S. PATENT DOCUMENTS

| | | | | |
|---|---|---|---|---|
| 2024/0085795 | A1* | 3/2024 | Grzeskowiak | G03F 7/0045 |
| 2024/0168384 | A1* | 5/2024 | Murphy | G03F 7/168 |
| 2024/0178230 | A1* | 5/2024 | Hwang | H10D 84/907 |

OTHER PUBLICATIONS

Seiichi Tagawa et al., "Radiation and Photochemistry of Onium Salt Acid Generators in Chemically Amplified Resists", Advances in Resist Technology and Processing XVII, SPIE's Microlithography 2000, vol. 3999-20, 2000.

* cited by examiner

SEMICONDUCTOR STRUCTURE AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
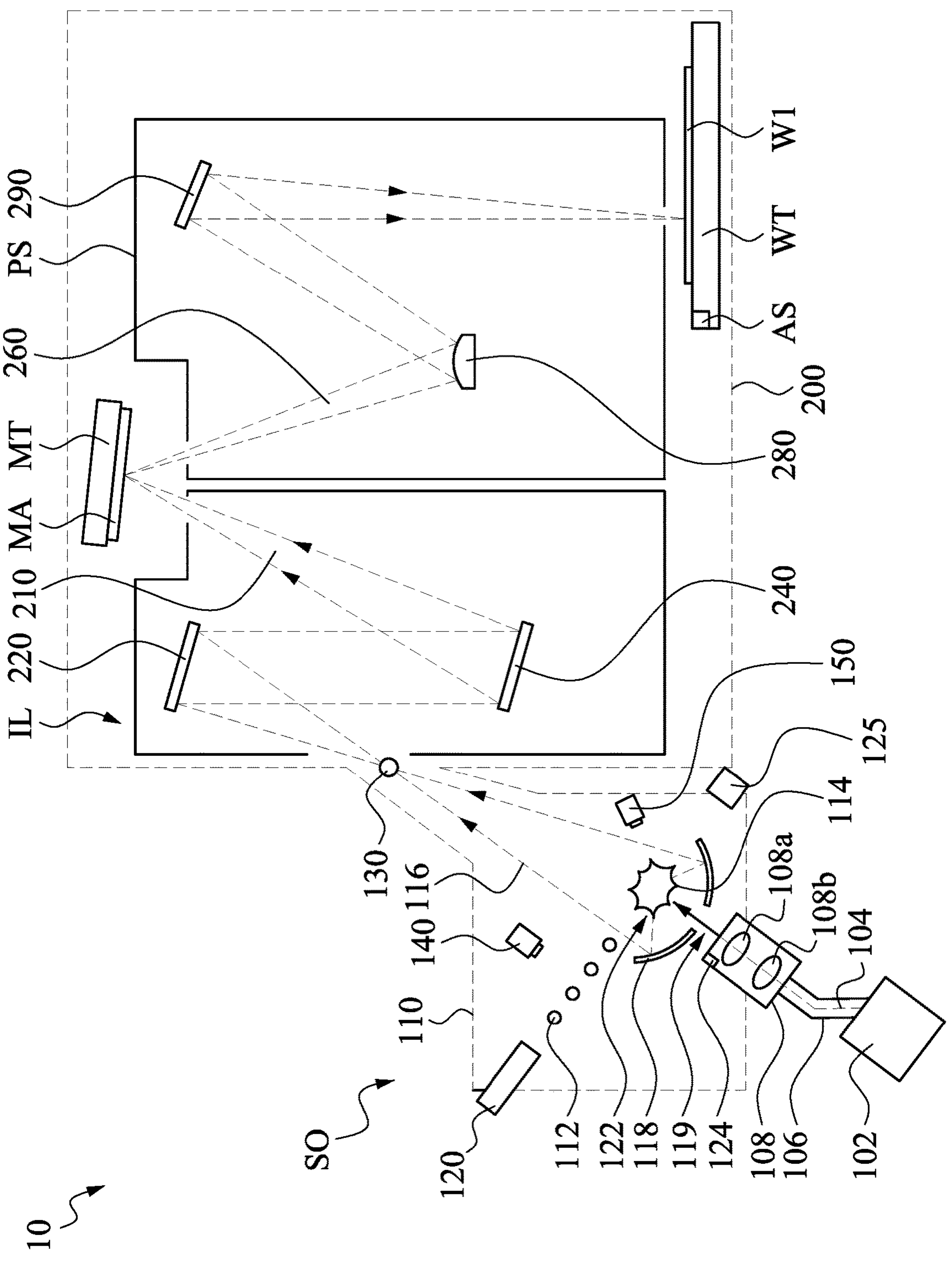
FIG. 1 is a schematic view of lithography system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the course of IC evolution, functional density (i.e., the number of interconnected devices per chip area) has generally increased while geometry size (i.e., the smallest component (or line) that can be created using a fabrication process) has decreased. For these advances to be realized, developments in IC processing and manufacturing are needed. For example, mandrels are provided to be formed over a target patterned layer. Subsequently, sidewall spacers are formed on the mandrels. Subsequently, the mandrels are removed to provide a pattern of spacer elements to functions as an etch mask to pattern the target patterned layer. However, the mandrels may be not enough to improve the critical dimension control on patterned features during the lithography process.

Therefore, the present disclosure in various embodiments provides a mandrel having a composition including an organometallic material and a photoacid generator. The organometallic material in the mandrel can absorb the radiation during the lithography process, which in turn reduces the critical dimension of the patterned features. Secondly, the organometallic material may lower the thickness of the mandrel, such that the collapse risks of the mandrel or the pattern of the spacer elements can be reduced. Thirdly, the organometallic material may provide a high etching selectivity relative to the underlying layer, such that the underlying layer can be only minimally consumed during an etching process. In addition, the photoacid generator in the mandrel can allow the mandrel serving as a positive tone resist or a negative tone resist for the lithography process.

Reference is made to FIG. 1. FIG. 1 is a schematic view of lithography system in accordance with some embodiments of the present disclosure. There is an extreme ultraviolet (EUV) lithography system 10. Although the EUV lithography system 10 is illustrated as having a certain configuration of components, it will be appreciated that the disclosed EUV lithography system 10 may include additional components (e.g., additional mirrors) or having less components (e.g., less mirrors). In FIG. 1, the EUV lithography system 10 includes a source collector module SO that includes a source vessel 110. A droplet generator 120 is connected to the source vessel 110 and is configured to generate a plurality of fuel droplets 112. In some embodiments, the fuel droplets 112 generated by the fuel droplet generator 120 are provided into the EUV source vessel 110. In some embodiments, the fuel droplets 112 may include tin (Sn). In some embodiments, the fuel droplets 112 may include a different metal material. In some embodiments, the source vessel 110 can also be referred to as a radiation source, in which radiation source employs a laser produced plasma (LPP) mechanism to generate plasma and further generate EUV light from the plasma. In some embodiments, the first gas exhaust rate in the source vessel 110 shown in FIG. 1 is less than about 400 L/s. In some embodiments, a pressure in the source vessel 110 shown in FIG. 1 is in a range from about 1 mm Bar to about 3 mm Bar in response to the first gas exhaust rate. Thus, a selected gas number density in the irradiation region 122 of the source vessel 110 and/or a selected gas composition, e.g. a selected ratio of several gases, e.g. $H_2$, HBr, He, etc can be maintained. Therefore, amount of the plasma 114 can be generated for creating effective and efficient EUV light.

The EUV lithography system 10 may also include a droplet position detection system which may include a droplet imager 140 disposed in the source vessel 110 that captures an image of one or more fuel droplets 112. The droplet imager 140 may provide this captured image to a droplet position detection feedback system (not shown), which can, e.g., generate a droplet position and trajectory in response an analysis result of the captured image. The position detection feedback system can thus generate a droplet error in response to the generated droplet position and trajectory, e.g., based on a droplet-by-droplet basis, or on average. In some embodiments, the droplet imager 140 may include a fine droplet steering camera (FDSC), a droplet formation camera (DFC), and/or suitable devices.

The EUV lithography system 10 further includes a primary laser having a laser source 102 configured to produce a laser beam 104. In some embodiments, the laser source 102 may include a multi-stage laser having a plurality of stages configured to amplify laser light produced by a prior stage. The laser beam 104 passes through a beam transport system 106 configured to provide the laser beam to a focusing system 108. The beam transport system 106 receives the light beam 104 and steers and modifies the light beam 104 as needed and outputs the light beam 104 to the focusing system 108. The focusing system 108 includes one or more lenses 108*a*, 108*b* and/or mirrors arranged within a beam line and configured to focus the laser beam 104. The laser beam 104 is output from the focusing system 108 to the EUV source vessel 110 along a drive axis toward an irradiation region 122. The f focusing system 108 can also steer the beam 104 or adjust a position of the beam 104 relative to the irradiation region 122. The drive axis of the amplified laser beam 104 can be considered as the approximate center of the laser beam 104 or the general direction that the laser beam 104 is traveling because the laser beam 104 may be irregularly shaped and/or asymmetrical.

The laser beam 104 transmits through a collector mirror 118 located within the source vessel 110. Then, the primary laser beam 104 generated by the laser source 102 intersects the fuel droplets 112. In some embodiments, the primary laser beam 104 may be a carbon dioxide ($CO_2$) laser. In some embodiments, the primary laser beam 104 may include alternative types of lasers. When the primary laser beam 104 strikes the fuel droplets 112, the primary laser beam 104 heats the fuel droplets 112 to a critical temperature. At the critical temperature, the fuel droplets 112 shed their electrons and become plasma 114 including a plurality of ions at the irradiation region 122. In some embodiments, the ions emit EUV radiation 116 (e.g., having a wavelength of approximately 13.3 nm to about 13.9 nm, such as 13.3, 13.4, 13.5, 13.6, 13.7, 13.8, or 13.9 nm).

By-products of the EUV radiation 116 may include metal dust, target material vapor and micro-droplets or clusters and can be in several forms, for example, when tin, e.g., pure tin, or a tin compound, e.g., $SnBr_4$, $SnH_4$, $SnBr_2$ etc, is used as the source material, the by-products may include tin and tin compounds including oxides. Dusts and other contaminates, e.g., from collector mirror 118 erosion, etc. may also be present in the source vessel 110. These by-products may, among other things, damage optics and absorb/scatter EUV radiation 116. In some embodiments, target material debris deposits can be present in many forms. By way of example, particulates, can deposit on the surface of the collector mirror 118.

In some embodiments, the collector mirror 118 has a concave curvature. In some embodiments, the collector mirror 118 includes a center aperture 119. The center aperture 119 allows the primary laser beam 104 to pass through to an irradiation region 122. In some embodiments, the collector mirror 118 may include a multi-layer coating having alternating layers of different materials. For example, in some embodiments, the collector mirror 118 may include alternating layers of molybdenum and silicon configured to operate as a Bragg reflector. The concave curvature of the collector mirror 118 focuses the EUV radiation 116 generated by the plasma 114 toward an intermediate focus (IF) unit 130 within an exit aperture of the source vessel 110. The intermediate focus unit 130 is located between the source vessel 110 and a scanner 200 including optical elements configured to direct the EUV radiation 116 to a workpiece (e.g., a semiconductor substrate). In some embodiments, the intermediate focus unit 130 may include a cone shaped aperture configured to provide for separation of pressures between the source vessel 110 and the scanner 200. In some embodiments, the intermediate focus unit 130 may extend into the scanner 200 which including an illumination system IL and a projection system PS. The EUV radiation 116 output from the source vessel 110 is provided to an illumination optics unit IL by way of the intermediate focus unit 130.

The EUV radiation 116 traverses the illumination system IL, which may include a facetted field mirror device 220 and a facetted pupil mirror device 240 arranged to provide a desired angular distribution of the EUV radiation 116, at the patterning device MA, as well as a desired uniformity of radiation intensity at the patterning device MA. In some embodiments, the patterning device MA can be interchangeably referred to as a reflective reticle. Upon reflection of the EUV radiation 116 at the patterning device MA, held by the support structure MT, a patterned beam 260 is formed and the patterned beam 260 is imaged by the projection system PS via reflective elements 280, 290 onto a wafer W1 held by the substrate table WT. The term “patterning device” should be broadly interpreted as referring to any device that can be used to impart a EUV radiation 116 with a pattern in its cross-section such as to create a pattern in a target portion of the substrate. The pattern imparted to the EUV radiation 116 may correspond to a particular functional layer in a device being created in the target portion, such as an integrated circuit. The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming EUV radiation 116 in different directions. The tilted mirrors impart a pattern in a EUV radiation 116 that is reflected by the mirror matrix.

More elements than shown may generally be present in illumination optics unit IL and projection system PS. A grating spectral filter may optionally be present, depending upon the type of lithographic apparatus. Further, there may be more mirrors present than those shown in the Figures, for example there may be 1-6 additional reflective elements present in the projection system PS than shown in FIG. 1.

The EUV lithography system 10 may also include an EUV energy monitor 150 disposed in the source vessel 110. The EUV energy monitor 150 is designed to monitor the EUV intensity or energy generated from the source vessel 110. For example, the EUV energy monitor 150 includes an EUV sensing element, such as a diode, designed to be sensitive to the EUV light and configured to effectively detect the EUV light. In other examples, the EUV energy monitor 150 includes a plurality of diodes configured in an array to effectively detect the EUV light for monitoring purpose. In some embodiments, a dose error is calculated based on the sensed EUV intensity (or energy). For example, when the sensed EUV intensity (or energy) is below a predetermined threshold value, such situation can be referred to as a dose error. Generally, the dose error is related to the plasma instability, through monitoring the EUV intensity by the EUV energy monitor 150, the dose error can be extracted from the monitored EUV intensity. Therefore, when a dose error is occurred, it indicates that the plasma 114 is unstable.

In some embodiments, the EUV lithography system further includes a droplet collection element 125 disposed in the source vessel 110 and located opposite to the droplet generator 120. The droplet collection element 125 is configured to collect fuel droplets 112 that are not vaporized during formation of the EUV radiation 116 and/or fragments of fuel droplets 112 generated during formation of the EUV radiation 116.

The source collector module SO may include a regulated gas source 222 for selectively introducing, either continuously or in discrete amounts, one or more gas(es) into the source vessel 110, e.g. for ion stopping (e.g. $H_2$, (protium and/or deuterium isotopes) and/or He). It is to be appreciated that the gas source 222 may include one or more flow regulators (not shown). In some embodiments, a purge gas supply mechanism may fix the flow rate of the purge gas from the gas source 222 at a constant level by using the flow rate control valve such as a throttle valve, and the MFC or the pressure control loop may be omitted. In some embodiments, the gas source 222 is disposed proximate to the center aperture 119 such that gas 271 generated therein are output through the center aperture 119 of the collector mirror 118. In some embodiments, the gas 271 includes hydrogen and/or hydrogen radicals H*. For example, the gas 271 generated central in situ hydrogen radical sources provide hydrogen radicals proximate to the target material debris deposited on the collector mirror 118 and near the center aperture 119. It should be noted that the gas 271 can be any sort of hydrogen radical source described herein. In some embodiments, the tin in the target material debris deposits converts to volatile tin compounds such as $SnH_4$ by the hydrogen radicals H*. In some embodiments, the gas source 222 has a signal source and a hydrogen nozzle injects hydrogen into a magnetic field generated by an induction coil to create a hydrogen plasma that produces the hydrogen radicals H*. In some embodiments, the gas 271 may be also referred to as a carrier gas.

Figure 2:
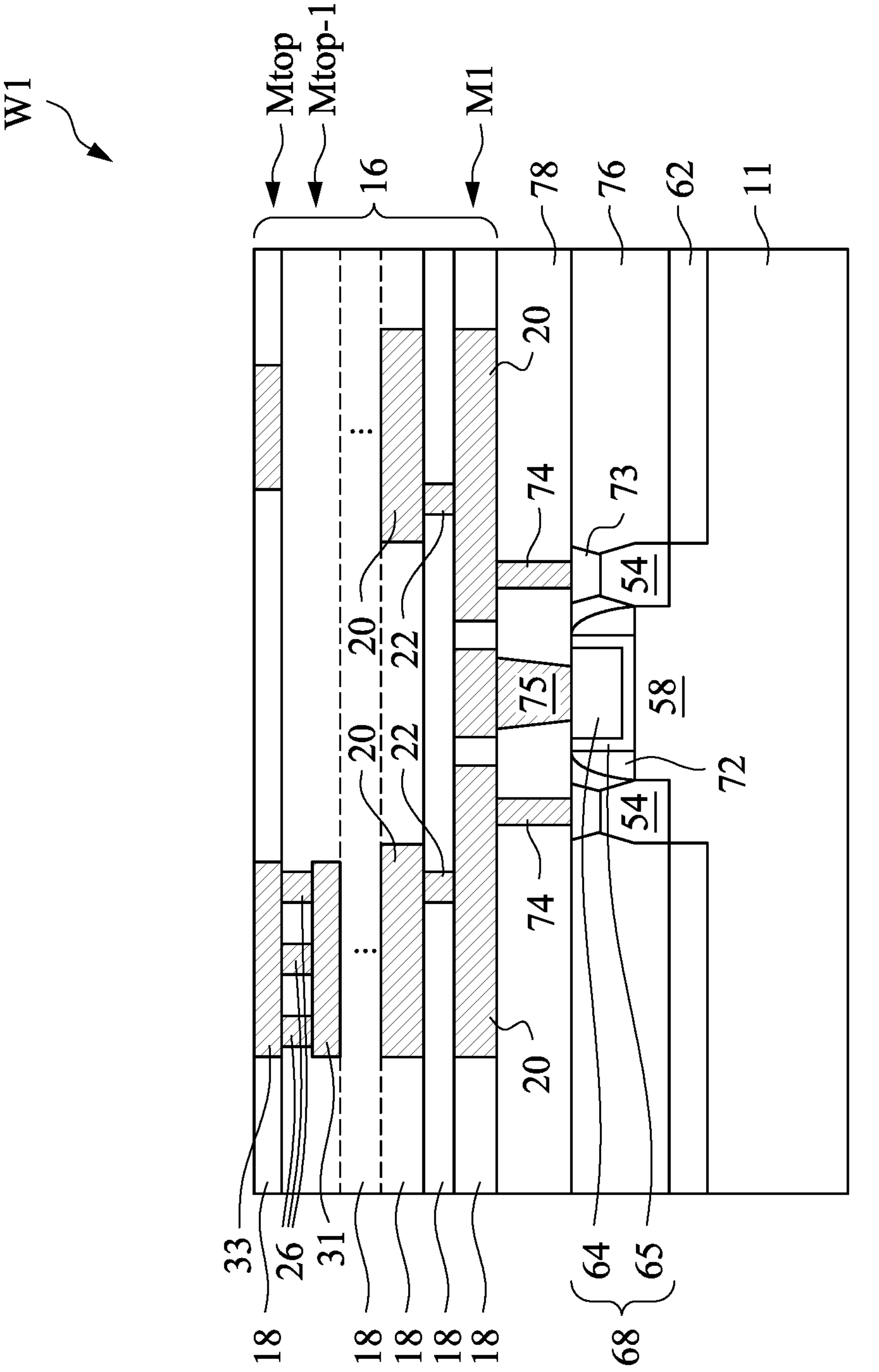
FIG. 2 illustrates a schematic view of a semiconductor structure in accordance with some embodiments of the present disclosure.

Reference is made of FIG. 2. FIG. 2 illustrates a schematic view of a wafer W1 in accordance with some embodiments of the present disclosure. Some features (e.g. semiconductor fin 58, gate structure 68, metal line 20) on the wafer W1 can be made by the lithography system as shown in FIG. 1. As shown in FIG. 2, a semiconductor substrate 11, is provided. The semiconductor substrate 11 may be a bulk silicon substrate or a silicon-on-insulator substrate. Alternatively, other semiconductor materials that include group III, group IV, and group V elements may also be used, which may include silicon germanium, silicon carbon, and III-V compound semiconductor materials.

A semiconductor device, which is symbolized using a transistor, may be formed at a surface of the semiconductor substrate 11. A fin-type field effect transistor (FinFET) device is disposed on the substrate 11. In some embodiments, the FinFET device illustrated in FIG. 2 is a three-dimensional MOSFET structure formed in fin-like strips of semiconductor protrusions referred to as semiconductor fins 58. The cross-section shown in FIG. 2 is taken along a longitudinal axis of the fin in a direction parallel to the direction of the current flow between the source/drain regions 54. The semiconductor fin 58 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective semiconductor fin 58 by etching a trench into the substrate 11 using, for example, reactive ion etching (RIE). FIG. 2 illustrates a single semiconductor fin 58, although the substrate 11 may include any number of fins. In some embodiments, the fin 58 can be interchangeably referred to as a semiconductive channel pattern, a nanostructured pedestal, an oxide-definition (OD) region.

A dielectric layer 62 formed along opposing sidewalls of the semiconductor fin 58 are illustrated in FIG. 2. The dielectric layer 62 may be formed by depositing one or more dielectric materials (e.g., silicon oxide) to completely fill the trenches around the fins and then recessing the top surface of the dielectric materials. The dielectric materials of the dielectric layer 62 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the dielectric layer 62 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the dielectric layer 62 such that an upper portion of f semiconductor ins 58 protrudes from surrounding insulating the dielectric layer 62. In some embodiments, the dielectric layer 62 can be referred to as a shallow trench isolation (STI) structure. In some cases, the patterned hard mask used to form the semiconductor fins 58 may also be removed by the planarization process.

In some embodiments, the gate structure 68 of the FinFET device illustrated in FIG. 2 is a high-k, metal gate (HKMG) gate structure that may be formed using a gate-last process flow. In a gate last process flow, a sacrificial dummy gate structure (not shown) is formed after forming the dielectric layer 62. The dummy gate structure may include a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the dielectric layer 62. As described in greater detail below, the dummy gate structure may be replaced by the HKMG gate structure 68 as illustrated in FIG. 2. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof. In some embodiments, the gate structure 68 can be interchangeably referred to as a gate pattern or a gate strip.

Source/drain regions 54 and spacers 72 of FinFET, illustrated in FIG. 2, are formed, for example, self-aligned to the dummy gate structure. Spacers 72 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structure leaving the spacers 72 along the sidewalls of the dummy gate structure extending laterally onto a portion of the surface of the fin (as illustrated in the right side of FIG. 2) or the surface of the STI dielectric (as illustrated in the left side of FIG. 2).

Source/drain regions 54 are semiconductor regions in direct contact with the semiconductor fin 58. In some embodiments, the source/drain regions 54 may include heavily-doped regions and relatively lightly-doped drain extensions, or LDD regions. Generally, the heavily-doped regions are spaced away from the dummy gate structure using the spacers 72, whereas the LDD regions may be formed prior to forming spacers 72 and, hence, extend under the spacers 72 and, in some embodiments, extend further into a portion of the semiconductor below the dummy gate structure. The LDD regions may be formed, for example, by implanting dopants (e.g., As, P, B, In, or the like) using an ion implantation process. The source/drain regions 54 may include an epitaxially grown region. For example, after forming the LDD regions, the spacers 72 may be formed and, subsequently, the heavily-doped source and drain regions may be formed self-aligned to the spacers 72 by first etching the fins to form recesses, and then depositing a crystalline semiconductor material in the recess by a selective epitaxial growth (SEG) process that may fill the recess and, typically, extend beyond the original surface of the fin to form a raised source-drain structure, as illustrated in FIG. 2. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$) of dopants may be introduced into the heavily-doped source/drain regions 54 either in situ during SEG, or by an ion implantation process performed after the SEG, or by a combination thereof. In some embodiments, the source/drain region 54 can be interchangeably referred to as a source/drain structure, a source/drain pattern, or an epitaxial structure.

An interlayer dielectric (ILD) 76 (seen in FIG. 2) is deposited over the structure. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the ILD layer 76. The HKMG gate structure 68, illustrated in FIG. 2, may then be formed by first removing the dummy gate structure using one or more etching techniques, thereby creating trenches between respective spacers 72. Subsequently, a gate dielectric layer 65 comprising one more dielectrics, followed by a gate electrode layer 64 comprising one or more conductive materials, are deposited to completely fill the recesses. Excess portions of the gate electrode layer 64 and the gate dielectric layer 65 may be removed from over the top surface of ILD layer 76 using, for example a CMP process. The resulting structure, as illustrated in FIG. 2, may be a substantially coplanar surface comprising an exposed top surface of ILD layer 76, spacers 72, and remaining portions of the gate electrode layer 64 and the gate dielectric layer 65 inlaid between respective spacers 72.

The gate dielectric layer 65 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the gate electrode layer 64 may be a multilayered metal gate stack comprising a barrier layer, a work function layer, and a gate-fill layer formed successively on top of gate dielectric layer 65. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may include metals such as Cu, AL, W, Co, Ru, or the like, or combinations thereof, or multi-layers thereof. The materials used in forming the gate structure may be deposited by any suitable method, e.g., CVD, PECVD, PVD, ALD, PEALD, electrochemical plating (ECP), electroless plating and/or the like.

Source/drain contacts 73 are formed in the ILD layer 76 and make electrical connections to the source/drain regions 54 of FinFET. The source/drain contacts 73 may be formed using photolithography techniques. For example, a patterned mask may be formed over the ILD layer 76 and used to etch openings that extend through the ILD layer 76 and the CESL (not shown) below ILD layer 76 to expose portions of the source/drain regions 54. In some embodiments, an anisotropic dry etch process may be used.

In some embodiments, a conductive liner may be formed in the openings in the ILD layer 76. Subsequently, the openings are filled with a conductive fill material. The liner includes barrier metals used to reduce out-diffusion of conductive materials from the source/drain contacts 73 into the surrounding dielectric materials. In some embodiments, the liner may include two barrier metal layers. The first barrier metal comes in contact with the semiconductor material in the source/drain regions 54 and may be subsequently chemically reacted with the heavily-doped semiconductor in the source/drain regions 54 to form a low resistance ohmic contact, after which the unreacted metal may be removed. For example, if the heavily-doped semiconductor in the source/drain regions 54 is silicon or silicon-germanium alloy semiconductor, then the first barrier metal may include Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the ILD layer 76. The resulting conductive plugs extend into the ILD layer 76 and constitute the source/drain contacts 73 making physical and electrical connections to the electrodes of electronic devices, such as the FinFET illustrated in FIG. 2.

An ILD Layer 78 may be deposited over the ILD layer 76, as illustrated in FIG. 2. In some embodiments, the insulating materials to form the ILD layer 76 and the ILD layer 78 may include silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the ILD layer 76 and the ILD layer 78 may be deposited using any suitable method, such as CVD, physical vapor deposition (PVD), ALD, PEALD, PECVD, SACVD, FCVD, spin-on coating, and/or the like, or a combination thereof.

As illustrated in FIG. 2, source/drain vias 74 are formed in the ILD layer 78 and making electrical connections to corresponding source/drain contacts 73. Gate contact 75 are formed in the ILD layer 78 and making electrical connection to corresponding gate electrode layer 64 of FinFET, respectively. The gate contact 75, the source/drain contacts 73, and the source/drain vias 74 can be referred to as middle-end-of-line (MEOL) conductive features that electrically connect front-end-of-line (FEOL) conductive features (for example, gate structure 68 and/or source/drain regions 54) to back-end-of-line (BEOL) conductive features (for example, metal vias and metal lines in an interconnect structure 16). The gate contact 75 and the source/drain vias 74 may be formed using photolithography techniques. For example, a patterned mask may be formed over the ILD layer 78 and used to etch openings that extend through the ILD layer 78 to expose a portion of gate electrode over dielectric layer 62 and the source/drain contacts 73. In some embodiments, an anisotropic dry etch process may be used to etch the openings.

In some embodiments, a conductive liner may be formed in the openings in the ILD layer 78. Subsequently, the openings are filled with a conductive fill material. The liner includes barrier metals used to reduce out-diffusion of conductive materials from the gate contact 75 and the source/drain vias 74 into the surrounding dielectric materials. In some embodiments, silicide and barrier layer are formed before the forming of the gate contact 75 and the source/drain vias 74. The silicide may include Ti, Ni, Pt, Co, other suitable metals, or their alloys. The barrier layer of the conductive liner may additionally include other metals (e.g., TiN, TaN, Ta, or other suitable metals, or their alloys). A conductive fill material may be deposited over the conductive liner layer to fill the contact openings, using any acceptable deposition technique (e.g., CVD, ALD, PEALD, PECVD, PVD, ECP, electroless plating, or the like, or any combination thereof). The conductive fill material may be tungsten (W) or other suitable conductive materials, such as Al, Cu, Ru, Ni, Co, alloys of these, combinations thereof, and the like. Next, a planarization process (e.g., CMP) may be used to remove excess portions of all the conductive materials from over the surface of the second ILD layer 78. The resulting conductive plugs extend into the second ILD layer 78 and constitute gate contact 75 and the source/drain vias 74 making physical and electrical connections to the gate electrode 64 and the source/drain contacts 73, respectively. In some embodiments, each of the source/drain contacts 73, the source/drain vias 74, and the gate contact 75 may include an inverted trapezoid cross-sectional profile. That is, widths of the source/drain contacts 73, the source/drain vias 74, and the gate contact 75 may increase as a distance from the substrate 11 increases.

The wafer W1 may further include an interconnect structure 16 over the ILD layer 78. The interconnect structure 16 includes metal lines 20 and metal vias 22, which are formed in dielectric layers 18. The combination of the metal lines 20 at a same level is referred to a metal layer hereinafter. Accordingly, the interconnect structure 16 may include a plurality of metal layers that are interconnected through the metal vias 22. The metal lines 20 and metal vias 22 may be formed of copper or copper alloys, although they can also be formed of other metals. In some embodiments, the metal lines 20 and/or metal vias 22 may include a conducting material, for example, metals such as Al, Ti, TiN, TaN, Co, Ag, Au, Ni, Cr, Hf, Ru, W, Pt, WN, Ru, any other suitable material or a combination or alloy thereof. In some embodiments, the dielectric layers 18 are formed of low-k dielectric materials. The dielectric constants (k values) of the low-k dielectric materials may be less than about 3.0, or less than about 2.5, for example. In some embodiments, the dielectric layer 18 may be made of silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The dielectric layer 18 may be formed using, for example, CVD, ALD, spin-on-glass (SOG) or other suitable techniques. In some embodiments, the metal layers include a bottom metal layer (M1) through a top metal layer (Mtop). In some embodiments, the Mtop layer is the topmost metal layer that is formed in low-k dielectric materials. A metal pad 33 may be formed in the Mtop layer. A metal pad 31 may also be formed in Mtop−1 layer, which is the metal layer immediately underlying the Mtop layer. The metal pads 31 and 33 are interconnected through metal vias 26.

Reference is made to FIGS. 3A to 3I. FIGS. 3A to 3I illustrate cross-sectional views of intermediate stages in the formation of metal lines of a semiconductor structure in accordance with some embodiments of the present disclosure. FIGS. 3A to 3I illustrate an exemplary method in accordance with some embodiments. The method includes a relevant part of the entire manufacturing process. The method M may be implemented, in whole or in part, by a system employing extreme ultraviolet (EUV) lithography and other appropriate lithography processes to improve pattern dimension accuracy. Additional operations can be provided before, during, and after the method, and some operations described can be replaced, eliminated, modified, moved around, or relocated for additional embodiments of the method. One of ordinary skill in the art may recognize other examples of semiconductor fabrication processes that may benefit from aspects of the present disclosure. The method is an example, and is not intended to limit the present disclosure beyond what is explicitly recited in the claims.

Figure 3B:
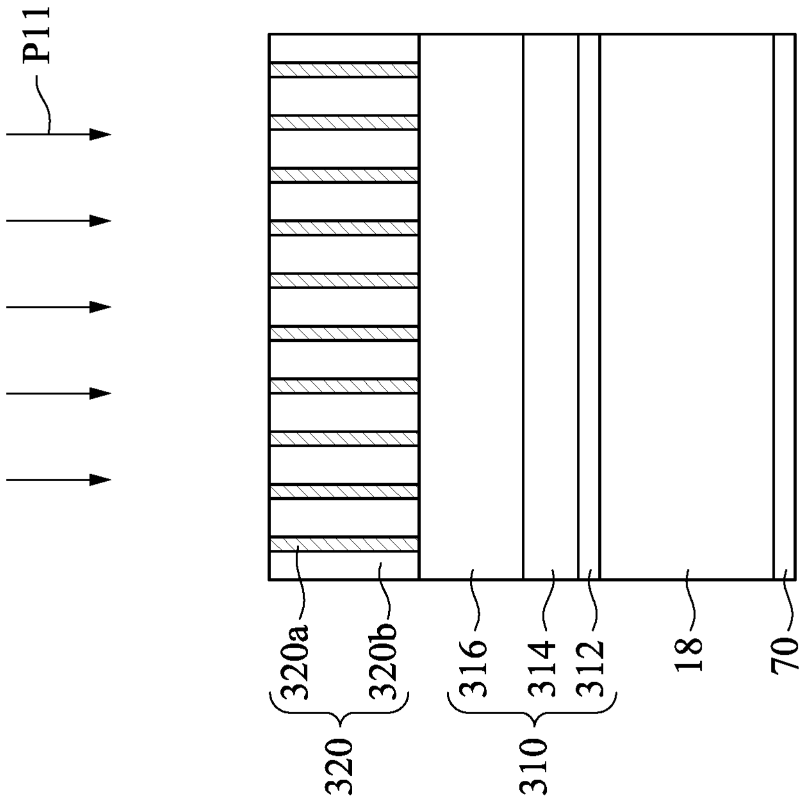
FIGS. 3A to 3I illustrate cross-sectional views of intermediate stages in the formation of metal lines of a semiconductor structure in accordance with some embodiments of the present disclosure.
Figure 3A:
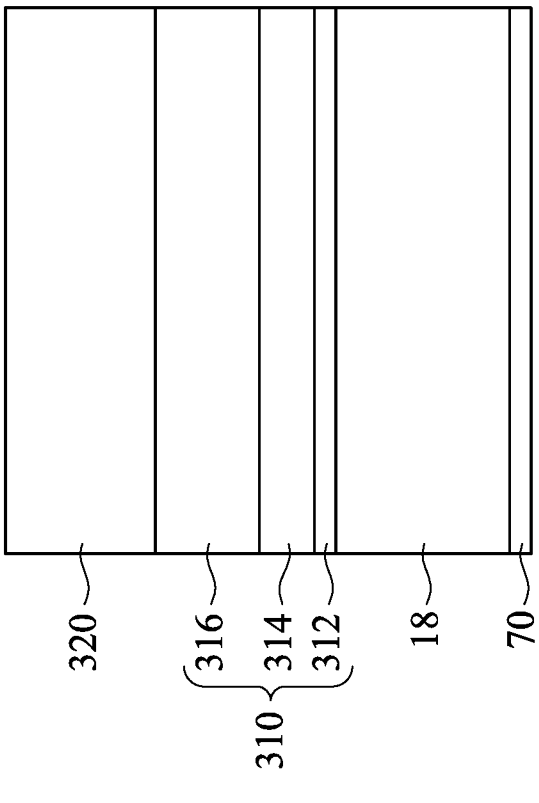

Reference is made to FIG. 3A. A tri-layer hard mask stack 310 is formed over one of the dielectric layers 18 (see FIG. 1) on a substrate 70. In some embodiments, the elements and features below said one of the dielectric layers 18 as illustrated in FIG. 1 can be collectively referred to the substrate 70. The dielectric layer 18 is formed over the substrate 70. Three mask layers (e.g., hard mask layers 312, 314, and 316) formed successively over the dielectric layer 80. Subsequently, a photoresist layer 320 is formed over hard mask layer 316. The photoresist layer 320 is sensitive to the light radiation of the lithography exposure process to be applied at later stage (see FIG. 3B), so as to have pattern thereon to pattern the underlying hard mask stack 310. The patterned hard mask stack 310 (see FIG. 3C) can be used as an etch mask to etch the underlying dielectric layer 18 in subsequent processing. In some embodiments, the etched dielectric layer 18 can be referred to as a target layer.

In some embodiments, the hard mask layer 314 of the hard mask stack 310 may be made of a material that has a high etching selectivity relative to the underlying and overlying hard mask layers 312 and 316. For example, the etching selectivity, which is the ratio of the etching rate of hard mask layer 316 to the etching rate of the hard mask layer 314, is greater than about 10 when the hard mask layer 316 is etched, and the etching selectivity, which is the ratio of the etching rate of hard mask layer 314 to the etching rate of the hard mask layer 312, is greater than about 10 when the hard mask layer 314 is etched. In some embodiments, the hard mask layer 314 of the hard mask stack 310 may be made of a different material than the hard mask layers 312 and 316.

In some embodiments, the hard mask layer 312 may be made of a same as the hard mask layer 316. In some embodiments, the hard mask layer 312 may be made of a different material than the hard mask layer 316. By way of example and not limitation, the hard mask layer 312 may be made of a dielectric material, such as SiO or SiN. The hard mask layer 314 may be made of metal nitride, such as TiN, or a metal oxide, such as TiO, ZrO, ZrTiO. In some embodiments, the hard mask layer 314 may be made of metal metal carbide, such as WdC. The hard mask layer 316 may be made of a dielectric material, such as SiO, SiN. In some embodiments, the hard mask layer 316 may be made of a metal oxide, such as TiO, ZrO, ZrTiO. In some embodiments, the hard mask layer 312, 314, and/or 316 of the hard mask stack 310 can be interchangeably referred to as a dielectric layer. In some embodiments, the hard mask layer 312, 314, and/or 316 of the hard mask stack 310 may be formed using, for example, CVD, ALD, spin-on-glass (SOG) or other suitable techniques. In some embodiments, the hard mask layer 312 may have a thinner thickness than the hard mask layer 314. The hard mask layer 314 may have a thinner thickness than the hard mask layer 316. The hard mask layer 312 may have a thinner thickness than the hard mask layer 316. By way of example and not limitation, the hard mask layer 312 may have a thickness ranging from about 5 nm to about 100 nm. The hard mask layer 314 may have a thickness ranging from about 5 nm to about 100 nm. The hard mask layer 316 may have a thickness ranging from about 5 nm to about 100 nm.

In some embodiments, the photoresist layer 320 is sensitive to EUV radiation. The photoresist layer 320 includes metal to increase the sensitivity of the EUV photo radiation, therefore being also referred to as metal-containing photoresist (MePR) layer. In some embodiments, the metal in the photoresist layer 320 has a sufficient concentration for EUV sensitivity, such as being greater than 5% (weight percentage) of the photoresist layer 320. The structure of the photoresist layer 320 may be in a proper form, such as metal-containing inorganic polymer, metal clusters, metal molecules, metal oxide chemical or a combination thereof. In some embodiments, the metal molecule may be a metal complex or metal compound. In some embodiments, the metal oxide chemical may be a chemical structure having metal oxide with outer organic ligand. In some embodiments, the metal cluster may be a chemical structure with multiple metal centers clustered together. The photoresist layer 320 may be made of a material that has a high etching selectivity relative to the underlying hard mask stack 310. For example, the etching selectivity, which is the ratio of the removing rate of the unexposed portion 320*b* (see FIG. 3B) of the photoresist layer 320 to the etching rate of the hard mask stack 310, is greater than about 10 when the unexposed portion 320*b* (see FIG. 3B) of the photoresist layer 320 is patterned. Throughout the description, the photoresist layer 320 can be interchangeably referred to as a mandrel layer or a sacrificial layer in a spacer lithography process. In some embodiments, the photoresist layer 320 may be silicon-free. In some embodiments, the photoresist 320 may have a thicker thickness than the hard mask layer 312, 314, and/or 316. By way of example but not limiting the present disclosure, the photoresist layer 320 may have a thickness less than about 20 nm. Therefore, the photoresist layer 320 may be a thin film, which in turn reduces the risk of photoresist pattern collapse.

In some embodiments, the photoresist layer 320 may have a composition including an organometallic material, a solvent, photoactive compounds (PACs) (e.g., photoacid generators (PAG)), a quencher, a surfactant, a chromophore, counter ions, any suitable material, or combinations thereof. In some embodiments, the organometallic material of the photoresist layer 320 may include a metal core M and a plurality of organic ligands including a photo-cleavable ligand and a non-photo-cleavable ligand having a crosslinking group. During the exposure to actinic radiation, the metal core of the organometallic material absorbs actinic radiation and generates a radical through metal core-ligand bond cleavage from the photo-cleavable ligand. In some embodiments, more secondary electrons are generated by photo excitation of the organometallic than a non-metallic organic compound because the binding energy of the electrons for the metal is lower. In addition, the metal core-ligand bond is also cleavable by secondary electron excitation. Radicals generated from the metal core-ligand bond cleavage initiate and trigger polymerization when the non-cleavable ligand on the metal has specific functional groups that can react with the radicals in some embodiments. Photoradical-assisted self-polymerization occurs, and not only metal oxides, but also organic crosslink frameworks form, providing much higher contrast and enabling a lower exposure dose to be used to pattern the photoresist layer. In some embodiments, the organometallic material of the photoresist layer 320 may have the following chemical formulas, where M represents metal species, O represents oxygen, R1, R2, and R3 represent different organic functional groups, and n represents degree of polymerization, and the polymer may be included in one of the organic functional groups.

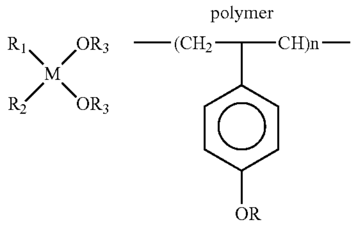

In some embodiments, the metal core M of the organometallic material in the photoresist layer 320 includes one or more metal elements. In some embodiments, the one or more metal elements may be selected from the group consisting of Hf, Sn, Zr, Ti, Cr, W, Mo, Fe, Ru, Os, Co, Ru, Rh, Ir, Ni, Pd, Pt, Cu, Ag, Au, Zn, Cd, Al, Ga, Fe, Ti, Ge, Sn, Pb, Sb, and Bi. In some embodiments, the metal element of the photoresist layer 320 may be a same metal element (e.g., Sn, Zr) as the fuel droplet 120 (see FIG. 1) that is for creating the EUV radiation 116. By way of example and not limitation, the organometallic material of the photoresist layer 320 can be denoted as $SnO_xC_yH_z$ or $ZrO_xC_yH_z$.

In some embodiments, the photo-cleavable ligand of the organometallic material in the photoresist layer 320 is an aliphatic or aromatic, cyclic or non-cyclic C1-C30 group, wherein the C1-C30 group is unsubstituted or substituted with one or more selected from the group consisting of —I, —Br, —Cl, —F, —NH2, —COOH, —OH, —SH, —N3, —S(═O)—, an alkene group, an alkyne group, an imine group, an ether group, an ester group, an aldehyde group, a ketone group, an amide group, a sulfone group, an acetic acid group, a cyanide group, an allene group, an alcohol group, a diol group, an amine group, a phosphine group, a phosphite group, an aniline group, a pyridine group, and a pyrrole group. In some embodiments, the metal core-photo-cleavable ligand bond has sp3 characteristics and forms a stable radical. When a stable radical can be formed, the metal core-photo-cleavable ligand bond is photocleavable. On the other hand, if the photo-cleavable ligand includes strong electron withdrawing groups, the photo-cleavable ligand may not form a stable radical, and the etal core-photo-cleavable ligand bond may not be photocleavable.

In some embodiments, the non-photo-cleavable ligand of the organometallic material in the photoresist layer 320 is different from the photo-cleavable ligand. In some embodiments, the non-photo-cleavable Ligand is an aliphatic or aromatic, cyclic or non-cyclic C2-C30 group, wherein the C2-C30 group is unsubstituted or substituted with one or more selected from the group consisting of —I, —Br, —Cl, —F, —NH2, —COOH, —OH, —SH, —N3, —S(═O)—, an alkene group, an alkyne group, an imine group, an ether group, an ester group, an aldehyde group, a ketone group, an amide group, a sulfone group, an acetic acid group, a cyanide group, an allene group, an alcohol group, a diol group, an amine group, a phosphine group, a phosphite group, an aniline group, a pyridine group, and a pyrrole group. In some embodiments, the metal core-non-photo-cleavable ligand bond has sp2 characteristics and does form a stable radical. When a stable radical cannot be formed, the metal core-non-photo-cleavable ligand bond is not photocleavable.

In some embodiments, the organometallic material of the photoresist layer 320 may further include a ligand different than the photo-cleavable ligand and non-photo-cleavable ligand. The ligand may include C3-C12 aliphatic or aromatic groups in some embodiments. The aliphatic or aromatic groups may be unbranched or branched with cyclic, or noncyclic saturated pendant groups containing 1-9 carbons, including alkyl groups, alkenyl groups, and phenyl groups. The branched groups may be further substituted with oxygen or halogen. In some embodiments, the C3-C12 aliphatic or aromatic groups include heterocyclic groups. In some embodiments, the C3-C12 aliphatic or aromatic groups are attached to the metal by an ether or ester linkage. In some embodiments, the ligand may include branched or unbranched, cyclic or non-cyclic, saturated organic groups, including C1-C7 alkyl groups or C1-C7 fluoroalkyl groups. In some embodiments, the C1-C7 alkyl groups or C1-C7 fluoroalkyl groups include one or more substituents selected from the group consisting of —CF3, —SH, —OH, ═O, —S—, —P—, —PO2, —C(═O)SH, —COOH, —C(═O)O—, —O—, —N—, —C(═O)NH, —SO2OH, —SO2SH, —SOH, and —SO2-. In some embodiments, the ligand may include one or more substituents selected from the group consisting of —CF3, —OH, —SH, and —COOH substituents.

In some embodiments, the solvent of the photoresist layer 320 may include propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (AMC), n-butyl acetate (nBA), and 2-heptanone (MAK), any suitable solvent, or combinations thereof.

In some embodiments, the photoactive compounds (PACs) of the photoresist layer 320 along with any desired additives or other agents, are added to the solvent for application. Once added, the mixture is then mixed in order to achieve a homogenous composition throughout the photoresist composition to ensure that there are no defects caused by uneven mixing or nonhomogenous composition of the photoresist. Once mixed together, the photoresist may either be stored prior to its usage or used immediately. The PACs are photoactive components, such as photoacid generators (PAG), free-radical generators, photobase (PBG) generators, photo decomposable bases (PDB), or the like. The PACs may be positive-acting or negative-acting. In some embodiments, the photoacid generator (PAG) of the photoresist layer 320 may have the following chemical formulas, where S represents sulfur, F represents fluorine, and N represents nitrogen.

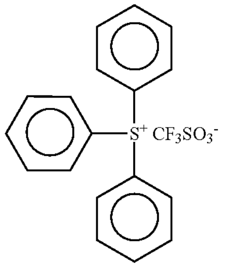

In some embodiments, the photoacid generators of the photoactive compounds of the photoresist layer 320 may include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like. In some embodiments, specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments, the free-radical generator of the photoactive compounds of the photoresist layer 320 may include photoinitiators, including n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

In some embodiments, the photobase generators of the photoactive compounds of the photoresist layer 320 may include quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl)cyclic amines, combinations of these, or the like. In some embodiments, the photo decomposable base of the photoactive compounds of the photoresist layer 320 may include triphenylsulfonium hydroxide, triphenylsulfonium antimony hexafluoride, and triphenylsulfonium trifyl. As one of ordinary skill in the art will recognize, the chemical compounds listed herein are merely intended as illustrated examples of the photoactive compounds and are not intended to limit the embodiments to only those of the photoactive compounds specifically described. Rather, any suitable photoactive compounds may be used, and all such PACs are fully intended to be included within the scope of the present embodiments.

In some embodiments, the quencher of the photoresist layer 320 can be used to inhibit diffusion of the generated acids/bases/free radicals within the photoresist. The quencher may improve the resist pattern configuration as well as the stability of the photoresist over time. In some embodiments, the quencher is an amine, such as a second lower aliphatic amine, a tertiary lower aliphatic amine, or the like. Specific examples of amines include trimethylamine, diethylamine, triethylamine, di-n-propylamine, tri-n-propylamine, tripentylamine, diethanolamine, and triethanolamine, alkanolamine, combinations thereof, or the like.

In some embodiments, an organic acid is used as the quencher. Specific embodiments of organic acids include malonic acid, citric acid, malic acid, succinic acid, benzoic acid, salicylic acid; phosphorous oxo acid and its derivatives, such as phosphoric acid and derivatives thereof such as its esters, phosphoric acid di-n-butyl ester and phosphoric acid diphenyl ester; phosphonic acid and derivatives thereof, including its ester, such as phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof, including its esters, such as phenylphosphinic acid. In some embodiments, the quencher of the photoresist layer 320 may have the following chemical formulas, where R4 represent an organic functional group.

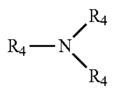

In some embodiments, the depositing of the photoresist layer 320 may include mixing the organometallic compound with a solvent, coating the substrate with the organometallic compound/solvent mixture and then subsequently drying the photoresist such as by heating, to remove the solvent. In some embodiments, forming the photoresist layer 320 may be performed by as a spin-on coating process, a dip coating method, an air-knife coating method, a curtain coating method, a wire-bar coating method, a gravure coating method, a lamination method, an extrusion coating method, combinations of these, or the like.

In some embodiments, forming the photoresist layer 320 may be performed by a vapor phase deposition operation. In some embodiments, the vapor phase deposition process may include atomic layer deposition (ALD) process or chemical vapor deposition (CVD) process. In some embodiments, the ALD process may include plasma-enhanced atomic layer deposition (PE-ALD) process, and the CVD process may include plasma-enhanced chemical vapor deposition (PE-CVD) process, metal-organic chemical vapor deposition (MO-CVD) process, atmospheric pressure chemical vapor deposition (AP-CVD) process, and low pressure chemical vapor deposition (LP-CVD) process. In some embodiments, the organometallic material is composed of one or more precursors. In some embodiments, the one or more precursors are reacted in a deposition chamber to form the organometallic material. In some embodiments, depositing the photoresist layer includes combining the first compound or first precursor and the second compound or second precursor in a vapor state to form the photoresist composition. In some embodiments, only one photoresist compound or precursor is introduced into the deposition chamber. In some embodiments, the first compound or first precursor and the second compound or second precursor of the photoresist composition are introduced into a deposition chamber (e.g., CVD chamber) at about the same time via the inlets. In some embodiments, the first compound or first precursor and second compound or second precursor are introduced into a deposition chamber (e.g. ALD chamber) in an alternating manner. In some embodiments, the first and second compounds or precursors are delivered into the deposition chamber with a carrier gas. The carrier gas, a purge gas, a deposition gas, or other process gas may contain nitrogen, hydrogen, argon, neon, helium, or combinations thereof.

Reference is made to FIG. 3B. An exposure process P11 to the photoresist layer 320 utilizing the EUV radiation 116 (see FIG. 1) from the EUV lithography system 10, thereby forming a latent pattern of the photoresist layer 320 including exposed portions 320*a* and unexposed portions 320*b*. In some embodiments, the EUV radiation 116 is directed to the photoresist layer 320 on the wafer W1 to form an image of a circuit pattern defined on a photomask (such as a reflective mask or a reflective reticle) in a proper exposure mode such as step-and-scan. Various resolution enhancement techniques, such as phase-shifting, off-axis illumination (OAI) and/or optical proximity correction (OPC), may be used or implemented through the photomask or the exposure process. For examples, the OPC features may be incorporated into the circuit pattern on the photomask. In some embodiments, the photomask is a phase-shift mask, such as an alternative phase-shift mask, an attenuated phase-shift mask, or a chrome-less phase-shift mask. In some embodiments, the exposure process is implemented in an off-axis illumination mode. In some embodiments, the EUV radiation 116 is directly modulated with a predefined pattern (such as an IC layout) without using a photomask (such as using a digital pattern generator or direct-write mode).

The exposed portions 320*a* of the photoresist layer 320 exposed to the EUV radiation 116 (see FIG. 1) undergoes a chemical reaction thereby changing its solubility in a subsequently applied developer relative to the unexposed portions 320*b* of the photoresist layer 320 not exposed to the EUV radiation 116. In some embodiments, the exposed portions 320*a* of the photoresist layer 320 undergo a crosslinking reaction.

A reaction of a photoresist composition including the organometallic material of the photoresist layer 320 undergoes when exposed to actinic radiation. The organometallic material, including the metal core M, a photo-cleavable ligand, and a non-photo-cleavable ligand having a crosslinking group, is exposed to actinic radiation, such as the EUV radiation 116 (see FIG. 1). The photo-cleavable ligand is converted to a radical upon the absorption of actinic radiation. The radical of the photo-cleavable ligand is subsequently cleaved from the metal core and the radical of the photo-cleavable ligand interacts with the non-photo-cleavable ligand to activate the non-photo-cleavable ligand. In some embodiments, the radical of the photo-cleavable ligand introduces a double bond into the non-photo-cleavable ligand. The metal core reacts with ambient water or oxygen to form a metal oxide or metal hydroxide. The radical activated non-photo-cleavable ligand crosslinks with other non-photo-cleavable ligand and metal hydroxide groups react in a condensation reaction to form a crosslinked metal oxide and organic framework.

By way of example and not limitation, the organometallic material of the photoresist layer 320 can have tin (Sn) as the metal core M. The organometallic tin compound has a first photo-cleavable ligand, e.g.—an alkyl group, and a second ligand having a crosslinking group, e.g.—a styrene group is exposed to actinic radiation hv. The exposure to actinic radiation cleaves the alkyl group from the tin atom forming a radical. The radical organometallic tin compound reacts with ambient water and the cleaved radical alkyl group reacts with the crosslinking group on the second ligand activating (e.g.—forming a radical) the second ligand (e.g.—forming a radical). Tin hydroxide groups on one organometallic compound subsequently react with tin hydroxide groups on another organometallic compound in a condensation reaction, while the activated second ligand reacts with another second ligand on another organometallic compound in a polymerization reaction. Thus, the organometallic tin compound undergoes both an inorganic crosslinking (a condensation reaction) and an organic crosslinking via the C═C double bonds on the crosslinking groups in some embodiments.

Subsequently, the photoresist layer 320 may undergo a heating or a post-exposure bake (PEB) in a thermal chamber. In some embodiments, the photoresist layer 320 is heated at a temperature in a range from about 50° C. to about 250° C., such as about 50, 75, 100, 125, 150, 175, 200, 225, or 250° C. In some embodiments, the post-exposure bake may be performed in a time duration in a range from about 20 seconds to about 300 seconds, such as 20, 75, 50, 75, 100, 125, 150, 175, 200, 225, 250, 275, or 300 seconds. In some embodiments, the post-exposure baking can cause the photoresist composition in the photoresist layer 320 that was exposed to the EUV radiation 116 (see FIG. 1) to further crosslink.

Figure 3D:
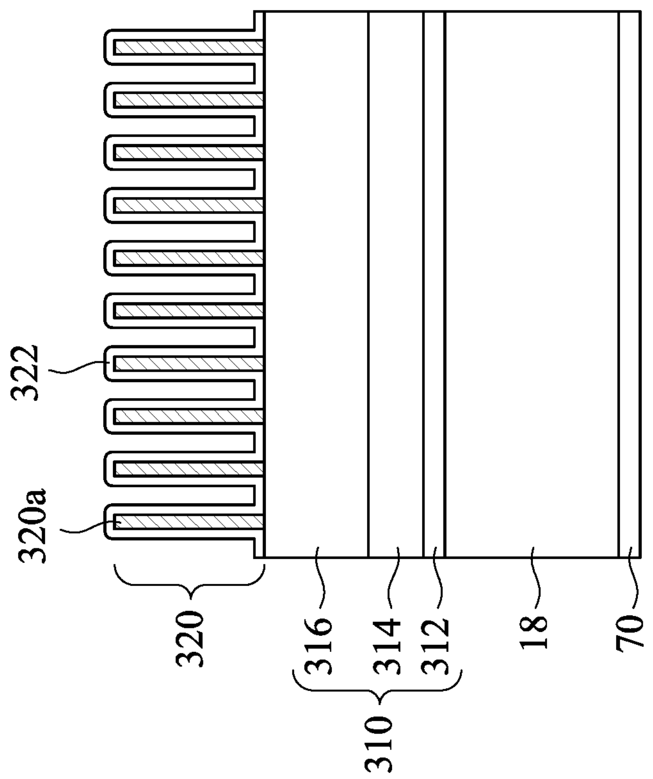
Figure 3C:
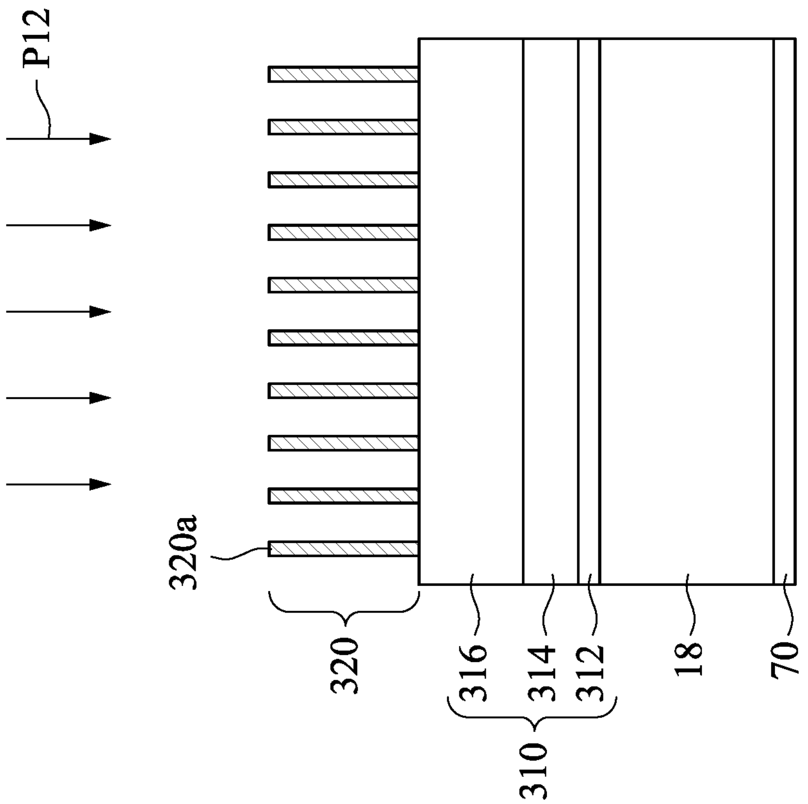

Reference is made to FIG. 3C. A developing process P12 is performed on the photoresist layer 320 to pattern the photoresist layer 320. The photoresist layer 320 can be positive tone resists or negative tone resists. A positive tone resist refers to a photoresist material that when exposed to radiation becomes removable under the developing process P12, while the region of the photoresist that is non-exposed (or exposed less) is non-removable under the developing process P12. A negative tone resist, on the other hand, refers to a photoresist material that when exposed to radiation becomes non-removable under the developing process P12, while the region of the photoresist that is non-exposed (or exposed less) is removable under the developing process P12.

In some embodiments, the photoresist layer 320 is a negative-tone photoresist and the exposed portions 320*a* of the photoresist layer 320 experience crosslinking and polymerization, therefore remain after the developing process P12. The unexposed portions 320*b* of the photoresist layer 320 are removed by the developing process P12 to expose the underlying mask stack 310. In some embodiments, the photoresist layer 320 can be interchangeably referred to as a negative tone developed (NTD) resist.

Figure 3F:
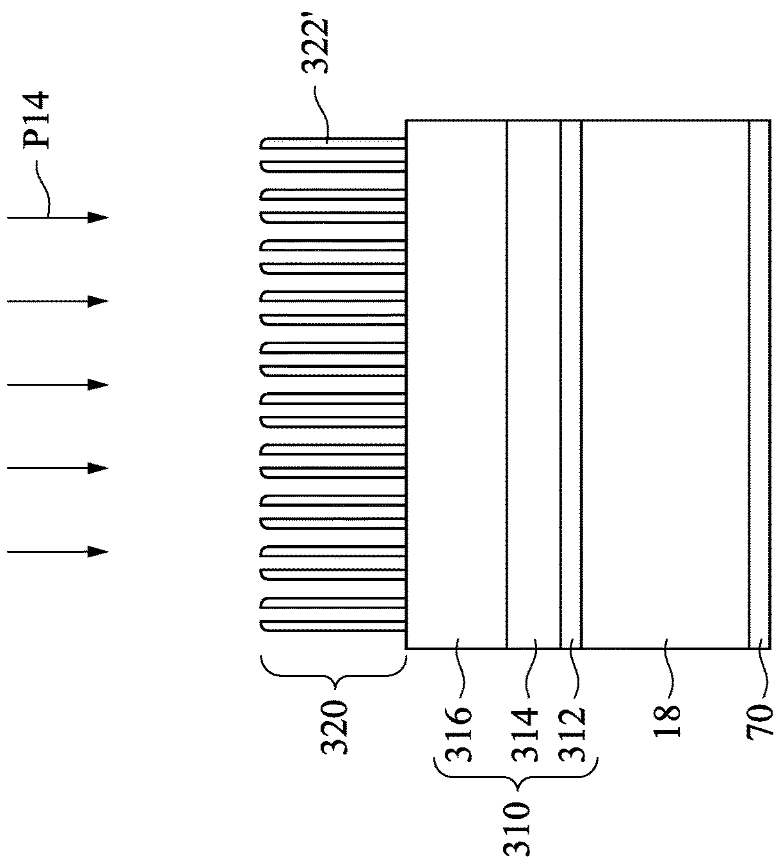

In some embodiments, the developing process P12 can be an anisotropic etching process. In some embodiments, the developing process P12 can be a dry etching process, such as plasma etching process. The plasma etching process may be performed by plasma processing apparatus 5, such as an inductively coupled plasma (ICP) apparatus, a capacitively coupled plasma (CCP) apparatus, or a micro wave apparatus. In greater detail, Referring now to FIG. 3J, illustrated is a cross-sectional view of an exemplary plasma processing apparatus 5 in some embodiments of the present disclosure. In some embodiments, the plasma processing apparatus 5 may contain an inductively-coupled plasma as plasma source and a RF power supply as a bias power source. As shown in FIG. 3J, the plasma processing apparatus 5 includes a chamber base 12 having a typically grounded chamber wall 14. The chamber base 12 is closed by a removable lid or a lid 42 and contains a pedestal assembly 48 which can typically be raised and lowered on a shaft 40 by actuation of a pedestal lift assembly 46. An inductively-coupled plasma coil 24 surrounds the lid 42 and is connected to an RF source power supply 26. The pedestal assembly 48 is connected, through an RF match network 30 which matches impedences, to an RF power supply 28. During operation of the plasma processing apparatus 5, the pedestal assembly 48 supports a wafer W1 in the chamber base 12. Plasma-generating source gas, such as $CF_4/C_4F_6/C_4F_8/O_2$, $C_{12}$, or HBr mixed with argon, is introduced into the plasma processing apparatus 5 by a gas supply (not shown). Volatile reaction products and unreacted plasma species are removed from the plasma processing apparatus 5 by a gas removal mechanism (not shown). Source power such as a high voltage signal, provided by the RF source power supply 26, is applied to the inductively-coupled plasma coil 24 to ignite and sustain plasma in the plasma processing apparatus 5. Ignition of plasma in the plasma processing apparatus 5 is accomplished primarily by electrostatic coupling of the inductively-coupled plasma coil 24 with the source gas, due to the large-magnitude voltage applied to the inductively-coupled plasma coil 24 and the resulting electric fields produced in the plasma processing apparatus 5. Once ignited, the plasma is sustained by electromagnetic induction effects associated with time-varying magnetic fields produced by the alternating currents applied to the inductively-coupled plasma coil 24.

Through the RF power supply 28, the pedestal assembly 48 is typically electrically biased to provide to the wafer W1 ion energies that are independent of the RF voltage applied to the chamber 10 through the inductively-coupled plasma coil 24 and RF source power supply 26. This facilitates more precise control over the energies of the etchant ions that bombard the surface of the wafer W1 to remove the unexposed portion 320*b* (see FIG. 3B) of the photoresist layer 320. A bias etching can be provided by the plasma source 26 with turning on the RF power source 28 during the bias etching step.

In some embodiments, the source power of the developing process P12 may be performed at a frequency in a range from about 13.56 MHz to about 2.45 GHz. In some embodiments, the source power of the developing process P12 may be in a range from about 50 W to about 2000 W, such as 100, 500, 1000, 1500, or 2000 W. If the source power is higher than about 2000 W, the plasma might result in unwanted etch rate to the exposed portions 320*a* of the photoresist layer 320. In some embodiments, the plasma processing apparatus 5 may also be an electron cyclotron resonance (ECR) apparatus, but the present disclosure is not limited thereto. In some embodiments, the bais power of the developing process P12 may be performed at a frequency in a range from about 400 kHz to about 13.56 MHz. In some embodiments, the bias power of the developing process P12 may be in a range from about 50 W to about 1000 W, such as 100, 500, 1000, 1500, or 2000 W. If the source power is higher than about 1000 W, the plasma might result in unwanted damage to the exposed portions 320*a*. In some embodiments, the developing process P12 may use a gas mixture including, such as HBr, with the bias. In some embodiments, the developing process P12 may be performed under a pressure in a range from about 3 to 100 mTorr, such as about 3, 10, 20, 30, 40, 50, 60, 70, 80, 90, or 100 mTorr. In some embodiments, the developing process P12 may be performed at a temperature in a range from about −140 to about 100° C., such as about −140, −120, −100, −80, −60, −40, −20, 0,20,40, 60, 80, or 100° C.

Reference is made to FIG. 3D. A spacer layer 322 is formed over the photoresist layer 320 and the hard mask stack 310. In some embodiments, the spacer layer 322 may be made of SiO, SiN, or a metal oxide (e.g., TiO). In some embodiments, the spacer layer 322 is conformal, and is formed by a conformal deposition method such as a thermal ALD process. Other suitable deposition methods, such as plasma enhanced ALD (PECVD) process. In some embodiments, the thickness of the spacer layer 322 may be in a range from about 5 nm to about 30 nm, in an embodiment, although other dimensions are also possible. In some embodiments, the thickness of spacer layer 322 is determined by the semiconductor process nodes used. For example, spacer layer 322 may be about 10 nm thick for one semiconductor process node, and may be about 14 nm thick for another semiconductor process node.

Figure 3E:
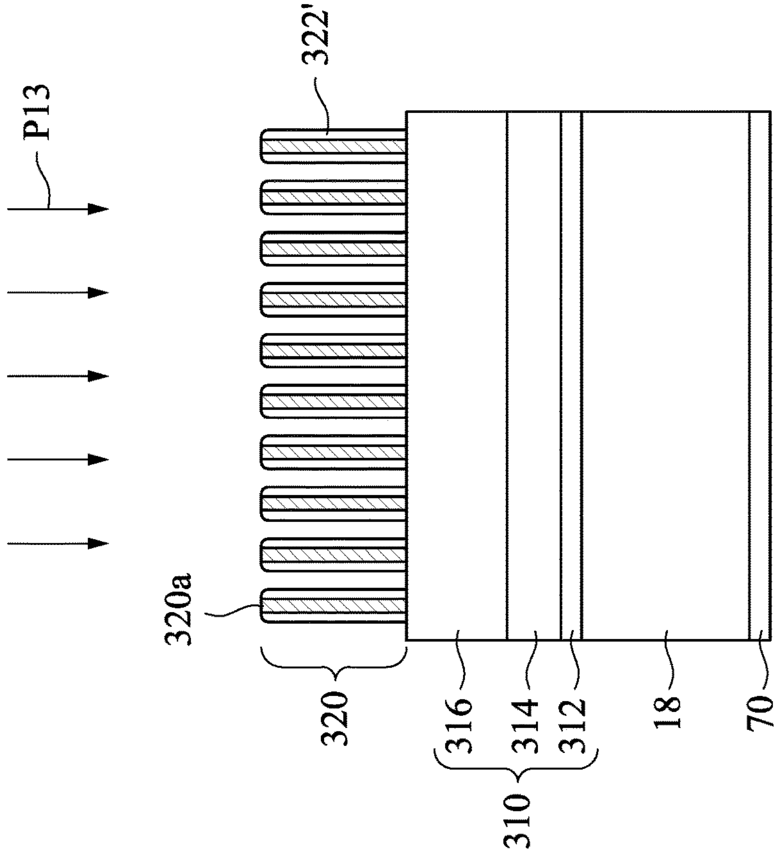
Figure 3H:
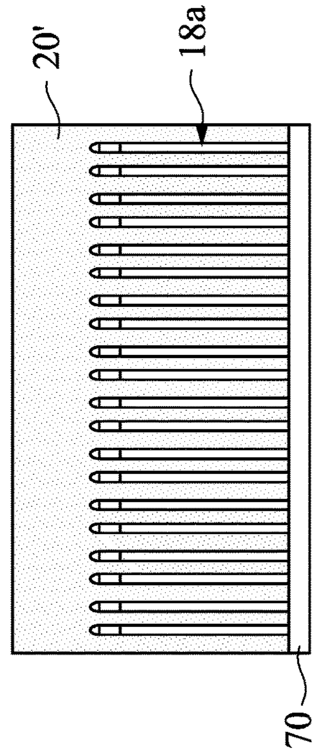

Reference is made to FIG. 3E. The spacer 322' may be formed by performing an etching process P13 such as anisotropic etching to remove horizontal portions of the spacer layer 322. The remaining portions of the spacer layer 322 on sidewalls of the photoresist layer 320 can serve as the spacer 322'. In some embodiments, the etching process can be dry etching process, such as plasma etching process by using, such as an inductively coupled plasma (ICP) apparatus, a capacitively coupled plasma (CCP) apparatus, or a micro wave apparatus. In some embodiments, the source power of the plasma etching process on the spacer layer 322 may be performed at a frequency in a range from about 13.56 MHz to about 2.45 GHz. In some embodiments, the etching process P13 may use a gas mixture including, such as $Cl_2$, $BCl_3$, with the bias. In some embodiments, the source power of the plasma etching process on the spacer layer 322 may be in a range from about 50 W to about 2000 W, such as 100, 500, 1000, 1500, or 2000 W. If the bias power is higher than about 2000 W, the plasma might result in unwanted etch rate to the vertical portions of the spacer layer 322. In some embodiments, the plasma etching process on the spacer layer 322 may be performed under a pressure in a range from about 3 to 100 mTorr, such as about 3, 10, 20, 30, 40, 50, 60, 70, 80, 90, or 100 mTorr. In some embodiments, the plasma etching process on the spacer layer 322 may be performed at a temperature in a range from about −140 to about 100° C., such as about −140, −120, −100, −80, −60, −40, −20, 0, 20, 40, 60, 80, or 100° C.

Reference is made to FIG. 3F. The photoresist layer 320 is removed from the hard mask stack 310. The removal of the photoresist layer 320 provides a pattern of spacer elements. In some embodiments, the photoresist layer 320 may be removed by an anisotropic etching process. For example, the photoresist layer 320 may be removed by a dry etching process P14, such as plasma etching process, by using, such as an inductively coupled plasma (ICP) apparatus, a capacitively coupled plasma (CCP) apparatus, or a micro wave apparatus. In some embodiments, the source power of the etching process P14 on the photoresist layer 320 may be performed at a frequency in a range from about 13.56 MHz to about 2.45 GHz. In some embodiments, the etching process P14 on the photoresist layer 320 may use a gas mixture including, such as HBr, with the bias. In some embodiments, the bias power of the etching process P14 on the photoresist layer 320 may be in a range from about 100 W to about 2000 W, such as 100, 500, 1000, 1500, or 2000 W. If the bias power is higher than about 2000 W, the plasma might result in unwanted damage to the spacer 322'. In some embodiments, the etching process P14 on the photoresist layer 320 may be performed under a pressure in a range from about 3 to 100 mTorr, such as about 3, 10, 20, 30, 40, 50, 60, 70, 80, 90, or 100 mTorr. In some embodiments, the etching process P14 on the photoresist layer 320 may be performed at a temperature in a range from about −140 to about 100° C., such as about −140, −120, −100, −80, −60, −40, −20, 0, 20, 40, 60, 80, or 100° C.

Figure 3G:
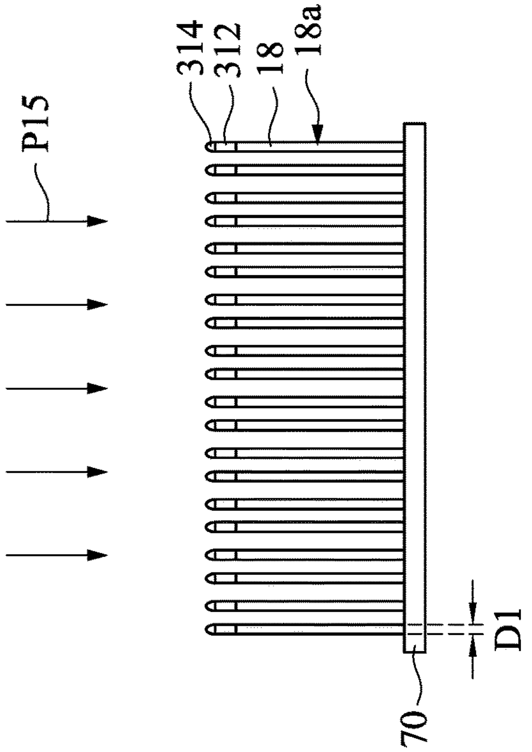

Reference is made to FIG. 3G. One or more etching process P15 is performed to “open” the hard mask stack 310. In other words, the hard mask stack 310 is patterned. The patterned hard mask stack 310 may serve as a mask in the etching process on the dielectric layer 18. In some embodiments, the etching process P15 may lead to a loss (i.e., the loss of the hard mask stack 310 and the spacer 322'). That is, the etching process P15 would consume the hard mask stack 310 and the spacer 322', and thus the hard mask stack 310 may be damaged as shown in FIG. 3G. Subsequently, the dielectric layer 18 is patterned into separated regions aligning with the hard mask stack 310 to have openings, trenches, and/or via holes 18*a* therein, since the hard mask stack 310 may serve as a mask during the etching process P15. In some embodiments, the dielectric layer 18 may have a pattern having a lateral dimension D1 less than about 15 nm.

In some embodiments, the etching process P15 may be a dry etching process, such as plasma etching process, by using, such as an inductively coupled plasma (ICP) apparatus, a capacitively coupled plasma (CCP) apparatus, or a micro wave apparatus.

In some embodiments, the source power of the etching process P15 may be performed at a frequency in a range from about 13.56 MHz to about 2.45 GHz. In some embodiments, the etching process P15 may use a gas mixture including, such as $C_4F_6$, $C_4F_8$, $H_2$, $O_2$, CO, CO2, with the bias. In some embodiments, the source power of the etching process P15 may be in a range from about 50 W to about 2000 W, such as 100, 500, 1000, 1500, or 2000 W. If the bias power is higher than about 2000 W, the plasma might result in unwanted etch rate to the spacer 322'. In some embodiments, the etching process P15 may be performed under a pressure in a range from about 3 to 100 mTorr, such as about 3, 10, 20, 30, 40, 50, 60, 70, 80, 90, or 100 mTorr. In some embodiments, the etching process P15 may be performed at a temperature in a range from about −140 to about 100° C., such as about −140, −120, −100, −80, −60, −40, −20, 0, 20, 40, 60, 80, or 100° C. In some embodiments, after the etching process P15, the hard mask stack 310 can be removed by, such as an ashing process. By way of example and not limitation, the ashing processes may be plasma process that form plasma having a monatomic reactive species (e.g., such as oxygen or fluorine), which combines with the hard mask stack 310 to form an ash that is evacuated from a processing chamber.

Reference is made to FIG. 3H. A conductive material 20' is deposited over the dielectric layer 18 and fills in the openings, trenches, and/or via holes 18*a* by a deposition process, such as PVD process, CVD process. In some embodiments, the conductive material 20' may be made of a metal-containing material such as titanium nitride, titanium oxide, tungsten, cobalt, ruthenium, aluminum, copper, combinations thereof, multi-layers thereof, or the like.

Figure 3I:
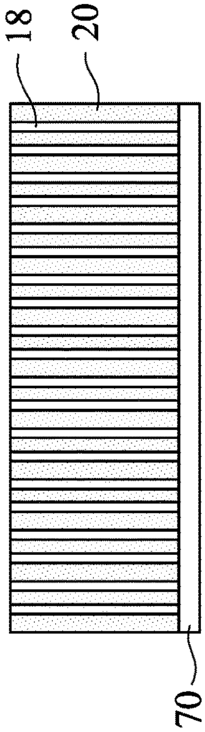
Figure 3J:
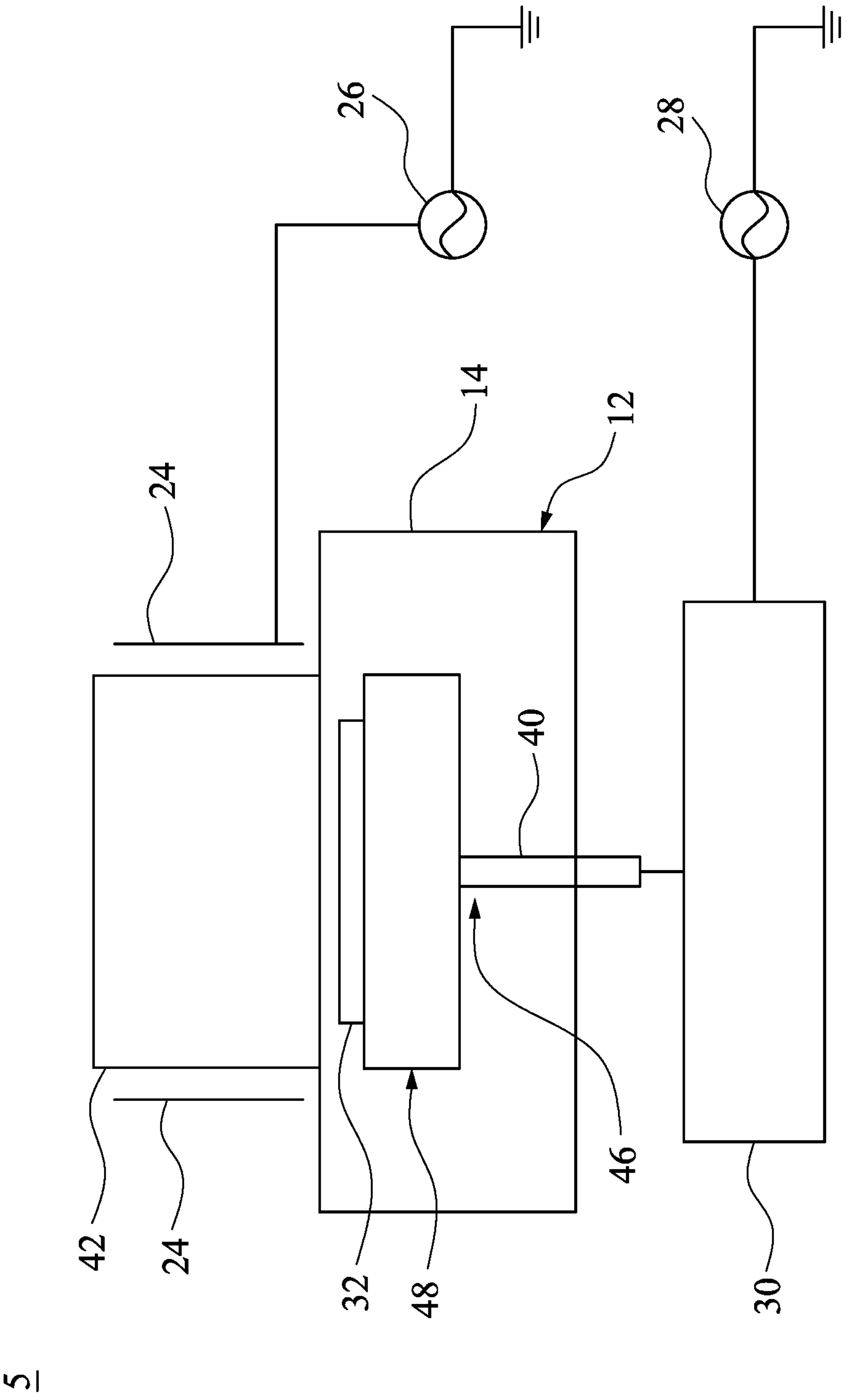
FIG. 3J is a cross-sectional view of plasma processing apparatus in accordance with some embodiments of the present disclosure.

Reference is made to FIG. 3I. The excess portions of the conductive material 20' over the dielectric layer 18 (see FIG. 3H) are removed, such as chemical mechanical polishing (CMP), or the like, forming the upper surface of the metal-filled opening substantially coplanar with a top surface of the dielectric layer 18. The remaining portions of the conductive material 20' in the openings, trenches, and/or via holes 18*a* forms the metal features, such as metal lines 20 (see FIG. 2). In some embodiments, the remainder of the hard mask stack 31 is removed with the excess portions of the conductive material 20'.

FIGS. 4A to 4D illustrate cross-sectional views of intermediate stages in the formation of metal lines of a semiconductor structure in accordance with some embodiments of the present disclosure. FIGS. 4A to 4D illustrate an exemplary method in accordance with some embodiments. The method includes a relevant part of the entire manufacturing process. The method may be implemented, in whole or in part, by a system employing extreme ultraviolet (EUV) lithography and other appropriate lithography processes to improve pattern dimension accuracy. Additional operations can be provided before, during, and after the method, and some operations described can be replaced, eliminated, modified, moved around, or relocated for additional embodiments of the method. One of ordinary skill in the art may recognize other examples of semiconductor fabrication processes that may benefit from aspects of the present disclosure. The method is an example, and is not intended to limit the present disclosure beyond what is explicitly recited in the claims.

Operations for forming the semiconductor structure of the present embodiment are substantially the same as the operations for forming the semiconductor structure described in foregoing descriptions associated with FIGS. 3A-3C and 3G-3H and thus are not repeated herein for the sake of clarity. Therefore, reference may be made to the foregoing paragraphs for the related detailed descriptions, and are not described again herein. The difference between the present embodiment and the embodiment in FIGS. 3A-3J is that the semiconductor structure of the present embodiment omits the forming of the spacer layer 322.

Figure 4B:
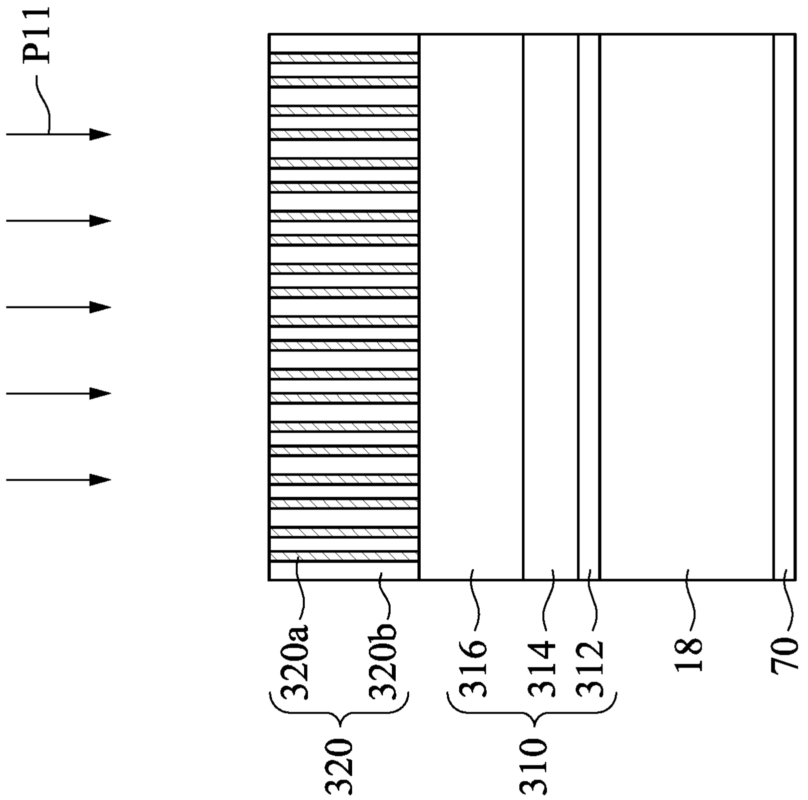
FIGS. 4A to 4D illustrate cross-sectional views of intermediate stages in the formation of metal lines of a semiconductor structure in accordance with some embodiments of the present disclosure.
Figure 4A:
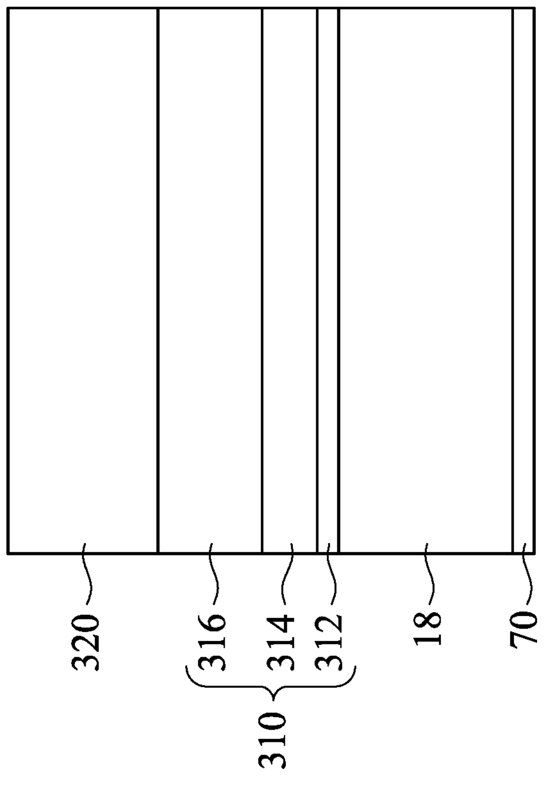
Figure 4D:
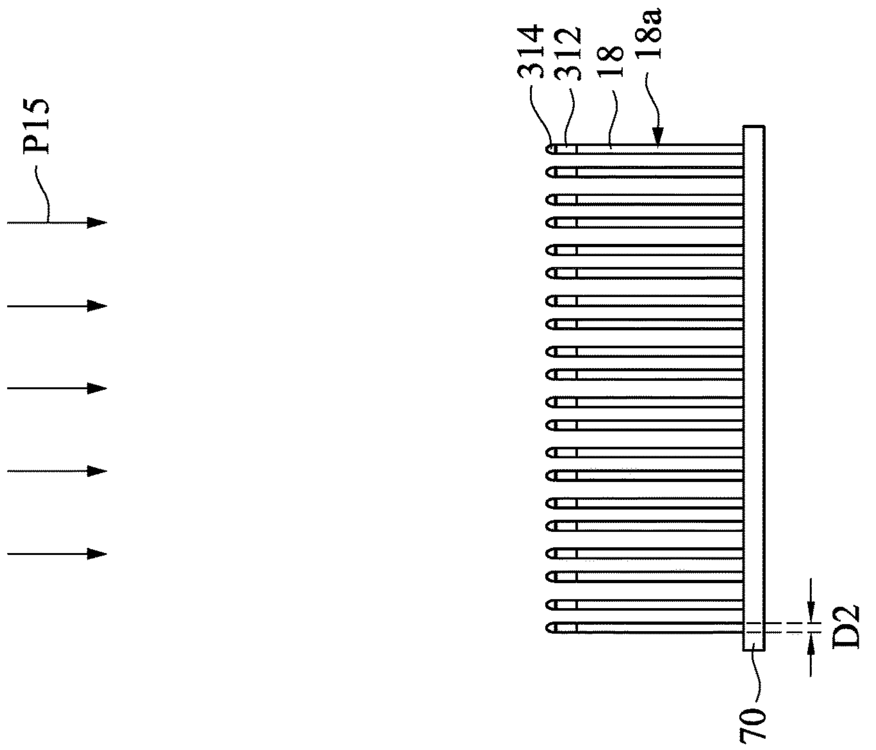
Figure 4C:
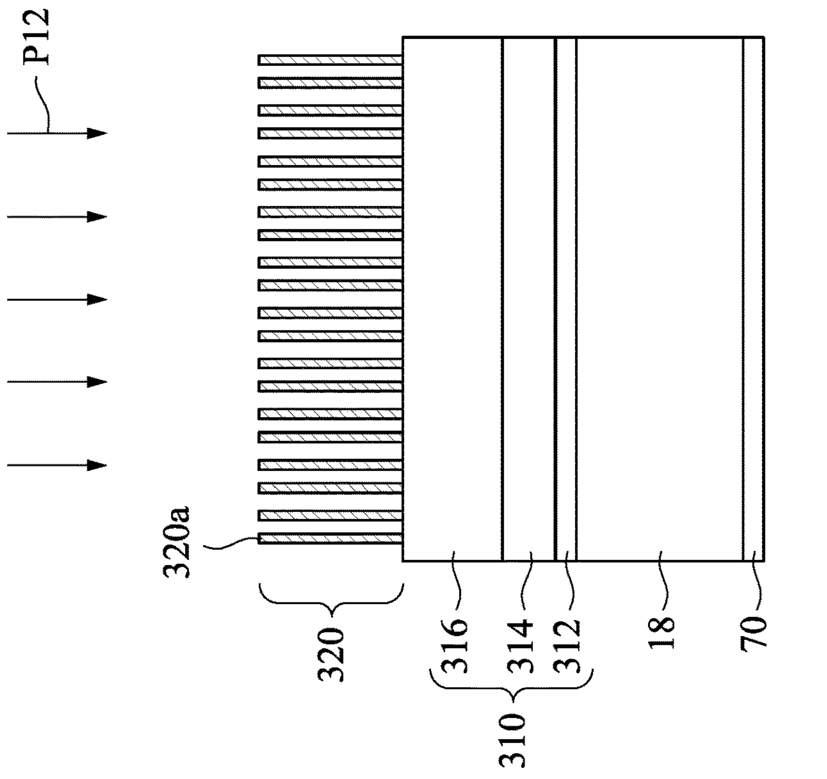

As shown in FIG. 4C, the exposed portions 320*a* of the photoresist layer 320 remain on the hard mask stack 310. As shown in FIG. 4D, one or more etching process P15 is performed to "open" the hard mask stack 310 by using the exposed portions 320*a* of the photoresist layer 320 as a mask. In other words, the hard mask stack 310 is patterned by using the photoresist layer 320. Subsequently, the patterned hard mask stack 310 may serve as a mask in the etching process on the dielectric layer 18. In some embodiments, the etching process P15 may lead to a loss (i.e., the loss of the hard mask stack 310 and the exposed portions 320*a* of the photoresist layer 320). That is, the etching process P15 would consume the hard mask stack 310 and exposed portions 320*a* of the photoresist layer 320, and thus the hard mask stack 310 may be damaged as shown in FIG. 4D. Therefore, the dielectric layer 18 is patterned into separated regions aligning with the hard mask stack 310 to have openings, trenches, and/or via holes 18*a* therein, since the hard mask stack 310 may serve as a mask during the etching process P15. In some embodiments, the dielectric layer 18 may have a pattern having a lateral dimension D2 less than about 15 nm.

Figure 5B:
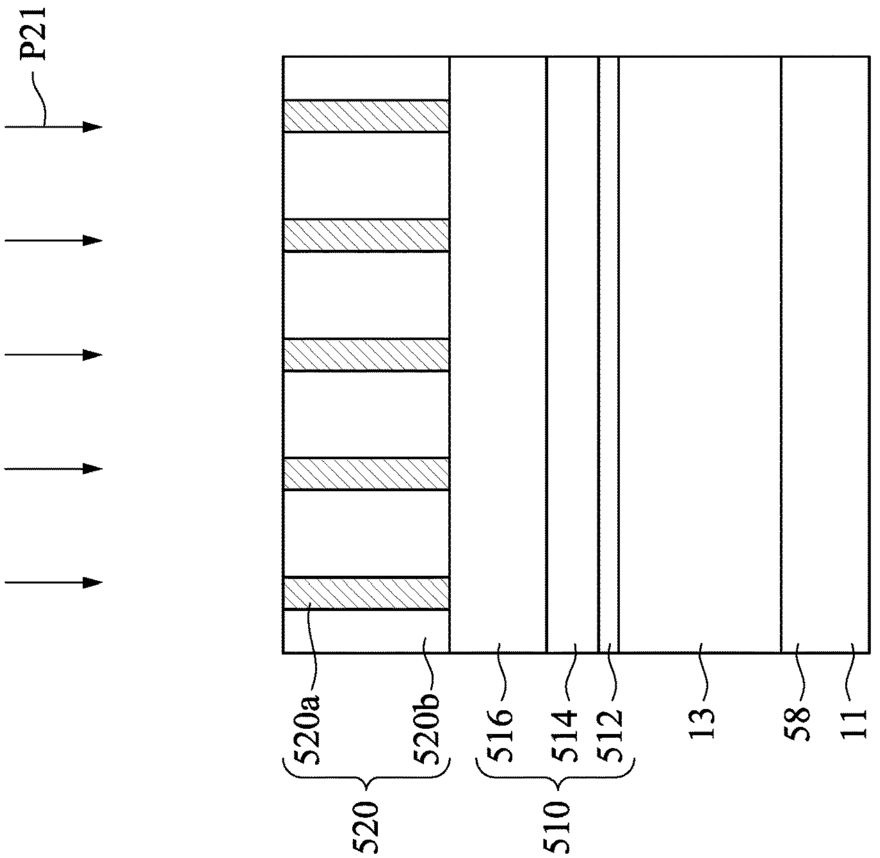
FIGS. 5A to 5O illustrate cross-sectional views of intermediate stages in the formation of gate structures of a semiconductor structure in accordance with some embodiments of the present disclosure.
Figure 5A:
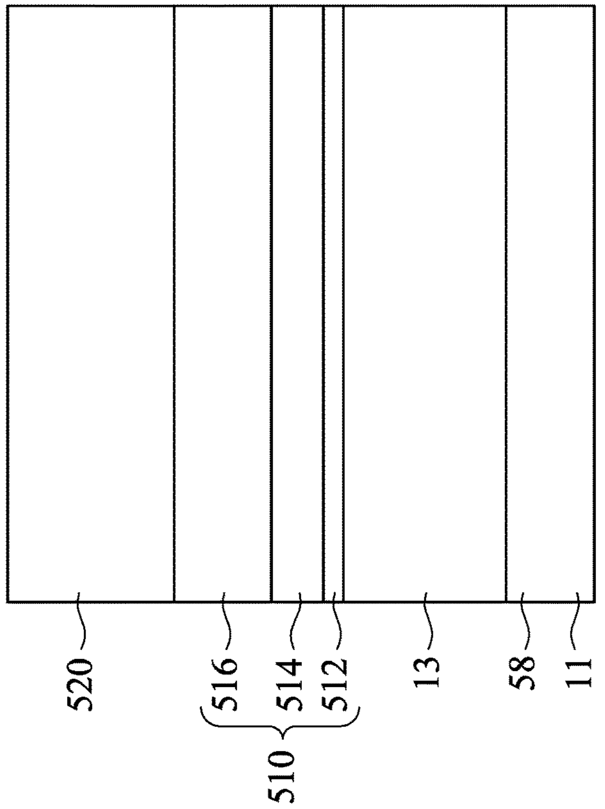
Figure 5D:
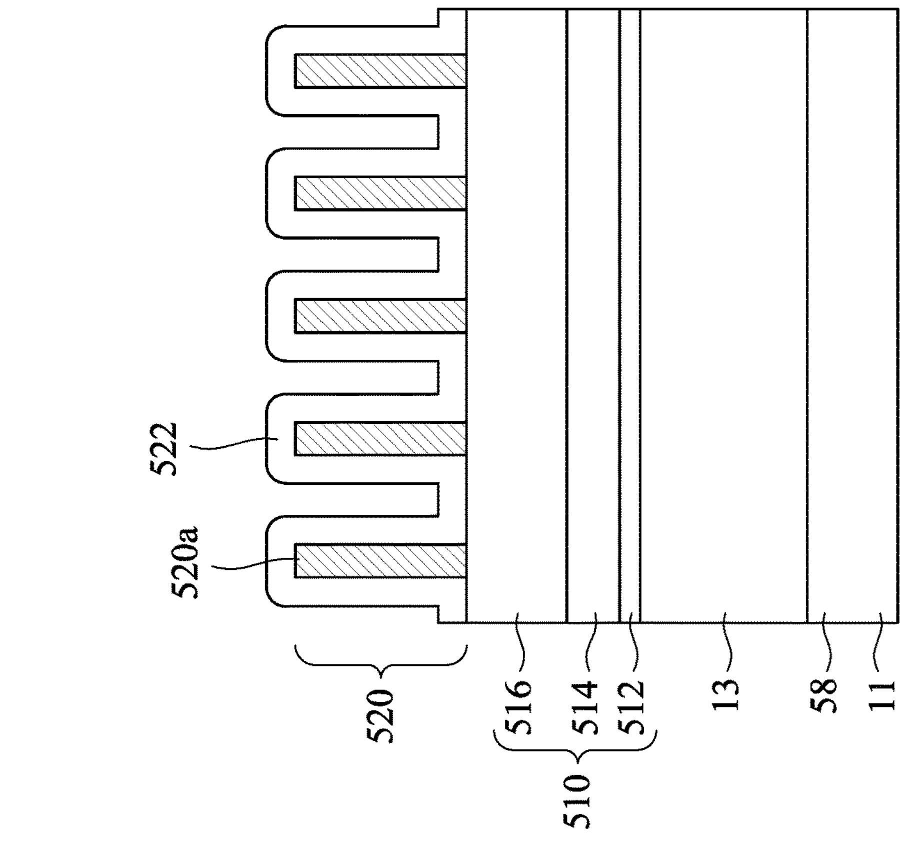
Figure 5C:
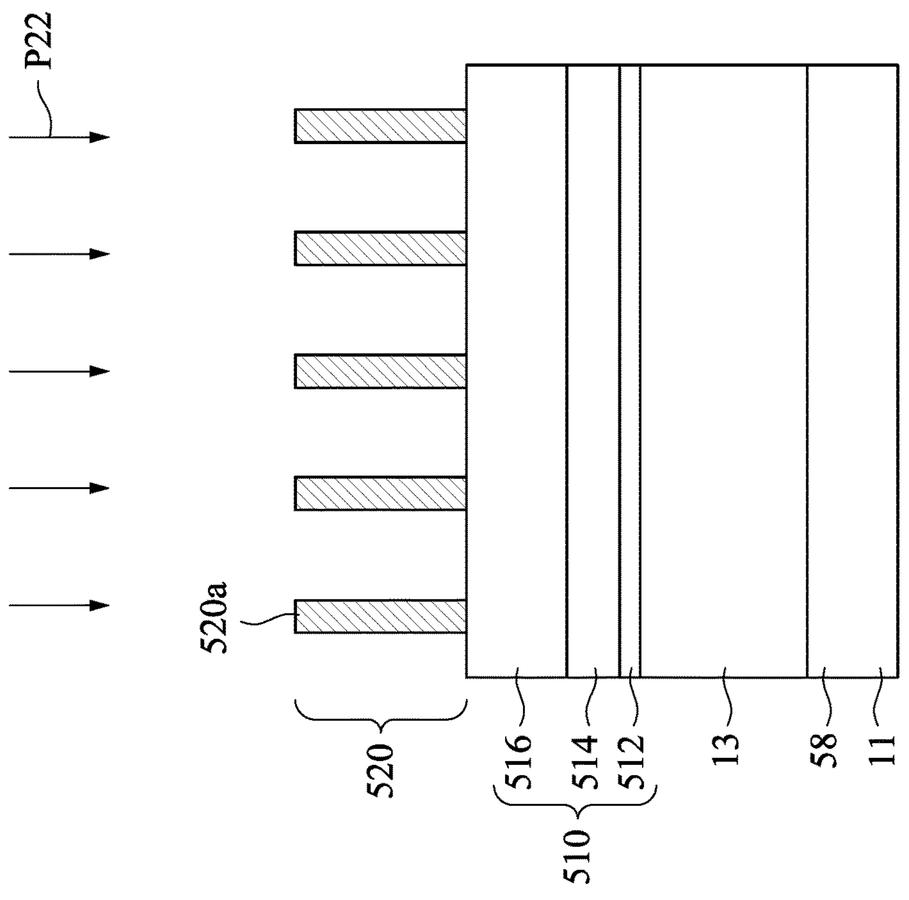
Figure 5F:
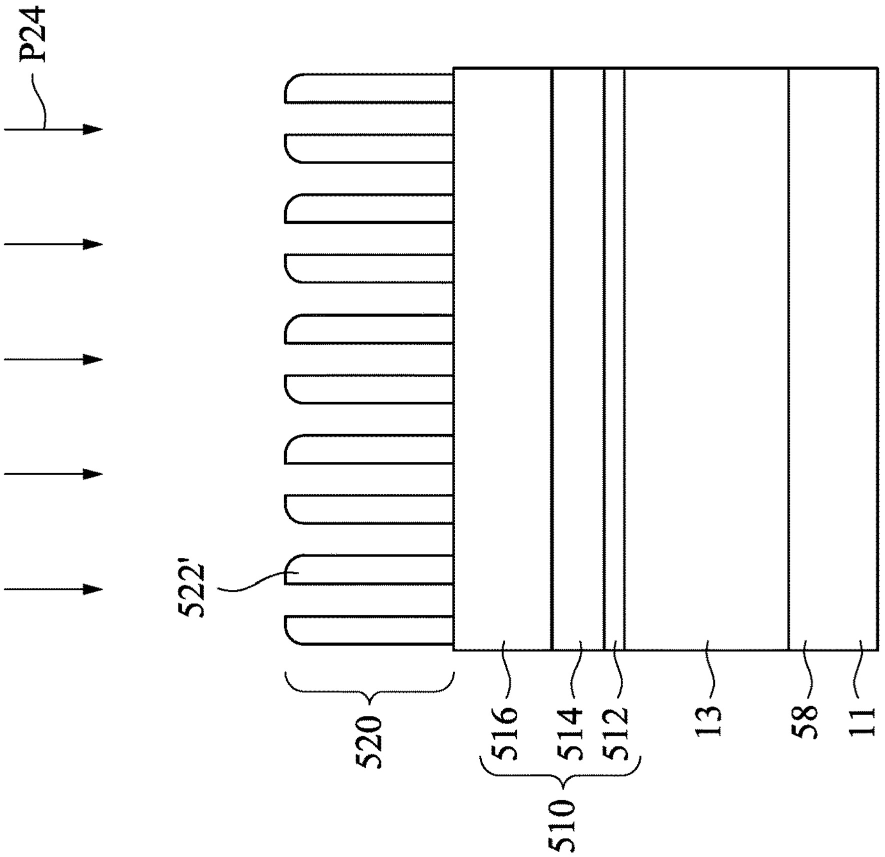
Figure 5E:
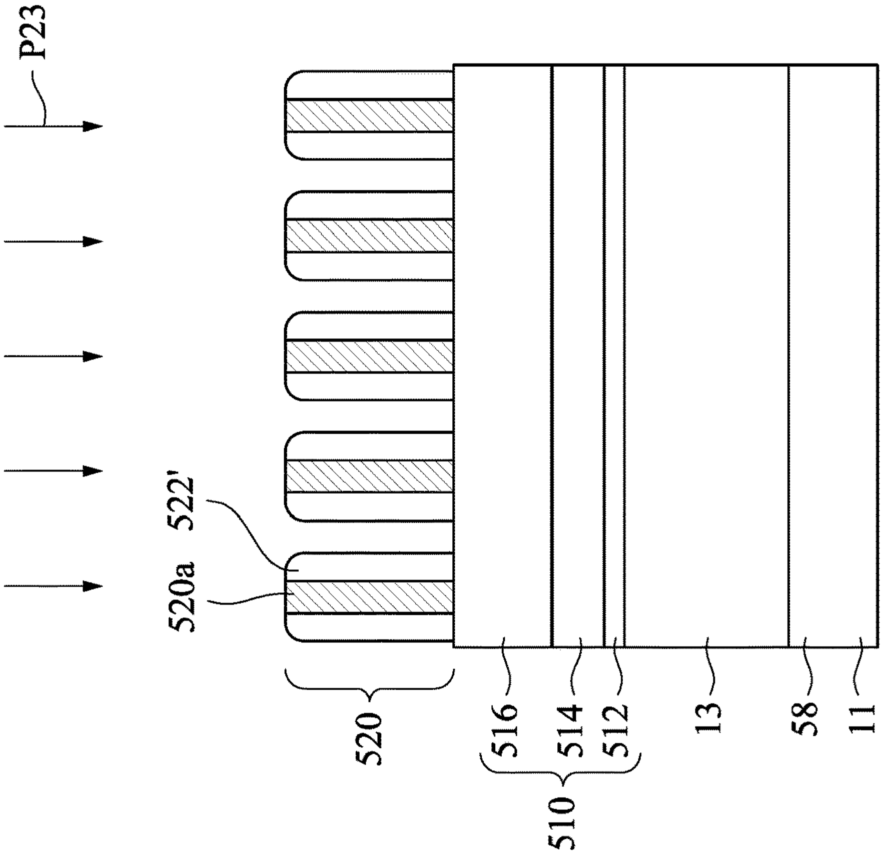
Figure 5H:
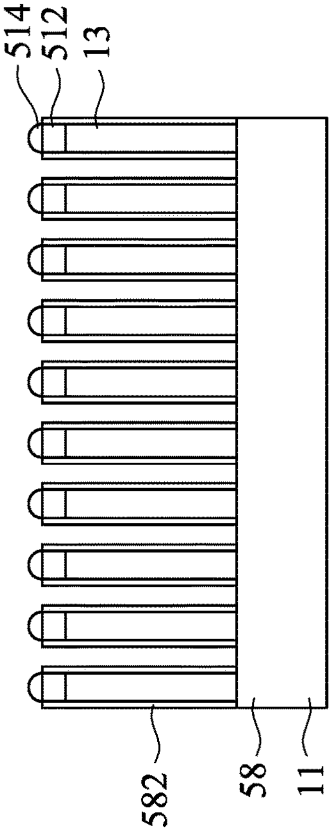
Figure 5G:
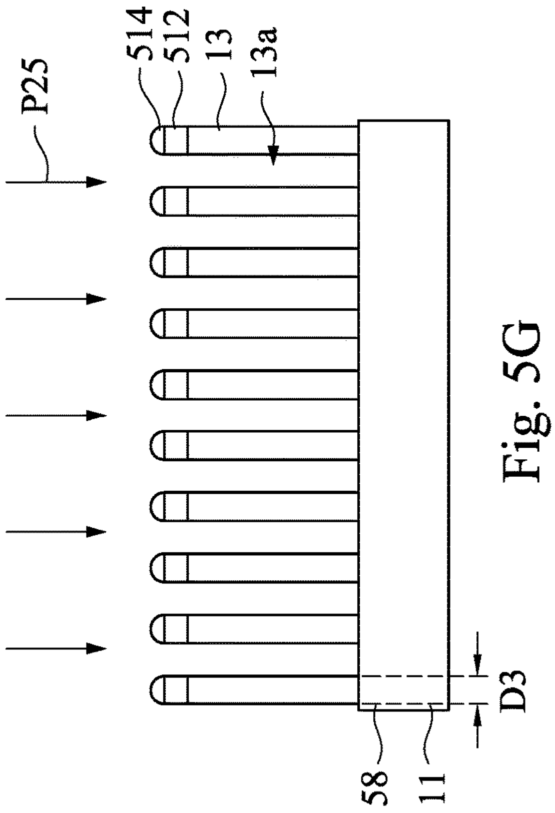
Figure 5I:
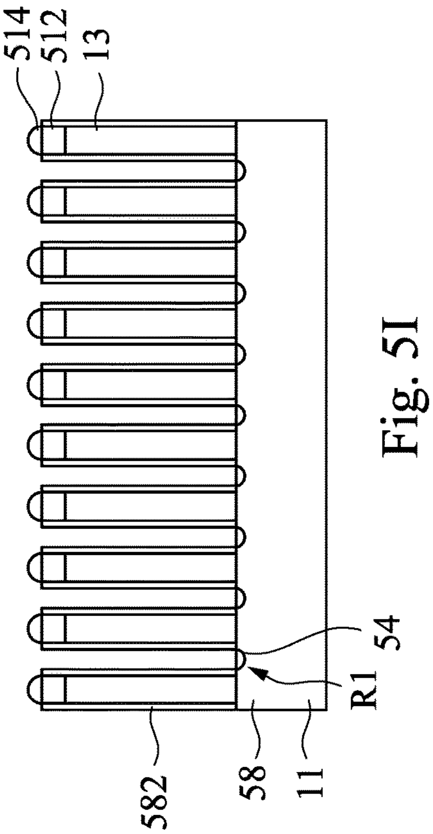
Figure 5K:
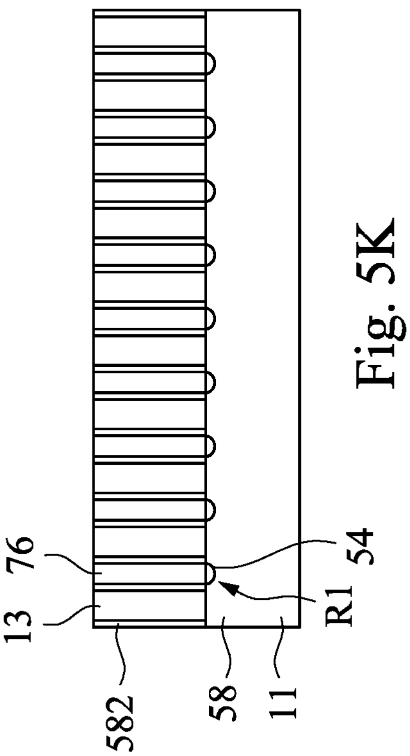
Figure 5J:
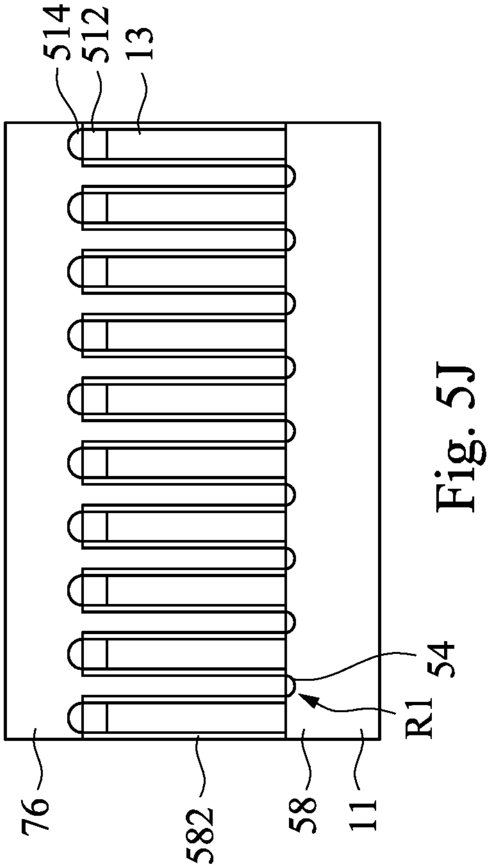
Figure 5L:
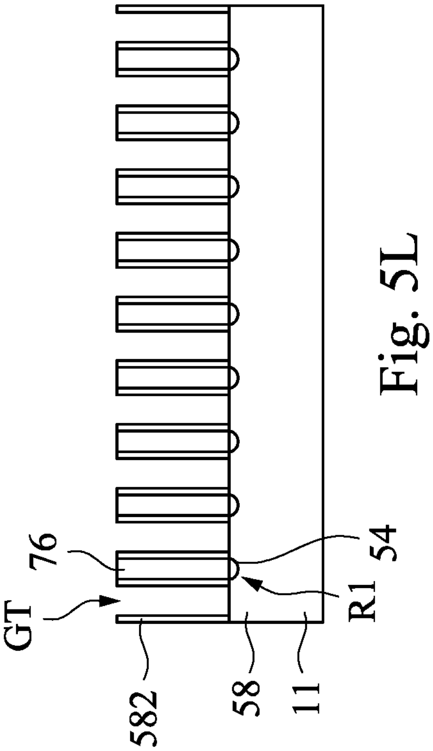
Figure 5N:
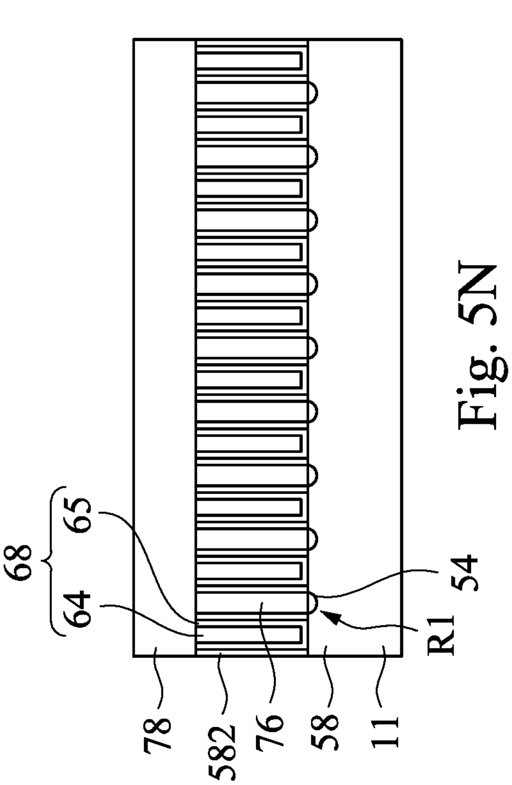
Figure 5M:
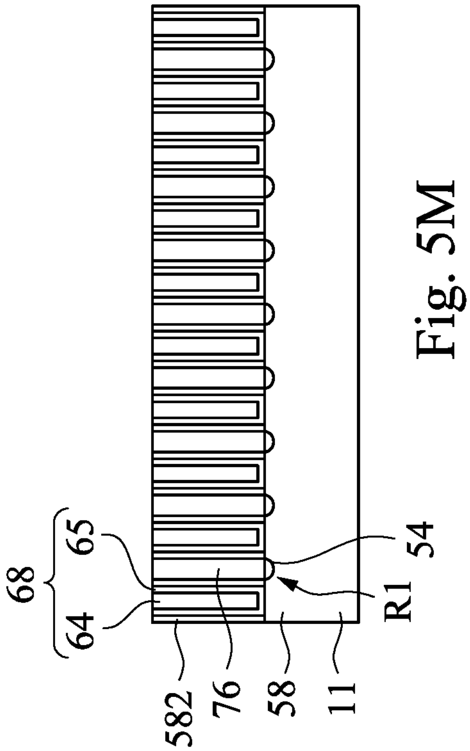
Figure 5O:
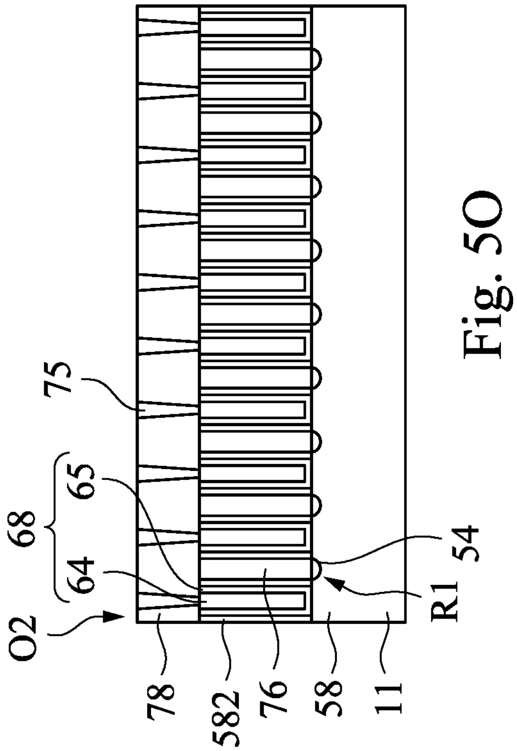

Reference is made to FIGS. 5A to 5O. FIGS. 5A to 5O illustrate cross-sectional views of intermediate stages in the formation of gate structures of a semiconductor structure in accordance with some embodiments of the present disclosure. FIGS. 5A to 5O illustrate an exemplary method in accordance with some embodiments. The method includes a relevant part of the entire manufacturing process. The method may be implemented, in whole or in part, by a system employing extreme ultraviolet (EUV) lithography and other appropriate lithography processes to improve pattern dimension accuracy. Additional operations can be provided before, during, and after the method, and some operations described can be replaced, eliminated, modified, moved around, or relocated for additional embodiments of the method. One of ordinary skill in the art may recognize other examples of semiconductor fabrication processes that may benefit from aspects of the present disclosure. The method is an example, and is not intended to limit the present disclosure beyond what is explicitly recited in the claims.

Reference is made to FIG. 5A. A dummy gate layer 13 is formed over the semiconductor fin 58 on the substrate 11 (see FIG. 2). Subsequently, a tri-layer hard mask stack 510 including hard mask layers 512, 514, and 516 is formed over one of the semiconductor fin 58. Subsequently, a photoresist layer 520 is formed over hard mask layer 516. The photoresist layer 520 is sensitive to the light radiation of the lithography exposure process to be applied at later stage (see FIG. 5B), so as to have pattern thereon to pattern the underlying hard mask stack 510. The patterned hard mask stack 510 (see FIG. 5C) can be used as an etch mask to etch the underlying dummy gate layer 13 in subsequent processing. In some embodiments, the dummy gate layer 13 can be referred to as a target layer.

In some embodiments, the dummy gate layer 13 may include a dummy gate dielectric layer blanket formed over the semiconductor fin 58 and a dummy gate electrode layer formed over the dummy gate dielectric layer. In some embodiments, the dummy gate dielectric layer may be made of silicon oxide, high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the dummy gate dielectric layer is an oxide layer. The dummy gate dielectric layer may be formed by a deposition processes, such as chemical vapor deposition (CVD), physical vapor deposition (PVD), atomic layer deposition (ALD), plasma enhanced atomic layer deposition (PEALD), plasma enhanced CVD (PECVD) or other suitable techniques. In some embodiments, the dummy gate electrode layer may include polycrystalline-silicon (poly-Si), polycrystalline silicon-germanium (poly-SiGe), metallic nitrides, metallic silicides, metallic oxides, or metals. In some embodiments, the dummy gate electrode layer may include a metal-containing material such as TiN, TaN, TaC, Co, Ru, Al, combinations thereof, or multi-layers thereof. The dummy gate electrode layer may be deposited by CVD, physical vapor deposition (PVD), sputter deposition, or other techniques suitable for depositing conductive materials.

In some embodiments, the hard mask layer 514 of the hard mask stack 510 may be made of a material that has a high etching selectivity relative to the underlying and overlying hard mask layers 512 and 516. For example, the etching selectivity, which is the ratio of the etching rate of hard mask layer 516 to the etching rate of the hard mask layer 514, is greater than about 10 when the hard mask layer 516 is etched, and the etching selectivity, which is the ratio of the etching rate of hard mask layer 514 to the etching rate of the hard mask layer 512, is greater than about 10 when the hard mask layer 514 is etched. In some embodiments, the hard mask layer 514 of the hard mask stack 510 may be made of a different material than the hard mask layers 512 and 516. In some embodiments, the hard mask layer 512 may be made of a same as the hard mask layer 516. In some embodiments, the hard mask layer 512 may be made of a different material than the hard mask layer 516. By way of example and not limitation, the hard mask layer 512 may be made of a dielectric material, such as SiO or SiN. The hard mask layer 514 may be made of metal nitride, such as TiN, or a metal oxide, such as TiO, ZrO, ZrTiO. In some embodiments, the hard mask layer 514 may be made of metal metal carbide, such as WdC. The hard mask layer 516 may be made of a dielectric material, such as SiO, SiN. In some embodiments, the hard mask layer 516 may be made of a metal oxide, such as TiO, ZrO, ZrTiO. In some embodiments, the hard mask layer 512, 514, and/or 516 of the hard mask stack 510 can be interchangeably referred to as a dielectric layer. In some embodiments, the hard mask layer 512, 514, and/or 516 of the hard mask stack 510 may be formed using, for example, CVD, ALD, spin-on-glass (SOG) or other suitable techniques. In some embodiments, the hard mask layer 512 may have a thinner thickness than the hard mask layer 514. The hard mask layer 514 may have a thinner thickness than the hard mask layer 516. The hard mask layer 512 may have a thinner thickness than the hard mask layer 516. By way of example and not limitation, the hard mask layer 512 may have a thickness ranging from about 5 nm to about 100 nm. The hard mask layer 514 may have a thickness ranging from about 5 nm to about 100 nm. The hard mask layer 516 may have a thickness ranging from about 5 nm to about 100 nm.

In some embodiments, the photoresist layer 520 is sensitive to EUV radiation. The photoresist layer 520 includes metal to increase the sensitivity of the EUV photo radiation, therefore being also referred to as metal-containing photoresist (MePR) layer. In some embodiments, the metal in the photoresist layer 520 has a sufficient concentration for EUV sensitivity, such as being greater than 5% (weight percentage) of the photoresist layer 520. The structure of the photoresist layer 520 may be in a proper form, such as metal-containing inorganic polymer, metal clusters, metal molecules, metal oxide chemical or a combination thereof. In some embodiments, the metal molecule may be a metal complex or metal compound. In some embodiments, the metal oxide chemical may be a chemical structure having metal oxide with outer organic ligand. In some embodiments, the metal cluster may be a chemical structure with multiple metal centers clustered together. The photoresist layer 520 may be made of a material that has a high etching selectivity relative to the underlying hard mask stack 510. For example, the etching selectivity, which is the ratio of the removing rate of the unexposed portion 520*b* (see FIG. 5B) of the photoresist layer 520 to the etching rate of the hard mask stack 510, is greater than about 10 when the unexposed portion 520*b* (see FIG. 5B) of the photoresist layer 520 is patterned. Throughout the description, the photoresist layer 520 can be interchangeably referred to as a mandrel layer in a spacer lithography process or a sacrificial layer. In some embodiments, the photoresist layer 520 may be silicon-free. In some embodiments, the photoresist layer 520 may have a thicker thickness than the hard mask layer 512, 514, and/or 516. By way of example but not limiting the present disclosure, the photoresist layer 520 may have a thickness less than about 20 nm. Therefore, the photoresist layer 520 may be a thin film, which in turn reduces the risk of photoresist pattern collapse.

In some embodiments, the photoresist layer 520 may have a composition including an organometallic material, a solvent, photoactive compounds (PACs) (e.g., photoacid generators (PAG)), a quencher, a surfactant, a chromophore, counter ions, any suitable material, or combinations thereof. In some embodiments, the organometallic material of the photoresist layer 520 may include a metal core M and a plurality of organic ligands including a photo-cleavable ligand and a non-photo-cleavable ligand having a crosslinking group. During the exposure to actinic radiation, the metal core of the organometallic material absorbs actinic radiation and generates a radical through metal core-ligand bond cleavage from the photo-cleavable ligand. In some embodiments, more secondary electrons are generated by photo excitation of the organometallic than a non-metallic organic compound because the binding energy of the electrons for the metal is lower. In addition, the metal core-ligand bond is also cleavable by secondary electron excitation. Radicals generated from the metal core-ligand bond cleavage initiate and trigger polymerization when the non-cleavable ligand on the metal has specific functional groups that can react with the radicals in some embodiments. Photoradical-assisted self-polymerization occurs, and not only metal oxides, but also organic crosslink frameworks form, providing much higher contrast and enabling a lower exposure dose to be used to pattern the photoresist layer. In some embodiments, the organometallic material of the photoresist layer 520 may have the following chemical formulas, where M represents metal species, O represents oxygen, R1, R2, and R3 represent different organic functional groups, and n represents degree of polymerization, and the polymer may be included in one of the organic functional groups.

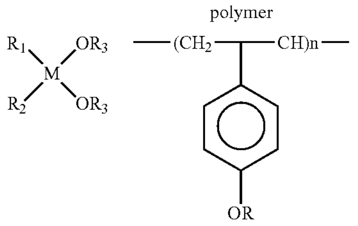

In some embodiments, the metal core M of the organometallic material in the photoresist layer 520 includes one or more metal elements. In some embodiments, the one or more metal elements may be selected from the group consisting of Hf, Sn, Zr, Ti, Cr, W, Mo, Fe, Ru, Os, Co, Ru, Rh, Ir, Ni, Pd, Pt, Cu, Ag, Au, Zn, Cd, Al, Ga, Fe, Ti, Ge, Sn, Pb, Sb, and Bi. In some embodiments, the metal element of the photoresist layer 520 may be a same metal element (e.g., Sn, Zr) as the fuel droplet 120 (see FIG. 1) that is for creating the EUV radiation 116. By way of example and not limitation, the organometallic material of the photoresist layer 520 can be denoted as $SnO_xC_yH_z$ or $ZrO_xC_yH_z$.

In some embodiments, the photo-cleavable ligand of the organometallic material in the photoresist layer 520 is an aliphatic or aromatic, cyclic or non-cyclic C1-C30 group, wherein the C1-C30 group is unsubstituted or substituted with one or more selected from the group consisting of —I, —Br, —Cl, —F, —NH2, —COOH, —OH, —SH, —N3, —S(═O)—, an alkene group, an alkyne group, an imine group, an ether group, an ester group, an aldehyde group, a ketone group, an amide group, a sulfone group, an acetic acid group, a cyanide group, an allene group, an alcohol group, a diol group, an amine group, a phosphine group, a phosphite group, an aniline group, a pyridine group, and a pyrrole group. In some embodiments, the metal core-photo-cleavable ligand bond has sp3 characteristics and forms a stable radical. When a stable radical can be formed, the metal core-photo-cleavable ligand bond is photocleavable. On the other hand, if the photo-cleavable ligand includes strong electron withdrawing groups, the photo-cleavable ligand may not form a stable radical, and the etal core-photo-cleavable ligand bond may not be photocleavable.

In some embodiments, the non-photo-cleavable ligand of the organometallic material in the photoresist layer 520 is different from the photo-cleavable ligand. In some embodiments, the non-photo-cleavable ligand is an aliphatic or aromatic, cyclic or non-cyclic C2-C30 group, wherein the C2-C30 group is unsubstituted or substituted with one or more selected from the group consisting of —I, —Br, —Cl, —F, —NH2, —COOH, —OH, —SH, —N3, —S(═O)—, an alkene group, an alkyne group, an imine group, an ether group, an ester group, an aldehyde group, a ketone group, an amide group, a sulfone group, an acetic acid group, a cyanide group, an allene group, an alcohol group, a diol group, an amine group, a phosphine group, a phosphite group, an aniline group, a pyridine group, and a pyrrole group. In some embodiments, the metal core-non-photo-cleavable ligand bond has sp2 characteristics and does form a stable radical. When a stable radical cannot be formed, the metal core-non-photo-cleavable ligand bond is not photo-cleavable.

In some embodiments, the organometallic material of the photoresist layer 520 may further include a ligand different than the photo-cleavable ligand and non-photo-cleavable ligand. The ligand may include C3-C12 aliphatic or aromatic ligand. The aliphatic or aromatic groups in some embodiments. The aliphatic or aromatic groups may be unbranched or branched with cyclic, or noncyclic saturated pendant groups containing 1-9 carbons, including alkyl groups, alkenyl groups, and phenyl groups. The branched groups may be further substituted with oxygen or halogen. In some embodiments, the C3-C12 aliphatic or aromatic groups include heterocyclic groups. In some embodiments, the C3-C12 aliphatic or aromatic groups are attached to the metal by an ether or ester linkage. In some embodiments, the ligand may include branched or unbranched, cyclic or non-cyclic, saturated organic groups, including C1-C7 alkyl groups or C1-C7 fluoroalkyl groups. In some embodiments, the C1-C7 alkyl groups or C1-C7 fluoroalkyl groups include one or more substituents selected from the group consisting of —CF3, —SH, —OH, ═O, —S—, —P—, —PO2, —C(═O)SH, —COOH, —C(═O)O—, —O—, —N—, —C(═O)NH, —SO2OH, —SO2SH, —SOH, and —SO2-. In some embodiments, the ligand may include one or more substituents selected from the group consisting of —CF3, —OH, —SH, and —COOH substituents.

In some embodiments, the solvent of the photoresist layer 520 may include propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (AMC), n-butyri acetate (nBA), and 2-heptanone (MAK), any suitable solvent, or combinations thereof.

In some embodiments, the photoactive compounds (PACs) of the photoresist layer 520 along with any desired additives or other agents, are added to the solvent for application. Once added, the mixture is then mixed in order to achieve a homogenous composition throughout the photoresist composition to ensure that there are no defects caused by uneven mixing or nonhomogenous composition of the photoresist. Once mixed together, the photoresist may either be stored prior to its usage or used immediately. The PACs are photoactive components, such as photoacid generators (PAG), free-radical generators, photobase (PBG) generators, photo decomposable bases (PDB), or the like. The PACs may be positive-acting or negative-acting. In some embodiments, the photoacid generator (PAG) of the photoresist layer 520 may have the following chemical formulas, where S represents sulfur, F represents fluorine, and N represents nitrogen.

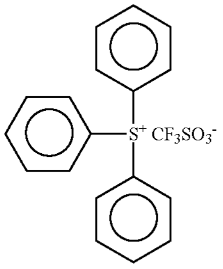

In some embodiments, the photoacid generators of the photoactive compounds of the photoresist layer 520 may include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like. In some embodiments, specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments, the free-radical generator of the photoactive compounds of the photoresist layer 520 may include photoinitiators, including n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

In some embodiments, the photobase generators of the photoactive compounds of the photoresist layer 520 may include quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl)cyclic amines, combinations of these, or the like. In some embodiments, the photo decomposable base of the photoactive compounds of the photoresist layer 520 may include triphenylsulfonium hydroxide, triphenylsulfonium antimony hexafluoride, and triphenylsulfonium trifyl. As one of ordinary skill in the art will recognize, the chemical compounds listed herein are merely intended as illustrated examples of the photoactive compounds and are not intended to limit the embodiments to only those of the photoactive compounds specifically described. Rather, any suitable photoactive compounds may be used, and all such PACs are fully intended to be included within the scope of the present embodiments.

In some embodiments, the quencher of the photoresist layer 520 can be used to inhibit diffusion of the generated acids/bases/free radicals within the photoresist. The quencher may improve the resist pattern configuration as well as the stability of the photoresist over time. In some embodiments, the quencher is an amine, such as a second lower aliphatic amine, a tertiary lower aliphatic amine, or the like. Specific examples of amines include trimethylamine, diethylamine, triethylamine, di-n-propylamine, tri-n-propylamine, tripentylamine, diethanolamine, and triethanolamine, alkanolamine, combinations thereof, or the like. In some embodiments, an organic acid is used as the quencher. Specific embodiments of organic acids include malonic acid, citric acid, malic acid, succinic acid, benzoic acid, salicylic acid; phosphorous oxo acid and its derivatives, such as phosphoric acid and derivatives thereof such as its esters, phosphoric acid di-n-butyl ester and phosphoric acid diphenyl ester; phosphonic acid and derivatives thereof, including its ester, such as phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof, including its esters, such as phenylphosphinic acid. In some embodiments, the quencher of the photoresist layer 520 may have the following chemical formulas, where R4 represent an organic functional group.

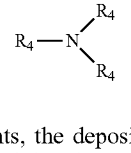

In some embodiments, the depositing of the photoresist layer 520 may include mixing the organometallic compound with a solvent, coating the substrate with the organometallic compound/solvent mixture and then subsequently drying the photoresist such as by heating, to remove the solvent. In some embodiments, forming the photoresist layer 520 may be performed by as a spin-on coating process, a dip coating method, an air-knife coating method, a curtain coating method, a wire-bar coating method, a gravure coating method, a lamination method, an extrusion coating method, combinations of these, or the like.

In some embodiments, forming the photoresist layer 520 may be performed by a vapor phase deposition operation. In some embodiments, the vapor phase deposition process may include atomic layer deposition (ALD) process or chemical vapor deposition (CVD) process. In some embodiments, the ALD process may include plasma-enhanced atomic layer deposition (PE-ALD) process, and the CVD process may include plasma-enhanced chemical vapor deposition (PE-CVD) process, metal-organic chemical vapor deposition (MO-CVD) process, atmospheric pressure chemical vapor deposition (AP-CVD) process, and low pressure chemical vapor deposition (LP-CVD) process. In some embodiments, the organometallic material is composed of one or more precursors. In some embodiments, the one or more precursors are reacted in a deposition chamber to form the organometallic material. In some embodiments, depositing the photoresist layer includes combining the first compound or first precursor and the second compound or second precursor in a vapor state to form the photoresist composition. In some embodiments, only one photoresist compound or precursor is introduced into the deposition chamber. In some embodiments, the first compound or first precursor and the second compound or second precursor of the photoresist composition are introduced into a deposition chamber (e.g., CVD chamber) at about the same time via the inlets. In some embodiments, the first compound or first precursor and second compound or second precursor are introduced into a deposition chamber (e.g. ALD chamber) in an alternating manner. In some embodiments, the first and second compounds or precursors are delivered into the deposition chamber with a carrier gas. The carrier gas, a purge gas, a deposition gas, or other process gas may contain nitrogen, hydrogen, argon, neon, helium, or combinations thereof.

Reference is made to FIG. 5B. An exposure process P21 to the photoresist layer 520 utilizing the EUV radiation 116 (see FIG. 1) from the EUV lithography system 10, thereby forming a latent pattern of the photoresist layer 320 including exposed portions 520*a* and unexposed portions 520*b*. In some embodiments, the EUV radiation 116 is directed to the photoresist layer 520 on the wafer W1 to form an image of a circuit pattern defined on a photomask (such as a reflective mask) in a proper exposure mode such as step-and-scan. Various resolution enhancement techniques, such as phase-shifting, off-axis illumination (OAI) and/or optical proximity correction (OPC), may be used or implemented through the photomask or the exposure process. For examples, the OPC features may be incorporated into the circuit pattern on the photomask. In some embodiments, the photomask is a phase-shift mask, such as an alternative phase-shift mask, an attenuated phase-shift mask, or a chrome-less phase-shift mask. In some embodiments, the exposure process is implemented in an off-axis illumination mode. In some embodiments, the EUV radiation 116 is directly modulated with a predefined pattern (such as an IC layout) without using a photomask (such as using a digital pattern generator or direct-write mode).

The exposed portions 520*a* of the photoresist layer 520 exposed to the EUV radiation 116 (see FIG. 1) undergoes a chemical reaction thereby changing its solubility in a subsequently applied developer relative to the unexposed portions 520*b* of the photoresist layer 520 not exposed to the EUV radiation 116. In some embodiments, the exposed portions 520*a* of the photoresist layer 520 undergo a cross-linking reaction.

A reaction of a photoresist composition including the organometallic material of the photoresist layer 520 undergoes when exposed to actinic radiation. The organometallic material, including the metal core M, a photo-cleavable ligand, and a non-photo-cleavable ligand having a cross-linking group, is exposed to actinic radiation, such as the EUV radiation 116 (see FIG. 1). The photo-cleavable ligand is converted to a radical upon the absorption of actinic radiation. The radical of the photo-cleavable ligand is subsequently cleaved from the metal core and the radical of the photo-cleavable ligand interacts with the non-photo-cleavable ligand to activate the non-photo-cleavable ligand. In some embodiments, the radical of the photo-cleavable ligand introduces a double bond into the non-photo-cleavable ligand. The metal core reacts with ambient water or oxygen to form a metal oxide or metal hydroxide. The radical activated non-photo-cleavable ligand crosslinks with other non-photo-cleavable ligand and metal hydroxide groups react in a condensation reaction to form a crosslinked metal oxide and organic framework.

By way of example and not limitation, the organometallic material of the photoresist layer 520 can have tin (Sn) as the metal core M. The organometallic tin compound has a first photo-cleavable ligand, e.g.—an alkyl group, and a second ligand having a crosslinking group, e.g.—a styrene group is exposed to actinic radiation hv. The exposure to actinic radiation cleaves the alkyl group from the tin atom forming a radical. The radical organometallic tin compound reacts with ambient water and the cleaved radical alkyl group reacts with the crosslinking group on the second ligand activating (e.g.—forming a radical) the second ligand (e.g.—forming a radical). Tin hydroxide groups on one organometallic compound subsequently react with tin hydroxide groups on another organometallic compound in a condensation reaction, while the activated second ligand reacts with another second ligand on another organometallic compound in a polymerization reaction. Thus, the organometallic tin compound undergoes both an inorganic crosslinking (a condensation reaction) and an organic crosslinking via the C═C double bonds on the crosslinking groups in some embodiments.

Subsequently, the photoresist layer 520 may undergo a heating or a post-exposure bake (PEB) in a thermal chamber. In some embodiments, the photoresist layer 520 is heated at a temperature in a range from about 50° C. to about 250° C., such as about 50, 75, 100, 125, 150, 175, 200, 225, or 2500° C. In some embodiments, the post-exposure bake may be performed in a time duration in a range from about 20 seconds to about 300 seconds, such as 20, 75, 50, 75, 100, 125, 150, 175, 200, 225, 250, 275, or 300 seconds. In some embodiments, the post-exposure baking can cause the photoresist composition in the photoresist layer 520 that was exposed to the EUV radiation 116 (see FIG. 1) to further crosslink.

Reference is made to FIG. 5C. A developing process P22 is performed on the photoresist layer 520 to pattern the photoresist layer 520. The photoresist layer 520 can be positive tone resists or negative tone resists. A positive tone resist refers to a photoresist material that when exposed to radiation becomes removable under the developing process P22, while the region of the photoresist that is non-exposed (or exposed less) is non-removable under the developing process P22. A negative tone resist, on the other hand, refers to a photoresist material that when exposed to radiation becomes non-removable under the developing process P22, while the region of the photoresist that is non-exposed (or exposed less) is removable under the developing process P22.

In some embodiments, the photoresist layer 520 is a negative-tone photoresist and the exposed portions 520*a* of the photoresist layer 520 experience crosslinking and polymerization, therefore remain after the developing process P22. The unexposed portions 520*b* of the photoresist layer 520 are removed by the developing process P22 to expose the underlying mask stack 510. In some embodiments, the photoresist layer 520 can be interchangeably referred to as a negative tone developed (NTD) resist.

In some embodiments, the developing process P22 can be an anisotropic etching process. In some embodiments, the developing process P22 can be a dry etching process, such as plasma etching process. The plasma etching process may be performed by plasma processing apparatus 5 as shown in FIG. 3J, such as an inductively coupled plasma (ICP) apparatus, a capacitively coupled plasma (CCP) apparatus, or a micro wave apparatus. The etchant ions in the plasma processing apparatus 5 bombard the surface of the wafer W1 to remove the unexposed portion 520*b* (see FIG. 513) of the photoresist layer 520. A bias etching can be provided by the plasma source 26 (see FIG. 3J) with turning on the RF power source 28 (see FIG. 3J) during the bias etching step.

In some embodiments, the source power of the developing process P22 may be performed at a frequency in a range from about 13.56 MHz to about 2.45 GHz. In some embodiments, the bias power of the developing process P22 may be in a range from about 50 W to about 2000 W, such as 100, 500, 1000, 1500, or 2000 W. If the source power is higher than about 2000 W, the plasma might result in unwanted etch rate to the exposed portions 520*a* of the photoresist layer 520. In some embodiments, the developing process P22 may use a gas mixture including, such as HBr, with the bias. In some embodiments, the developing process P22 may be performed under a pressure in a range from about 3 to 100 mTorr, such as about 3, 10, 20, 30, 40, 50, 60, 70, 80, 90, or 100 mTorr. In some embodiments, the developing process P22 may be performed at a temperature in a range from about −140 to about 100° C., such as about −140, −120, −100, −80, −60, −40, −20, 0, 20, 40, 60, 80, or 100° C.

Reference is made to FIG. 5D. A spacer layer 522 is formed over the photoresist layer 520 and the hard mask stack 510. In some embodiments, the spacer layer 522 may be made of SiO, SiN, or a metal oxide (e.g., TiO). In some embodiments, the spacer layer 522 is conformal, and is formed by a conformal deposition method such as an ALD process, plasma enhanced (PEALD) process. Other suitable deposition methods, such as chemical vapor deposition (CVD) process, PVD process, may also be used. In some embodiments, the thickness of the spacer layer 522 may be in a range from about 5 nm to about 22 nm, in an embodiment, although other dimensions are also possible. In some embodiments, the thickness of spacer layer 522 is determined by the semiconductor process nodes used. For example, spacer layer 522 may be about 10 nm thick for one semiconductor process node, and may be about 14 nm thick for another semiconductor process node.

Reference is made to FIG. 5E. The spacer 522' may be formed by performing an etching process P23 such as anisotropic etching to remove horizontal portions of the spacer layer 522. The remaining portions of the spacer layer 522 on sidewalls of the photoresist layer 520 can serve as the spacer 522'. In some embodiments, the etching process can be dry etching process, such as plasma etching process by using, such as an inductively coupled plasma (ICP) apparatus, a capacitively coupled plasma (CCP) apparatus, or a micro wave apparatus. In some embodiments, the bias power of the plasma etching process on the spacer layer 522 may be performed at a source RF frequency in a range from about 13.56 MHz to about 2.45 GHz. In some embodiments, the etching process P23 may use a gas mixture including, such as $Cl_2$, $BCl_3$, with the bias. In some embodiments, the source power of the plasma etching process on the spacer layer 522 may be in a range from about 50 W to about 2000 W, such as 100, 500, 1000, 1500, or 2000 W. If the source power is higher than about 2000 W, the plasma might result in unwanted etch rate to the vertical portions of the spacer layer 522. In some embodiments, the plasma etching process on the spacer layer 522 may be performed under a pressure in a range from about 3 to 100 mTorr, such as about 3, 10, 20, 30, 40, 50, 60, 70, 80, 90, or 100 mTorr. In some embodiments, the plasma etching process on the spacer layer 522 may be performed at a temperature in a range from about −140 to about 100° C., such as about −140, −120, −100, −80, −60, −40, −20, 0, 20, 40, 60, 80, or 100° C.

Reference is made to FIG. 5F. The photoresist layer 520 is removed from the hard mask stack 510. The removal of the photoresist layer 520 provides a pattern of spacer elements. In some embodiments, the photoresist layer 320 may be removed by an anisotropic etching process. For example, the photoresist layer 320 may be removed by a dry etching process P24, such as plasma etching process, by using, such as an inductively coupled plasma (ICP) apparatus, a capacitively coupled plasma (CCP) apparatus, or a micro wave apparatus. In some embodiments, the bias power of the etching process P24 on the photoresist layer 520 may be performed at a source RF frequency in a range from about 13.56 MHz to about 2.45 GHz. In some embodiments, the etching process P24 on the photoresist layer 520 may use a gas mixture including, such as HBr, with the bias. In some embodiments, the source power of the etching process P24 on the photoresist layer 520 may be in a range from about 50 W to about 2000 W, such as 100, 500, 1000, 1500, or 2000 W. If the bias power is higher than about 2000 W, the plasma might result in unwanted etch rate to the spacer 522'. In some embodiments, the etching process P24 on the photoresist layer 520 may be performed under a pressure in a range from about 3 to 100 mTorr, such as about 3, 10, 20, 30, 40, 50, 60, 70, 80, 90, or 100 mTorr. In some embodiments, the etching process P24 on the photoresist layer 320 may be performed at a temperature in a range from about −140 to about 100° C., such as about −140, −120, −100, −80, −60, −40, −20, 0, 20, 40, 60, 80, or 100° C.

Reference is made to FIG. 5G. One or more etching process P25 is performed to "open" the hard mask stack 510. In other words, the hard mask stack 510 is patterned. The patterned hard mask stack 510 may serve as a mask in the etching process on the dummy gate layer 13. In some embodiments, the etching process P25 may lead to a loss (i.e., the loss of the hard mask stack 510 and the spacer 522'). That is, the etching process P25 would consume the hard mask stack 510 and the spacer 522', and thus the hard mask stack 510 may be damaged as shown in FIG. 5G. Subsequently, the dummy gate layer 13 is patterned into separated regions aligning with the hard mask stack 510 to have trenches 13*a* therein, since the hard mask stack 510 may serve as a mask during the etching process P25. In some embodiments, the dummy gate layer 13 may have a pattern having a lateral dimension D3 less than about 15 nm.

In some embodiments, the etching process P25 may be a dry etching process, such as plasma etching process, by using, such as an inductively coupled plasma (ICP) apparatus, a capacitively coupled plasma (CCP) apparatus, or a micro wave apparatus. In some embodiments, the source power of the etching process P25 may be performed at a frequency in a range from about 13.56 MHz to about 2.45 GHz. In some embodiments, the etching process P25 may use a gas mixture including, such as $C_4F_6$, $C_4F_8$, $H_2$, $O_2$, $CF_4$, $NF_3$, $Cl_2$, HBr with the bias. In some embodiments, the source power of the etching process P25 may be in a range from about 100 W to about 2000 W, such as 50, 500, 1000, 1500, or 2000 W. If the source power is higher than about 2000 W, the plasma might result in unwanted etch rate to the spacer 322'. In some embodiments, the etching process P25 may be performed under a pressure in a range from about 3 to 100 mTorr, su as about 3, 10, 20, 30, 40, 50, 60, 70, 80, 90, or 100 mTorr. In some embodiments, the etching process P25 may be performed at a temperature in a range from about −140 to about 100° C., such as about −140, −120, −100, −80, −60, −40, −20, 0, 20, 40, 60, 80, or 100° C. In some embodiments, after the etching process P25, the hard mask stack 510 can be removed by, such as an ashing process. By way of example and not limitation, the ashing processes may be plasma process that form plasma having a monatomic reactive species (e.g., such as oxygen or fluorine), which combines with the hard mask stack 510 to form an ash that is evacuated from a processing chamber.

Reference is made to FIG. 5H. A gate spacer 582 is formed along sidewalls of the dummy gate layer 13. In some embodiments, the gate spacer 582 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, or other suitable dielectric materials. The gate spacer 582 may include a single layer or multilayer structure made of different dielectric materials. The method of forming the gate spacer 582 may include blanket forming a dielectric layer on the structure using, by way of example and not limitation, CVD, PVD or ALD, PEALD and then performing an etching process such as anisotropic etching to remove horizontal portions of the dielectric layer. The remaining portions of the dielectric layer on sidewalls of the dummy gate layer 13 can serve as the gate spacer 582. In some embodiments, the gate spacer 582 may be used to offset subsequently formed doped regions, such as source/drain regions. The gate spacer 582 may further be used for designing or modifying the source/drain region profile.

Reference is made to FIG. 5L. Portions of the semiconductor fin 58 on the substrate 11 not covered by the dummy gate layer 13 and the gate spacer 582 are recessed to form recesses R1. In some embodiments, formation of the recesses R1 may include a dry etching process, a wet etching process, or combination dry and wet etching processes. This etching process may include reactive ion etch (RIE) using the dummy gate layer 13 and gate spacers 582 as masks, or by any other suitable removal process. After the etching process, a pre-cleaning process may be performed to clean the recesses R1 with hydrofluoric acid (HF) or other suitable solution in some embodiments.

Subsequently, epitaxial source/drain regions 54 are respectively formed in the recesses R1 to form an n-channel metal-oxide semiconductor (NMOS) transistor or a p-channel metal-oxide semiconductor (PMOS) transistor. In some embodiments, stress may enhance carrier mobility and performance of the MOS. The epitaxial source/drain regions 54 may be formed using one or more epitaxy or epitaxial (epi) processes, such that Si features, SiGe features, silicon phosphate (SiP) features, silicon carbide (SiC) features and/or other suitable features can be formed in a crystalline state on the semiconductor fin 58. The epitaxial source/drain regions 54 can be formed in different epitaxy processes. The epitaxial source/drain regions 54 may include semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial source/drain regions 54 have suitable crystallographic orientation (e.g., a (100), (110), or (111) crystallographic orientation). In some embodiments, lattice constants of the epitaxial source/drain regions 54 are different from that of the semiconductor fin 58, so that the channel region between the epitaxial source/drain regions 54 can be strained or stressed by the epitaxial source/drain regions 54 to improve carrier mobility of the semiconductor device and enhance the device performance.

In some embodiments, the epitaxial source/drain region 54 may be an n-type epitaxy structure, and the epitaxial source/drain region 54 may be a p-type epitaxy structures. The epitaxial source/drain region 54 may include SiP, SiC, SiPC, Si, III-V compound semiconductor materials or combinations thereof, and the pitaxial source/drain region 54 may include SiGe, SiGeC, Ge, Si, III-V compound semiconductor materials, or combinations thereof. During the formation of the epitaxial source/drain region 54, p-type impurities may be doped with the proceeding of the epitaxy. By way of example and not limitation, when the epitaxial source/drain region 54 includes SiC or Si, n-type impurities are doped. Moreover, during the formation of the epitaxial source/drain region 54, p-type impurities such as boron or $BF_2$ may be doped with the proceeding of the epitaxy. By way of example and not limitation, when the epitaxial source/drain region 54 includes SiGe, p-type impurities are doped.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the substrate 11 (e.g., silicon, silicon germanium, silicon phosphate, or the like). The epitaxial source/drain regions 54 may be in-situ doped. The doping species include p-type dopants, such as boron or $BF_2$; n-type dopants, such as phosphorus or arsenic; and/or other suitable dopants including combinations thereof. If the epitaxial source/drain regions 54 are not in-situ doped, a second implantation process (i.e., a junction implant process) is performed to dope the epitaxial source/drain regions 54. One or more annealing processes may be performed to activate the epitaxial source/drain regions 54. The annealing processes include rapid thermal annealing (RTA) and/or laser annealing processes. In some embodiments, the epitaxial source/drain regions 54 can be interchangeably referred to sources/drain regions, sources/drain patterns, or epitaxial structures.

Reference is made to FIG. 5J. An interlayer dielectric (ILD) layer 76 is formed over the source/drain regions 54, the dummy gate layer 13, and the gate spacers 72. In some embodiments, the ILD layer 76 includes silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 76 may be formed using, by way of example and not limitation, CVD, ALD, spin-on-glass (SOG), FCVD (flowable CVD) or other suitable techniques.

Reference is made to FIG. 5K. A CMP process to remove excessive material of the ILD layer 76 to expose the dummy gate structures 180. The CMP process may planarize a top surface of the ILD layer 76 with top surfaces of the dummy gate layer 13 and gate spacers 72. In some embodiments, the patterned hard mask stack 510 and an upper portion of the dummy gate layer 13 (see FIG. 5J) may be removed with the ILD layer 76.

Reference is made to FIG. 5L. The reminders of the dummy gate layer 13 (see FIG. 5K) are removed to form gate trenches GT with the gate spacers 72 as their sidewalls. Widths of the gate trenches GT are associated with the corresponding dummy gate layer 13. In some embodiments, the dummy gate layer 13 is removed by performing a first etching process and performing a second etching process after the first etching process. In some embodiments, the dummy gate electrode layer of the dummy gate layer 13 is mainly removed by the first etching process, and the dummy gate dielectric layer of the dummy gate layer 13 is mainly removed by the second etching process that employs a different etchant than that used in the first etching process. In some embodiments, the dummy gate electrode layer of of the dummy gate layer 13 is removed, while the gate dielectric layer of the of the dummy gate layer 13 remains in the gate trenches GT.

Reference is made to FIG. 5M. Replacement gate structures 68 are respectively formed in the gate trenches GT. An exemplary method of forming these replacement gate structures may include blanket forming a gate dielectric layer over the wafer W, forming one or more work function metals over the blanket gate dielectric layer, and performing a CMP process to remove excessive materials of the one or more work function metals and the gate dielectric layer outside the gate trenches GT. As a result of this method, the replacement gate structures 68 each include a gate dielectric layer 65 and a gate electrode layer 64 wrapped around by the gate dielectric layer 65. In some embodiments, the gate structure RG can be interchangeably referred to a gate patter or a gate strip.

In some embodiments, the gate dielectric layer 65 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 65 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric layer 65 may have a multilayer structure such as one layer of silicon oxide (e.g., interfacial layer) and another layer of high-k material. In some embodiments, the gate dielectric layer 65 is made of the same material because they are formed from the same dielectric layer blanket deposited over the substrate 11.

The gate electrode layer 64 includes suitable work function metals to provide suitable work functions. In some embodiments, the gate electrode layer 64 may include one or more n-type work function metals (N-metal) for forming an n-type transistor on the substrate 11. The n-type work function metals may exemplarily include, but are not limited to, titanium aluminide (TiAl), titanium aluminium nitride (TiAlN), carbonitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the gate electrode layer 64 may include one or more p-type work function metals (P-metal) for forming a p-type transistor on the substrate 11. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. At least two of the work function metals are made of different work function metals so as to achieve suitable work functions in some embodiments. In some embodiments, an entirety of the gate electrode layer 64 is a work function metal. In some embodiments, the term "work function" refers to the minimum energy (usually expressed in electron volts) needed to remove an electron from a neutral solid to a point immediately outside the solid surface (or energy needed to move an electron from the Fermi energy level into vacuum). Here "immediately" means that the final electron position is far from the surface on the atomic scale but still close to the solid surface on the macroscopic scale.

Reference is made to FIG. 5N. An ILD layer 78 is formed over the replacement gate structures 68 and the ILD layer 76. In some embodiments, the ILD layer 78 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, or other suitable dielectric materials.

Reference is made to FIG. 5O. Contact holes O2 may be formed by any suitable process in the ILD layer 78. Subsequently, a conductive material layer fills in the contact holes O2. In some embodiments, the conductive material layer includes TiN, TaN, Ta, Ti, Hf, Zr, Ni, W, Co, Cu, Ag, Al, Zn, Ca, Au, Mg, Mo, Cr, or the like. In some embodiments, the conductive material layer may be formed by CVD, PVD, plating, ALD, or other suitable technique. Subsequently, A CMP process is performed to remove a portion of the conductive material layer above a top surface of the ILD layer 78. After planarization, the gate contacts 75 are formed. The gate contacts 75 go through the ILD layer 78 to provide electrical contact to the replacement gate structures 68.

Reference is made to 6A to 6D. FIGS. 6A to 6D illustrate cross-sectional views of intermediate stages in the formation of gate structures of a semiconductor structure in accordance with some embodiments of the present disclosure. FIGS. 6A to 6D illustrate an exemplary method in accordance with some embodiments. The method includes a relevant part of the entire manufacturing process. The method may be implemented, in whole or in part, by a system employing extreme ultraviolet (EUV) lithography and other appropriate lithography processes to improve pattern dimension accuracy. Additional operations can be provided before, during, and after the method, and some operations described can be replaced, eliminated, modified, moved around, or relocated for additional embodiments of the method. One of ordinary skill in the art may recognize other examples of semiconductor fabrication processes that may benefit from aspects of the present disclosure. The method is an example, and is not intended to limit the present disclosure beyond what is explicitly recited in the claims.

Operations for forming the semiconductor structure of the present embodiment are substantially the same as the operations for forming the semiconductor structure described in foregoing descriptions associated with FIGS. 5A-5C and 5G-5O and thus are not repeated herein for the sake of clarity. Therefore, reference may be made to the foregoing paragraphs for the related detailed descriptions, and are not described again herein. The difference between the present embodiment and the embodiment in FIGS. 5A-5O is that the semiconductor structure of the present embodiment omits the forming of the spacer layer 522.

Figure 6B:
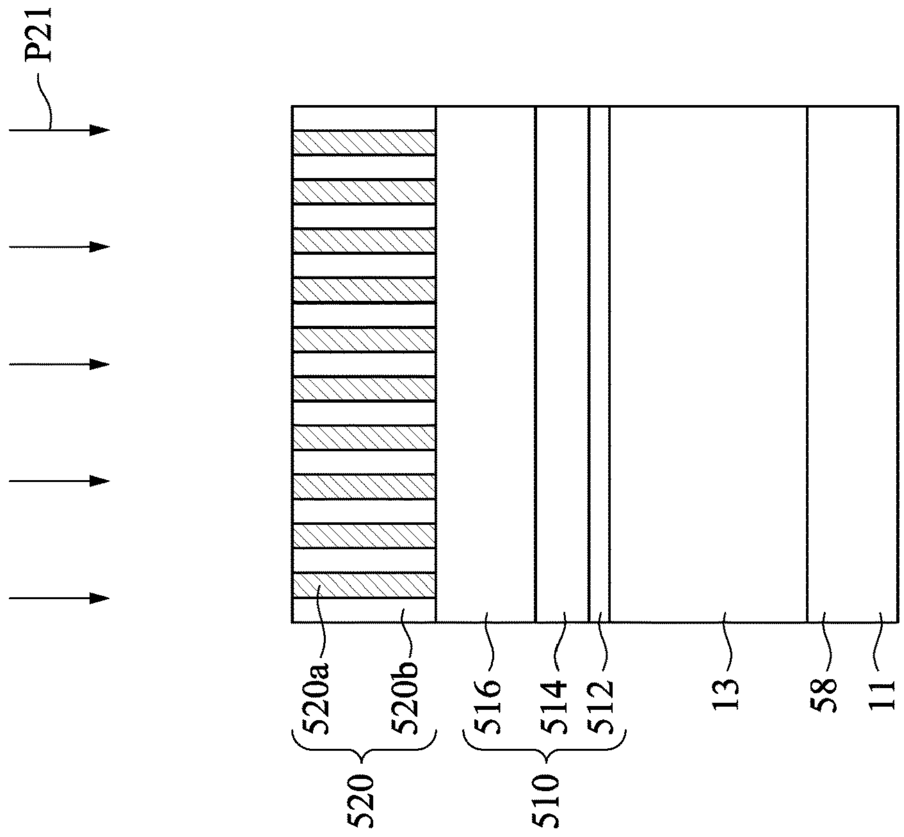
FIGS. 6A to 6D illustrate cross-sectional views of intermediate stages in the formation of gate structures of a semiconductor structure in accordance with some embodiments of the present disclosure.
Figure 6A:
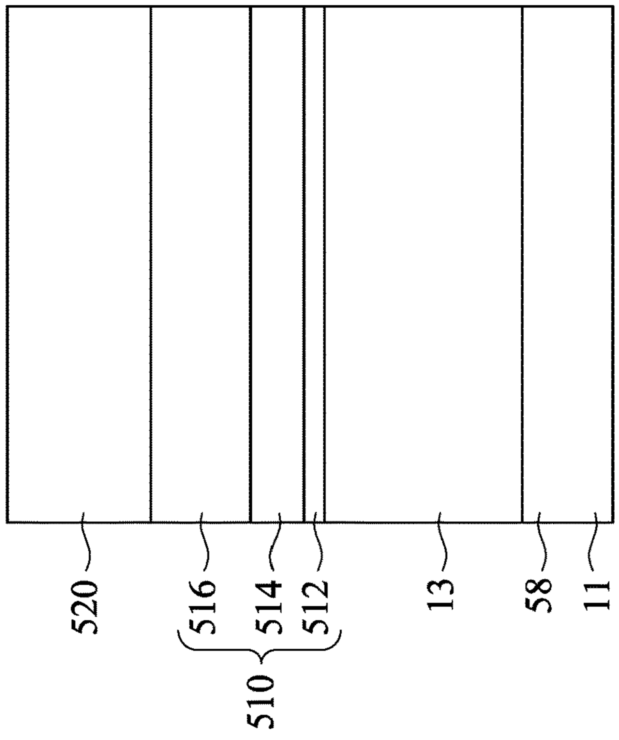
Figure 6D:
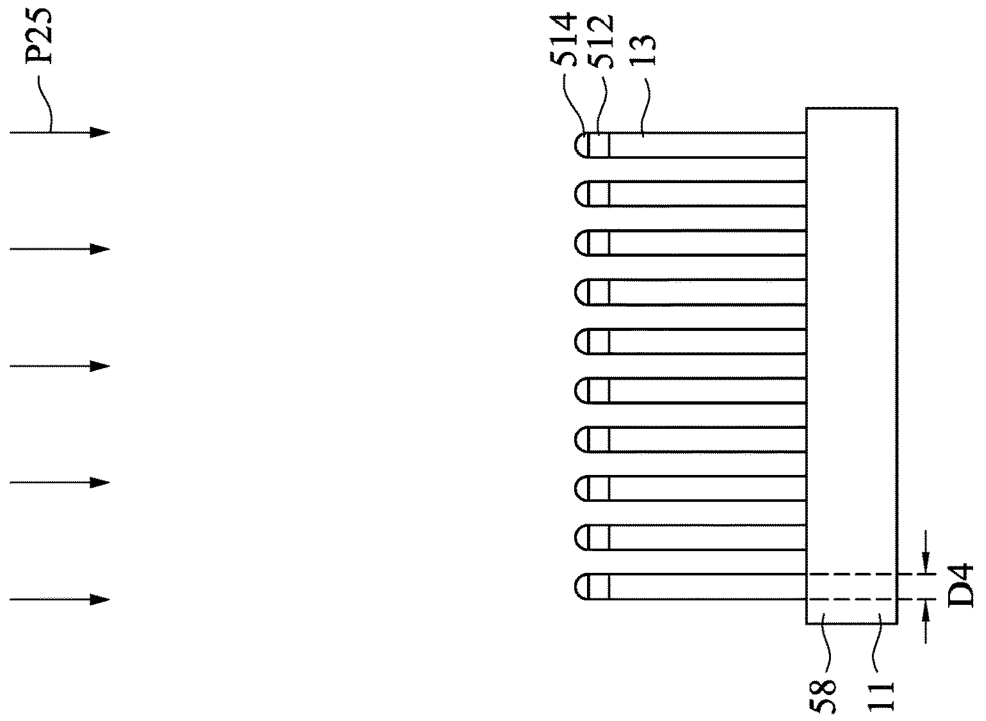
Figure 6C:
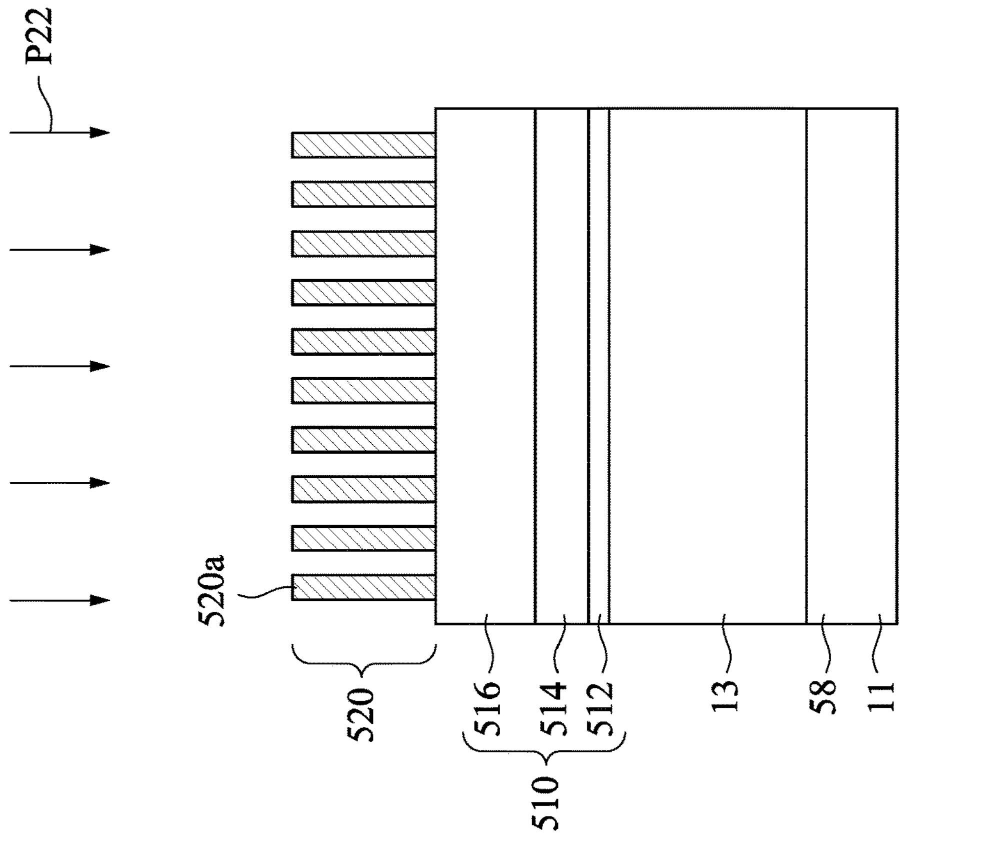

As shown in FIG. 6C, the exposed portions **520*a* of the photoresist layer 520 remain on the hard mask stack 510. As shown in FIG. 6D, one or more etching process P25 is performed to "open" the hard mask stack 510 by using the exposed portions 520*a* of the photoresist layer 520 as a mask. In other words, the hard mask stack 510 is patterned by using the photoresist layer 520. Subsequently, the patterned hard mask stack 510 may serve as a mask in the etching process on the dummy gate layer 13. In some embodiments, the etching process P25 may lead to a loss (i.e., the loss of the hard mask stack 510 and the exposed portions 520*a* of the photoresist layer 520). That is, the etching process P25 would consume the hard mask stack 510 and exposed portions 520*a* of the photoresist layer 520, and thus the hard mask stack 510 may be damaged as shown in FIG. 6D. Therefore, the dummy gate layer 13 is patterned into separated regions aligning with the hard mask stack 510 to have trenches 13*a* therein, since the hard mask stack 510 may serve as a mask during the etching process P25. In some embodiments, the dummy gate layer 13** may have a pattern having a lateral dimension D4 less than about 15 nm.

Reference is made to 7A to 7J. FIGS. 7A to 7J illustrate cross-sectional views of intermediate stages in the formation of active regions of a semiconductor structure in accordance with some embodiments of the present disclosure. FIGS. 7A to 7J illustrate an exemplary method in accordance with some embodiments. The method includes a relevant part of the entire manufacturing process. The method may be implemented, in whole or in part, by a system employing extreme ultraviolet (EUV) lithography and other appropriate lithography processes to improve pattern dimension accuracy. Additional operations can be provided before, during, and after the method, and some operations described can be replaced, eliminated, modified, moved around, or relocated for additional embodiments of the method. One of ordinary skill in the art may recognize other examples of semiconductor fabrication processes that may benefit from aspects of the present disclosure. The method is an example, and is not intended to limit the present disclosure beyond what is explicitly recited in the claims.

Figure 7B:
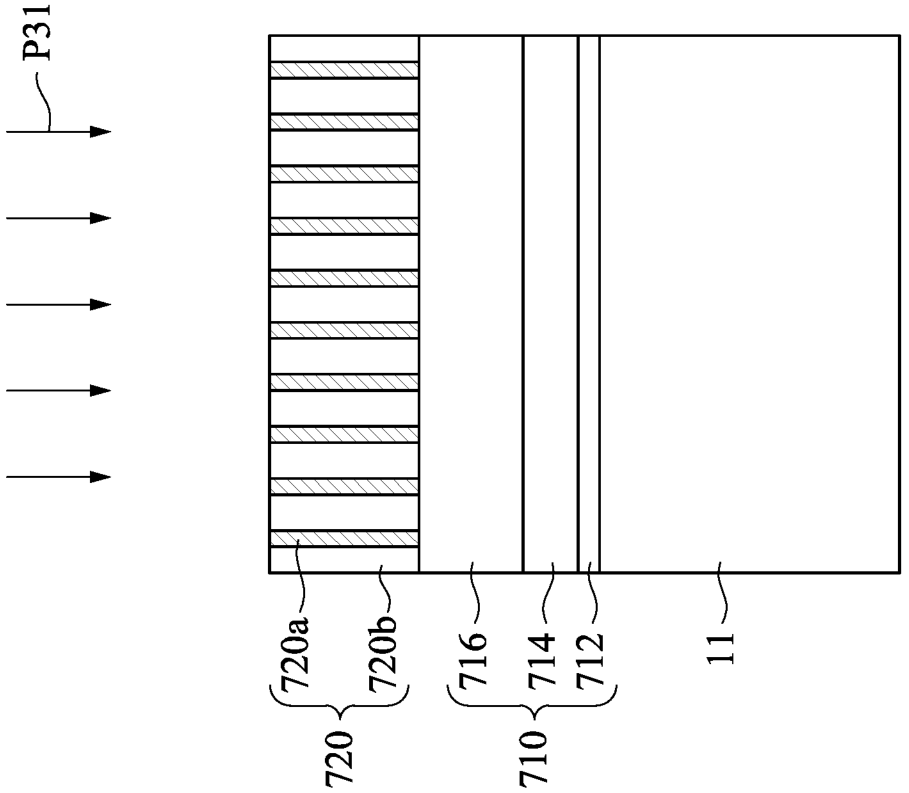
FIGS. 7A to 7J illustrate cross-sectional views of intermediate stages in the formation of active regions of a semiconductor structure in accordance with some embodiments of the present disclosure.
Figure 7A:
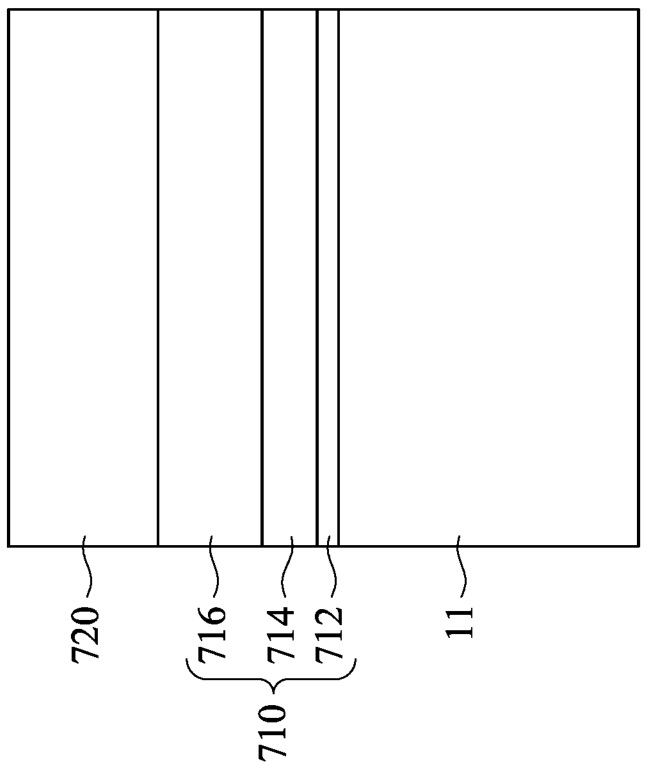

Reference is made to FIG. 7A. A tri-layer hard mask stack 710 including hard mask layers 712, 714, and 716 is formed over one of the substrate 11. Subsequently, a photoresist layer 720 is formed over hard mask layer 716. The photoresist layer 720 is sensitive to the light radiation of the lithography exposure process to be applied at later stage (see FIG. 7B), so as to have pattern thereon to pattern the underlying hard mask stack 710. The patterned hard mask stack 710 (see FIG. 7C) can be used as an etch mask to etch the underlying substrate 11 in subsequent processing. In some embodiments, the substrate 11 can be interchangeably referred to as a target layer.

In some embodiments, the hard mask layer 714 of the hard mask stack 710 may be made of a material that has a high etching selectivity relative to the underlying and overlying hard mask layers 712 and 716. For example, the etching selectivity, which is the ratio of the etching rate of hard mask layer 716 to the etching rate of the hard mask layer 714, is greater than about 10 when the hard mask layer 716 is etched, and the etching selectivity, which is the ratio of the etching rate of hard mask layer 714 to the etching rate of the hard mask layer 712, is greater than about 10 when the hard mask layer 714 is etched. In some embodiments, the hard mask layer 714 of the hard mask stack 710 may be made of a different material than the hard mask layers 712 and 716. In some embodiments, the hard mask layer 712 may be made of a same as the hard mask layer 716. In some embodiments, the hard mask layer 712 may be made of a different material than the hard mask layer 716. By way of example and not limitation, the hard mask layer 712 may be made of a dielectric material, such as SiO or SiN. The hard mask layer 714 may be made of metal nitride, such as TiN, or a metal oxide, such as TiO, ZrO, ZrTiO. In some embodiments, the hard mask layer 714 may be made of metal metal carbide, such as WdC. The hard mask layer 716 may be made of a dielectric material, such as SiO, SiN. In some embodiments, the hard mask layer 716 may be made of a metal oxide, such as TiO, ZrO, ZrTiO. In some embodiments, the hard mask layer 712, 714, and/or 716 of the hard mask stack 710 can be interchangeably referred to as a dielectric layer. In some embodiments, the hard mask layer 712, 714, and/or 716 of the hard mask stack 710 may be formed using, for example, CVD, ALD, spin-on-glass (SOG) or other suitable techniques. In some embodiments, the hard mask layer 712 may have a thinner thickness than the hard mask layer 714. The hard mask layer 714 may have a thinner thickness than the hard mask layer 716. The hard mask layer 712 may have a thinner thickness than the hard mask layer 716. By way of example and not limitation, the hard mask layer 712 may have a thickness ranging from about 5 nm to about 100 nm. The hard mask layer 714 may have a thickness ranging from about 5 nm to about 100 nm. The hard mask layer 716 may have a thickness ranging from about 5 nm to about 100 nm.

In some embodiments, the photoresist layer 720 is sensitive to EUV radiation. The photoresist layer 720 includes metal to increase the sensitivity of the photoresist layer, therefore being also referred to as metal-containing photoresist (MePR) layer. In some embodiments, the metal in the photoresist layer 720 has a sufficient concentration for EUV sensitivity, such as being greater than 5% (weight percentage) of the photoresist layer 720. The structure of the photoresist layer 720 may be in a proper form, such as metal-containing inorganic polymer, metal clusters, metal molecules, metal oxide chemical or a combination thereof. In some embodiments, the metal molecule may be a metal complex or metal compound. In some embodiments, the metal oxide chemical may be a chemical structure having metal oxide with outer organic ligand. In some embodiments, the metal cluster may be a chemical structure with multiple metal centers clustered together. The photoresist layer 720 may be made of a material that has a high etching selectivity relative to the underlying hard mask stack 710. For example, the etching selectivity, which is the ratio of the removing rate of the unexposed portion **720*b* (see FIG. 7B) of the photoresist layer 720 to the etching rate of the hard mask stack 710, is greater than about 10 when the unexposed portion 720*b* (see FIG. 7B) of the photoresist layer 720 is patterned. Throughout the description, the photoresist layer 720 can be interchangeably referred to as a mandrel layer or a sacrificial layer. In some embodiments, the photoresist layer 720 may be silicon-free. In some embodiments, the photoresist layer 720 may have a thicker thickness than the hard mask layer 712, 714, and/or 716. By way of example but not limiting the present disclosure, the photoresist layer 720 may have a thickness less than about 20 nm. Therefore, the photoresist layer 720** may be a thin film, which in turn reduces the risk of photoresist pattern collapse.

In some embodiments, the photoresist layer 720 may have a composition including an organometallic material, a solvent, photoactive compounds (PACs) (e.g., photoacid generators (PAG)), a quencher, a surfactant, a chromophore, counter ions, any suitable material, or combinations thereof. In some embodiments, the organometallic material of the photoresist layer 720 may include a metal core M and a plurality of organic ligands including a photo-cleavable ligand and a non-photo-cleavable ligand having a crosslinking group. During the exposure to actinic radiation, the metal core of the organometallic material absorbs actinic radiation and generates a radical through metal core-ligand bond cleavage from the photo-cleavable ligand. In some embodiments, more secondary electrons are generated by photo excitation of the organometallic than a non-metallic organic compound because the binding energy of the electrons for the metal is lower. In addition, the metal core-ligand bond is also cleavable by secondary electron excitation. Radicals generated from the metal core-ligand bond cleavage initiate and trigger polymerization when the non-cleavable ligand on the metal has specific functional groups that can react with the radicals in some embodiments. Photoradical-assisted self-polymerization occurs, and not only metal oxides, but also organic crosslink frameworks form, providing much higher contrast and enabling a lower exposure dose to be used to pattern the photoresist layer. In some embodiments, the organometallic material of the photoresist layer 720 may have the following chemical formulas, where M represents metal species, O represents oxygen, R1, R2, and R3 represent different organic functional groups, and n represents degree of polymerization, and the polymer may be included in one of the organic functional groups.

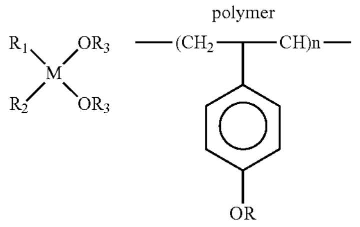

In some embodiments, the metal core M of the organometallic material in the photoresist layer 720 includes one or more metal elements. In some embodiments, the one or more metal elements may be selected from the group consisting of Hf, Sn, Zr, Ti, Cr, W, Mo, Fe, Ru, Os, Co, Ru, Rh, Ir, Ni, Pd, Pt, Cu, Ag, Au, Zn, Cd, Al, Ga, Fe, Ti, Ge, Sn, Pb, Sb, and Bi. In some embodiments, the metal element of the photoresist layer 720 may be a same metal element (e.g., Sn, Zr) as the fuel droplet 120 (see FIG. 1) that is for creating the EUV radiation 116. By way of example and not limitation, the organometallic material of the photoresist layer 720 can be denoted as $SnO_xC_yH_z$ or $ZrO_xC_yH_z$.

In some embodiments, the photo-cleavable ligand of the organometallic material in the photoresist layer 720 is an aliphatic or aromatic, cyclic or non-cyclic C1-C30 group, wherein the C1-C30 group is unsubstituted or substituted with one or more selected from the group consisting of —I, —Br, —Cl, —F, —NH2, —COOH, —OH, —SH, —N3, —S(═O)—, an alkene group, an alkyne group, an imine group, an ether group, an ester group, an aldehyde group, a ketone group, an amide group, a sulfone group, an acetic acid group, a cyanide group, an allene group, an alcohol group, a diol group, an amine group, a phosphine group, a phosphite group, an aniline group, a pyridine group, and a pyrrole group. In some embodiments, the metal core-photo-cleavable ligand bond has sp3 characteristics and forms a stable radical. When a stable radical can be formed, the metal core-photo-cleavable ligand bond is photocleavable. On the other hand, if the photo-cleavable ligand includes strong electron withdrawing groups, the photo-cleavable ligand may not form a stable radical, and the etal core-photo-cleavable ligand bond may not be photocleavable.

In some embodiments, the non-photo-cleavable ligand of the organometallic material in the photoresist layer 720 is different from the photo-cleavable ligand. In some embodiments, the non-photo-cleavable ligand is an aliphatic or aromatic, cyclic or non-cyclic C2-C30 group, wherein the C2-C30 group is unsubstituted or substituted with one or more selected from the group consisting of —I, —Br, —Cl, —F, —NH2, —COOH, —OH, —SH, —N3, —S(═O)—, an alkene group, an alkyne group, an imine group, an ether group, an ester group, an aldehyde group, a ketone group, an amide group, a sulfone group, an acetic acid group, a cyanide group, an allene group, an alcohol group, a diol group, an amine group, a phosphine group, a phosphite group, an aniline group, a pyridine group, and a pyrrole group. In some embodiments, the metal core-non-photo-cleavable ligand bond has sp2 characteristics and does form a stable radical. When a stable radical cannot be formed, the metal core-non-photo-cleavable ligand bond is not photo-cleavable.

In some embodiments, the organometallic material of the photoresist layer 720 may further include a ligand different than the photo-cleavable ligand and non-photo-cleavable ligand. The ligand may include C3-C12 aliphatic or aromatic groups in some embodiments. The aliphatic or aromatic groups may be unbranched or branched with cyclic, or noncyclic saturated pendant groups containing 1-9 carbons, including alkyl groups, alkenyl groups, and phenyl groups. The branched groups may be further substituted with oxygen or halogen. In some embodiments, the C3-C12 aliphatic or aromatic groups include heterocyclic groups. In some embodiments, the C3-C12 aliphatic or aromatic groups are attached to the metal by an ether or ester linkage. In some embodiments, the ligand may include branched or unbranched, cyclic or non-cyclic, saturated organic groups, including C1-C7 alkyl groups or C1-C7 fluoroalkyl groups. In some embodiments, the C1-C7 alkyl groups or C1-C7 fluoroalkyl groups include one or more substituents selected from the group consisting of —CF3, —SH, —OH, ═O, —S—, —P—, —PO2, —C(═O)SH, —COOH, —C(═O)O—, —O—, —N—C(═O)NH, —SO2OH, —SO2SH, —SOH, and —SO2-. In some embodiments, the ligand may include one or more substituents selected from the group consisting of —CF3, —OH, —SH, and —COOH substituents.

In some embodiments, the solvent of the photoresist layer 720 may include propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (AMC), n-butyl acetate (nBA), and 2-heptanone (MAK), any suitable solvent, or combinations thereof.

In some embodiments, the photoactive compounds (PACs) of the photoresist layer 720 along with any desired additives or other agents, are added to the solvent for application. Once added, the mixture is then mixed in order to achieve a homogenous composition throughout the photoresist composition to ensure that there are no defects caused by uneven mixing or nonhomogenous composition of the photoresist. Once mixed together, the photoresist may either be stored prior to its usage or used immediately. The PACs are photoactive components, such as photoacid generators (PAG), free-radical generators, photobase (PBG) generators, photo decomposable bases (PDB), or the like. The PACs may be positive-acting or negative-acting. In some embodiments, the photoacid generator (PAG) of the photoresist layer 720 may have the following chemical formulas, where S represents sulfur, F represents fluorine, and N represents nitrogen.

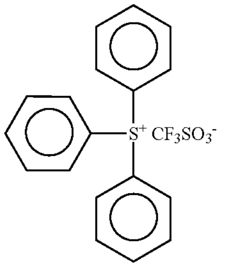

In some embodiments, the photoacid generators of the photoactive compounds of the photoresist layer 720 may include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like. In some embodiments, specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments, the free-radical generator of the photoactive compounds of the photoresist layer 720 may include photoinitiators, including n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

In some embodiments, the photobase generators of the photoactive compounds of the photoresist layer 720 may include quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl)cyclic amines, combinations of these, or the like. In some embodiments, the photo decomposable base of the photoactive compounds of the photoresist layer 720 may include triphenylsulfonium hydroxide, triphenylsulfonium antimony hexafluoride, and triphenylsulfonium trifyl. As one of ordinary skill in the art will recognize, the chemical compounds listed herein are merely intended as illustrated examples of the photoactive compounds and are not intended to limit the embodiments to only those of the photoactive compounds specifically described. Rather, any suitable photoactive compounds may be used, and all such PACs are fully intended to be included within the scope of the present embodiments.

In some embodiments, the quencher of the photoresist layer 720 can be used to inhibit diffusion of the generated acids/bases/free radicals within the photoresist. The quencher may improve the resist pattern configuration as well as the stability of the photoresist over time. In some embodiments, the quencher is an amine, such as a second lower aliphatic amine, a tertiary lower aliphatic amine, or the like. Specific examples of amines include trimethylamine, diethylamine, triethylamine, di-n-propylamine, tri-n-propylamine, tripentylamine, diethanolamine, and triethanolamine, alkanolamine, combinations thereof, or the like.

In some embodiments, an organic acid is used as the quencher. Specific embodiments of organic acids include malonic acid, citric acid, malic acid, succinic acid, benzoic acid, salicylic acid; phosphorous oxo acid and its derivatives, such as phosphoric acid and derivatives thereof such as its esters, phosphoric acid di-n-butyl ester and phosphoric acid diphenyl ester; phosphonic acid and derivatives thereof, including its ester, such as phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof, including its esters, such as phenylphosphinic acid. In some embodiments, the quencher of the photoresist layer 720 may have the following chemical formulas, where R4 represent an organic functional group.

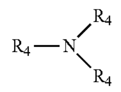

In some embodiments, the depositing of the photoresist layer 720 may include mixing the organometallic compound with a solvent, coating the substrate with the organometallic compound/solvent mixture and then subsequently drying the photoresist such as by heating, to remove the solvent. In some embodiments, forming the photoresist layer 720 may be performed by as a spin-on coating process, a dip coating method, an air-knife coating method, a curtain coating method, a wire-bar coating method, a gravure coating method, a lamination method, an extrusion coating method, combinations of these, or the like.

In some embodiments, forming the photoresist layer 720 may be performed by a vapor phase deposition operation. In some embodiments, the vapor phase deposition process may include atomic layer deposition (ALD) process or chemical vapor deposition (CVD) process. In some embodiments, the ALD process may include plasma-enhanced atomic layer deposition (PE-ALD) process, and the CVD process may include plasma-enhanced chemical vapor deposition (PE-CVD) process, metal-organic chemical vapor deposition (MO-CVD) process, atmospheric pressure chemical vapor deposition (AP-CVD) process, and low pressure chemical vapor deposition (LP-CVD) process. In some embodiments, the organometallic material is composed of one or more precursors. In some embodiments, the one or more precursors are reacted in a deposition chamber to form the organometallic material. In some embodiments, depositing the photoresist layer includes combining the first compound or first precursor and the second compound or second precursor in a vapor state to form the photoresist composition. In some embodiments, only one photoresist compound or precursor is introduced into the deposition chamber. In some embodiments, the first compound or first precursor and the second compound or second precursor of the photoresist composition are introduced into a deposition chamber (e.g., CVD chamber) at about the same time via the inlets. In some embodiments, the first compound or first precursor and second compound or second precursor are introduced into a deposition chamber (e.g. ALD chamber) in an alternating manner. In some embodiments, the first and second compounds or precursors are delivered into the deposition chamber with a carrier gas. The carrier gas, a purge gas, a deposition gas, or other process gas may contain nitrogen, hydrogen, argon, neon, helium, or combinations thereof.

Reference is made to FIG. 7B. An exposure process P31 to the photoresist layer 720 utilizing the EUV radiation 116 (see FIG. 1) from the EUV lithography system 10, thereby forming a latent pattern of the photoresist layer 320 including exposed portions 720*a* and unexposed portions 720*b*. In some embodiments, the EUV radiation 116 is directed to the photoresist layer 720 on the wafer W1 to form an image of a circuit pattern defined on a photomask (such as a reflective mask) in a proper exposure mode such as step-and-scan. Various resolution enhancement techniques, such as phase-shifting, off-axis illumination (OAI) and/or optical proximity correction (OPC), may be used or implemented through the photomask or the exposure process. For examples, the OPC features may be incorporated into the circuit pattern on the photomask. In some embodiments, the photomask is a phase-shift mask, such as an alternative phase-shift mask, an attenuated phase-shift mask, or a chrome-less phase-shift mask. In some embodiments, the exposure process is implemented in an off-axis illumination mode. In some embodiments, the EUV radiation 116 is directly modulated with a predefined pattern (such as an IC layout) without using a photomask (such as using a digital pattern generator or direct-write mode).

The exposed portions 720*a* of the photoresist layer 720 exposed to the EUV radiation 116 (see FIG. 1) undergoes a chemical reaction thereby changing its solubility in a subsequently applied developer relative to the unexposed portions 720*b* of the photoresist layer 720 not exposed to the EUV radiation 116. In some embodiments, the exposed portions 720*a* of the photoresist layer 720 undergo a crosslinking reaction.

A reaction of a photoresist composition including the organometallic material of the photoresist layer 720 undergoes when exposed to actinic radiation. The organometallic material, including the metal core M, a photo-cleavable ligand, and a non-photo-cleavable ligand having a crosslinking group, is exposed to actinic radiation, such as the EUV radiation 116 (see FIG. 1). The photo-cleavable ligand is converted to a radical upon the absorption of actinic radiation. The radical of the photo-cleavable ligand is subsequently cleaved from the metal core and the radical of the photo-cleavable ligand interacts with the non-photo-cleavable ligand to activate the non-photo-cleavable ligand. In some embodiments, the radical of the photo-cleavable ligand introduces a double bond into the non-photo-cleavable ligand. The metal core reacts with ambient water or oxygen to form a metal oxide or metal hydroxide. The radical activated non-photo-cleavable ligand crosslinks with other non-photo-cleavable ligand and metal hydroxide groups react in a condensation reaction to form a crosslinked metal oxide and organic framework.

By way of example and not limitation, the organometallic material of the photoresist layer 720 can have tin (Sn) as the metal core M. The organometallic tin compound has a first photo-cleavable ligand, e.g.—an alkyl group, and a second ligand having a crosslinking group, e.g.—a styrene group is exposed to actinic radiation hv. The exposure to actinic radiation cleaves the alkyl group from the tin atom forming a radical. The radical organometallic tin compound reacts with ambient water and the cleaved radical alkyl group reacts with the crosslinking group on the second ligand activating (e.g.—forming a radical) the second ligand (e.g.—forming a radical). Tin hydroxide groups on one organometallic compound subsequently react with tin hydroxide groups on another organometallic compound in a condensation reaction, while the activated second ligand reacts with another second Ligand on another organometallic compound in a polymerization reaction. Thus, the organometallic tin compound undergoes both an inorganic crosslinking (a condensation reaction) and an organic crosslinking via the C═C double bonds on the crosslinking groups in some embodiments.

Subsequently, the photoresist layer 720 may undergo a heating or a post-exposure bake (PEB) in a thermal chamber. In some embodiments, the photoresist layer 720 is heated at a temperature in a range from about 50° C. to about 250° C., such as about 50, 75, 100, 125, 150, 175, 200, 225, or 250° C. In some embodiments, the post-exposure bake may be performed in a time duration in a range from about 20 seconds to about 300 seconds, such as 20, 75, 50, 75, 100, 125, 150, 175, 200, 225, 250, 275, or 300 seconds. In some embodiments, the post-exposure baking can cause the photoresist composition in the photoresist layer 720 that was exposed to the EUV radiation 116 (see FIG. 1) to further crosslink.

Figure 7D:
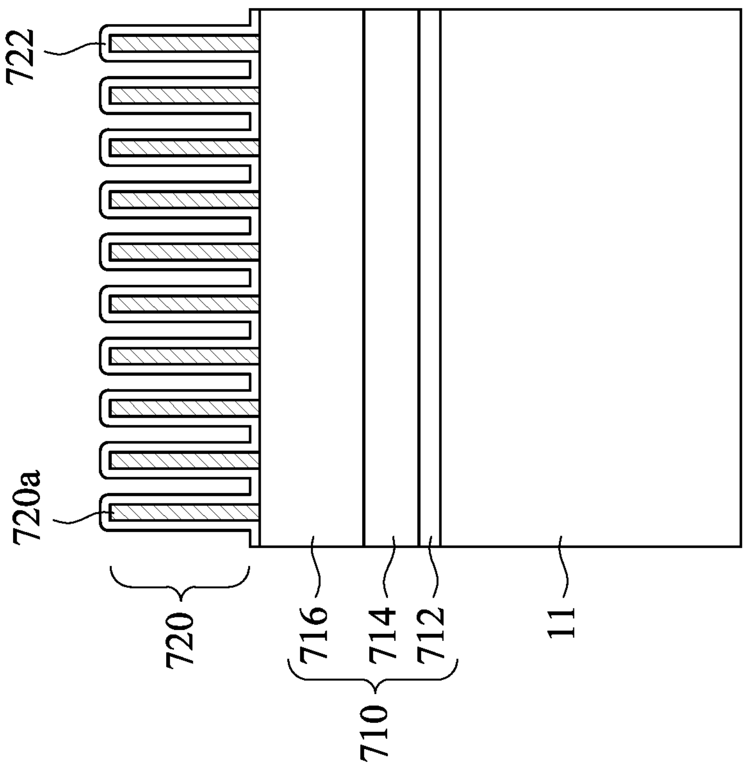
Figure 7C:
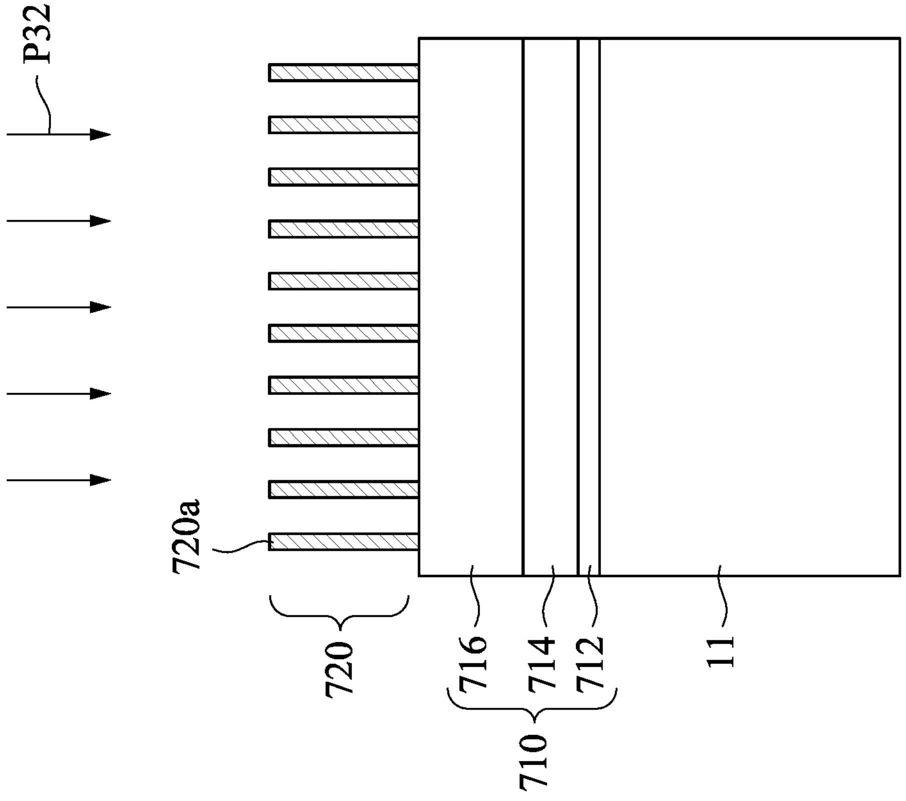

Reference is made to FIG. 7C. A developing process P32 is performed on the photoresist layer 720 to pattern the photoresist layer 720. The photoresist layer 720 can be positive tone resists or negative tone resists. A positive tone resist refers to a photoresist material that when exposed to radiation becomes removable under the developing process P32, while the region of the photoresist that is non-exposed (or exposed less) is non-removable under the developing process P32. A negative tone resist, on the other hand, refers to a photoresist material that when exposed to radiation becomes non-removable under the developing process P32, while the region of the photoresist that is non-exposed (or exposed less) is removable under the developing process P32.

In some embodiments, the photoresist layer 720 is a negative-tone photoresist and the exposed portions 720*a* of the photoresist layer 720 experience crosslinking and polymerization, therefore remain after the developing process P32. The unexposed portions 720*b* of the photoresist layer 720 are removed by the developing process P32 to expose the underlying mask stack 710. In some embodiments, the photoresist layer 720 can be interchangeably referred to as a negative tone developed (NTD) resist.

In some embodiments, the developing process P32 can be an anisotropic etching process. In some embodiments, the developing process P32 can be a dry etching process, such as plasma etching process. The plasma etching process may be performed by plasma processing apparatus 5 as shown in FIG. 3J, such as an inductively coupled plasma (ICP) apparatus, a capacitively coupled plasma (CCP) apparatus, or a micro wave apparatus. The etchant ions in the plasma processing apparatus 5 bombard the surface of the wafer W1 to remove the unexposed portion 720*b* (see FIG. 5B) of the photoresist layer 720. A bias etching can be provided by the plasma source 26 (see FIG. 3J) with turning on the RF power source 28 (see FIG. 3J) during the bias etching step.

In some embodiments, the bias power of the developing process P32 may be performed at a source frequency in a range from about 13.56 MHz to about 2.45 GHz. In some embodiments, the source power of the developing process P32 may be in a range from about 50 W to about 2000 W, such as 100, 500, 1000, 1500, or 2000 W. If the bias power is higher than about 2000 W, the plasma might result in unwanted etch rate to the exposed portions 720*a* of the photoresist layer 720. In some embodiments, the developing process P32 may use a gas mixture including, such as HBr, with the bias. In some embodiments, the developing process P32 may be performed under a pressure in a range from about 3 to 100 mTorr, such as about 3, 10, 20, 30, 40, 50, 60, 70, 80, 90, or 100 mTorr. In some embodiments, the developing process P32 may be performed at a temperature in a range from about −140 to about 100° C., such as about −140, −120, −100, −80, −60, −40, −20, 0, 20, 40, 60, 80, or 100° C.

Reference is made to FIG. 7D. A spacer layer 722 is formed over the photoresist layer 720 and the hard mask stack 710. In some embodiments, the spacer layer 722 may be made of SiO, SiN, or a metal oxide (e.g., TiO). In some embodiments, the spacer layer 722 is conformal, and is formed by a conformal deposition method such as an ALD process. Other suitable deposition methods, such as chemical vapor deposition (CVD) process, Plasma enhanced atom layer deposition (PEALD), PVD process, may also be used. In some embodiments, the thickness of the spacer layer 722 may be in a range from about 5 nm to about 22 nm, in an embodiment, although other dimensions are also possible. In some embodiments, the thickness of spacer layer 722 is determined by the semiconductor process nodes used. For example, spacer layer 722 may be about 10 nm thick for one semiconductor process node, and may be about 14 nm thick for another semiconductor process node.

Figure 7F:
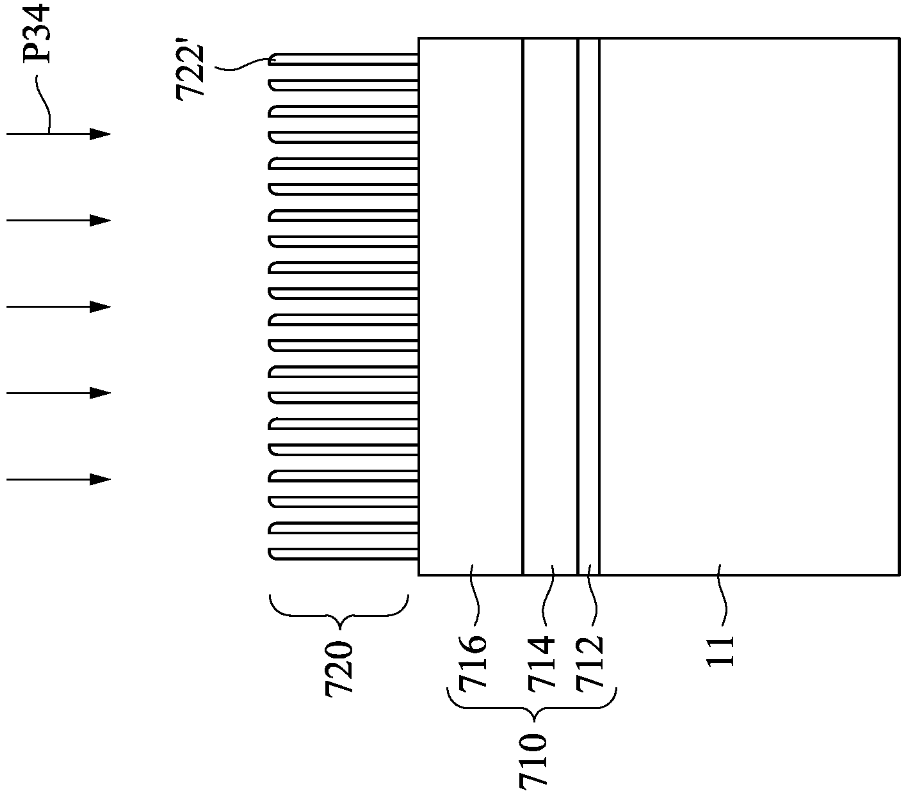
Figure 7E:
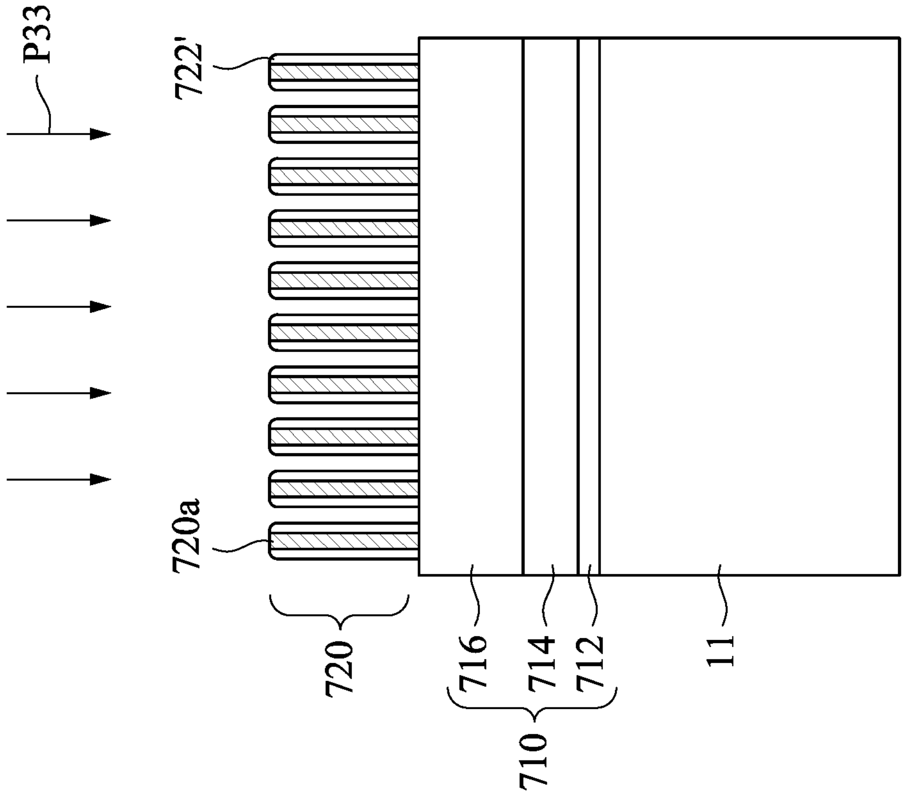

Reference is made to FIG. 7E. The spacer 722' may be formed by performing an etching process P33 such as anisotropic etching to remove horizontal portions of the spacer layer 722. The remaining portions of the spacer layer 722 on sidewalls of the photoresist layer 720 can serve as the spacer 722'. In some embodiments, the etching process can be a dry etching process, such as plasma etching process by using, such as an inductively coupled plasma (ICP) apparatus, a capacitively coupled plasma (CCP) apparatus, or a micro wave apparatus. In some embodiments, the bias power of the plasma etching process on the spacer layer 722 may be performed at a source RF frequency in a range from about 13.56 MHz to about 2.45 GHz. In some embodiments, the etching process P33 may use a gas mixture including, such as $Cl_2$, $BCl_3$, with the bias. In some embodiments, the source power of the plasma etching process on the spacer layer 722 may be in a range from about 50 W to about 2000 W, such as 100, 500, 1000, 1500, or 2000 W. If the source power is higher than about 2000 W, the plasma might result in unwanted etch rate to the vertical portions of the spacer layer 722. In some embodiments, the plasma etching process on the spacer layer 722 may be performed under a pressure in a range from about 3 to 100 mTorr, such as about 3, 10, 20, 30, 40, 50, 60, 70, 80, 90, or 100 mTorr. In some embodiments, the plasma etching process on the spacer layer 722 may be performed at a temperature in a range from about −140 to about 100° C., such as about −140, −120, −100, −80, −60, −40, −20, 0, 20, 40, 60, 80, or 100° C.

Reference is made to FIG. 7F. The photoresist layer 720 is removed from the hard mask stack 710. The removal of the photoresist layer 720 provides a pattern of spacer elements. In some embodiments, the photoresist layer 320 may be removed by an anisotropic etching process. For example, the photoresist layer 320 may be removed by a dry etching process P34, such as plasma etching process, by using, such as an inductively coupled plasma (ICP) apparatus, a capacitively coupled plasma (CCP) apparatus, or a micro wave apparatus. In some embodiments, the bias power of the etching process P24 on the photoresist layer 720 may be performed at a source RF frequency in a range from about 13.56 MHz to about 2.45 GHz. In some embodiments, the etching process P24 on the photoresist layer 720 may use a gas mixture including, such as HBr, with the bias. In some embodiments, the source power of the etching process P34 on the photoresist layer 720 may be in a range from about 50 W to about 2000 W, such as 100, 500, 1000, 1500, or 2000 W. If the bias power is higher than about 2000 W, the plasma might result in unwanted etch rate to the spacer 722'. In some embodiments, the etching process P24 on the photoresist layer 720 may be performed under a pressure in a range from about 3 to 100 mTorr, such as about 3, 10, 20, 30, 40, 50, 60, 70, 80, 90, or 100 mTorr. In some embodiments, the etching process P24 on the photoresist layer 320 may be performed at a temperature in a range from about −140 to about 100° C., such as about −140, −120, −100, −80, −60, −40, −20, 0, 20, 40, 60, 80, or 100° C.

Figure 7G:
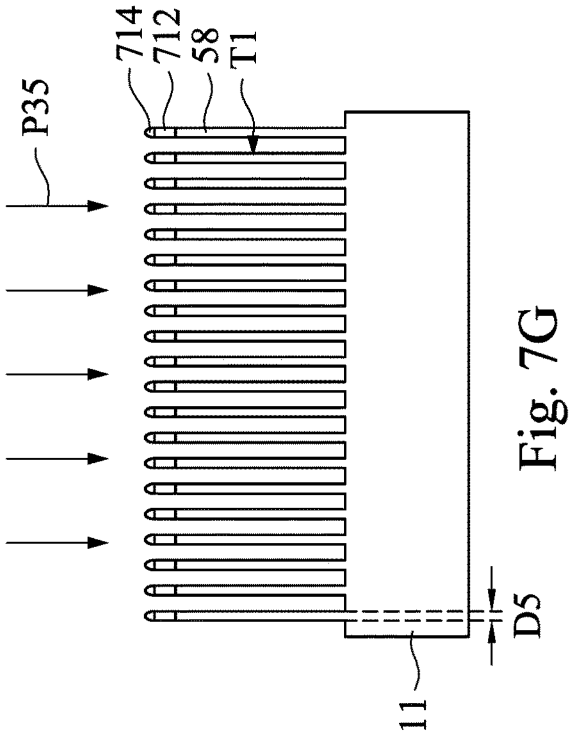

Reference is made to FIG. 7G. One or more etching process P35 is performed to "open" the hard mask stack 710. In other words, the hard mask stack 710 is patterned. The patterned hard mask stack 710 may serve as a mask in the etching process on the substrate 11. In some embodiments, the etching process P35 may lead to a loss (i.e., the loss of the hard mask stack 710 and the spacer 722'). That is, the etching process P35 would consume the hard mask stack 710 and the spacer 722', and thus the hard mask stack 710 may be damaged as shown in FIG. 7G. Subsequently, the substrate 11 is patterned into separated regions aligning with the hard mask stack 710 to have trenches T1 therein, since the hard mask stack 710 may serve as a mask during the etching process P35. Portions of the substrate 11 between the neighboring trenches T1 can be referred to as the semiconductor fin 58. In some embodiments, the semiconductor fin 58 may have a lateral dimension D5 less than about 15 nm.

In some embodiments, the etching process P35 may be a dry etching process, such as plasma etching process, by using, such as an inductively coupled plasma (ICP) apparatus, a capacitively coupled plasma (CCP) apparatus, or a micro wave apparatus. In some embodiments, the bias power of the etching process P35 may be performed at a source RF frequency in a range from about 13.56 MHz to about 2.45 GHz. In some embodiments, the etching process P35 may use a gas mixture including, such as $C_4F_6$, $C_4F_8$, $H_2$, $O_2$, $CF_4$, $NF_3$, $Cl_2$, HBr with the bias. In some embodiments, the bias power of the etching process P35 may be in a range from about 50 W to about 2000 W, such as 100, 500, 1000, 1500, or 2000 W. If the source power is higher than about 2000 W, the plasma might result in unwanted damage to the spacer 322'. In some embodiments, the etching process P35 may be performed under a pressure in a range from about 3 to 100 mTorr, such as about 3, 10, 20, 30, 40, 50, 60, 70, 80, 90, or 100 mTorr. In some embodiments, the etching process P35 may be performed at a temperature in a range from about −140 to about 100° C., such as about −140, −120, −100, −80, −60, −40, −20, 0, 20, 40, 60, 80, or 100° C. In some embodiments, after the etching process P35, the hard mask stack 710 can be removed by, such as an ashing process. By way of example and not limitation, the ashing processes may be plasma process that form plasma having a monatomic reactive species (e.g., such as oxygen or fluorine), which combines with the hard mask stack 710 to form an ash that is evacuated from a processing chamber.

Figure 7H:
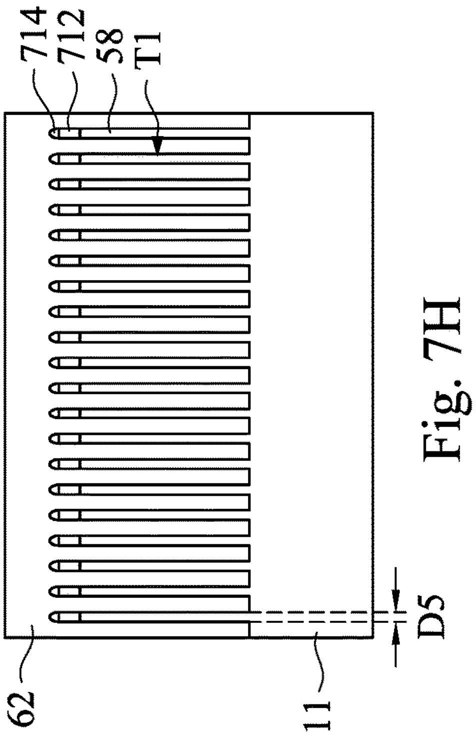

Reference is made to FIG. 7H. A dielectric layer 62 is formed to overfill the trenches Ti and cover the semiconductor fins 58. The dielectric layer 62 in the trenches T1 can be referred to as a shallow trench isolation (STI) structure. In some embodiments, the dielectric layer 62 may be made of low-K dielectric materials. By way of example but not limiting the present disclosure, the dielectric layer 62 may be made of silicon oxide, silicon nitride, silicon oxynitride, fluoride-doped silicate glass (FSG), silicon carbide, silicon nitride, the like, or a combination thereof. In some embodiments, the dielectric layer 62 may be formed using flowable chemical vapor deposition (FCVD), spin-on coating, CVD, ALD, high-density plasma chemical vapor deposition (HDPCVD), LPCVD, the like, or a combination thereof. In some embodiments where FCVD is used to form the dielectric layer 62, a silicon- and nitrogen-containing precursor (for example, trisilylamine (TSA) or disilylamine (DSA)) is used, and hence the resulting dielectric layer 62 is flowable (jelly-like). In some embodiments, the dielectric layer 62 is formed using an alkylamino silane based precursor. During the deposition of the dielectric layer 62, plasma is turned on to activate the gaseous precursors for forming the flowable oxide. In some embodiments, the dielectric layer 62 may be formed using silane ($SiH_4$) and oxygen ($O_2$) as reacting precursors. In some embodiments, the dielectric layer 62 may be formed using a sub-atmospheric CVD (SACVD) process or high aspect-ratio process (HARP), in which process gases may include tetraethylorthosilicate (TEOS) and ozone ($O_3$). In some embodiments, the dielectric layer 62 may be formed using a spin-on-dielectric (SOD) process, such as hydrogen silsesquioxane (HSQ) or methyl silsesquioxane (MSQ). Other processes and materials may be used. In some embodiments, the dielectric layer 62 can be interchangeably referred to a flowable oxide, a dielectric material, or cured flowable oxide material.

Figure 7I:
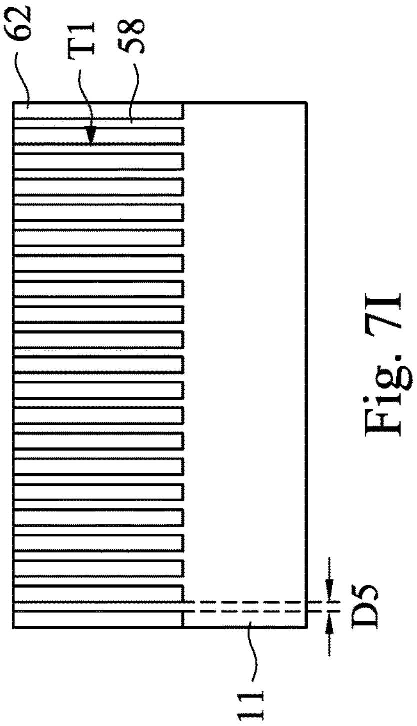

Reference is made to FIG. 7I. A planarization process such as chemical mechanical polish (CMP) is performed to remove the excess dielectric layer 62 over the semiconductor fins 58. In some embodiments, the planarization process may also remove the hard mask stack 710 such that top surfaces of the semiconductor fins 58 are exposed. In some embodiments, the planarization process stops when the hard mask stack 710 is exposed. In such embodiments, the hard mask stack 710 may act as the CMP stop layer in the planarization.

Figure 7J:
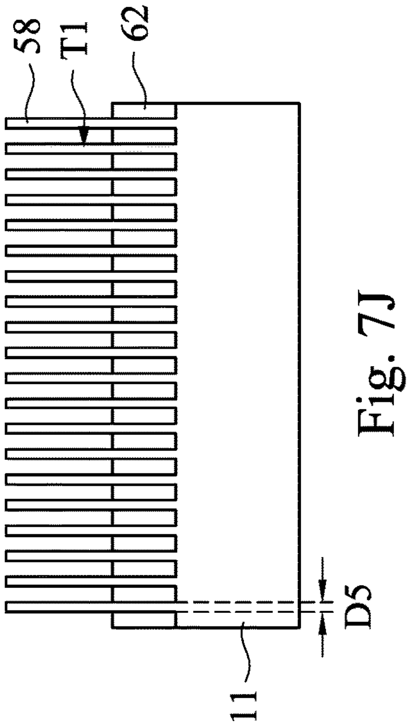

Reference is made to FIG. 7J. The dielectric layer 62 is recessed, for example, through an etching operation, in which diluted HF, SiCoNi (including HF and $NH_3$), or the like, may be used as the etchant. After recessing the dielectric layer 62, portions of the semiconductor fins 58 are higher than top surfaces of the dielectric layer 62. It is understood that the processes described above are merely an example of how the semiconductor fins 58 and the dielectric layer 62 are formed. In some embodiments, a dielectric layer can be formed over a top surface of the substrate 11; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fin. For example, the semiconductor fins 58 can be recessed, and a material different from the recessed semiconductor fins 58 is epitaxially grown in its place. In even further embodiments, a dielectric layer can be formed over a top surface of the substrate 11; trenches can be etched through the dielectric layer; heteroepitaxial structures can be epitaxially grown in the trenches using a material different from the substrate 11; and the dielectric layer can be recessed such that the heteroepitaxial structures protrude from the dielectric layer to form fins. In some embodiments where homoepitaxial or heteroepitaxial structures are epitaxially grown, the grown materials may be in-situ doped during growth, which may obviate prior implanting of the fins although in-situ and implantation doping may be used together. In some embodiments, the semiconductor fins 58 may include silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, or the like.

Reference is made to FIGS. 8A to 8D. FIGS. 8A to 8D illustrate cross-sectional views of intermediate stages in the formation of active regions of a semiconductor structure in accordance with some embodiments of the present disclosure. FIGS. 8A to 8D illustrate an exemplary method in accordance with some embodiments. The method includes a relevant part of the entire manufacturing process. The method may be implemented, in whole or in part, by a system employing extreme ultraviolet (EUV) lithography and other appropriate lithography processes to improve pattern dimension accuracy. Additional operations can be provided before, during, and after the method, and some operations described can be replaced, eliminated, modified, moved around, or relocated for additional embodiments of the method. One of ordinary skill in the art may recognize other examples of semiconductor fabrication processes that may benefit from aspects of the present disclosure. The method is an example, and is not intended to limit the present disclosure beyond what is explicitly recited in the claims.

Operations for forming the semiconductor structure of the present embodiment are substantially the same as the operations for forming the semiconductor structure described in foregoing descriptions associated with FIGS. 7A-7C and 7G-7J and thus are not repeated herein for the sake of clarity. Therefore, reference may be made to the foregoing paragraphs for the related detailed descriptions, and are not described again herein. The difference between the present embodiment and the embodiment in FIGS. 7A-7J is that the semiconductor structure of the present embodiment omits the forming of the spacer layer 722.

Figure 8B:
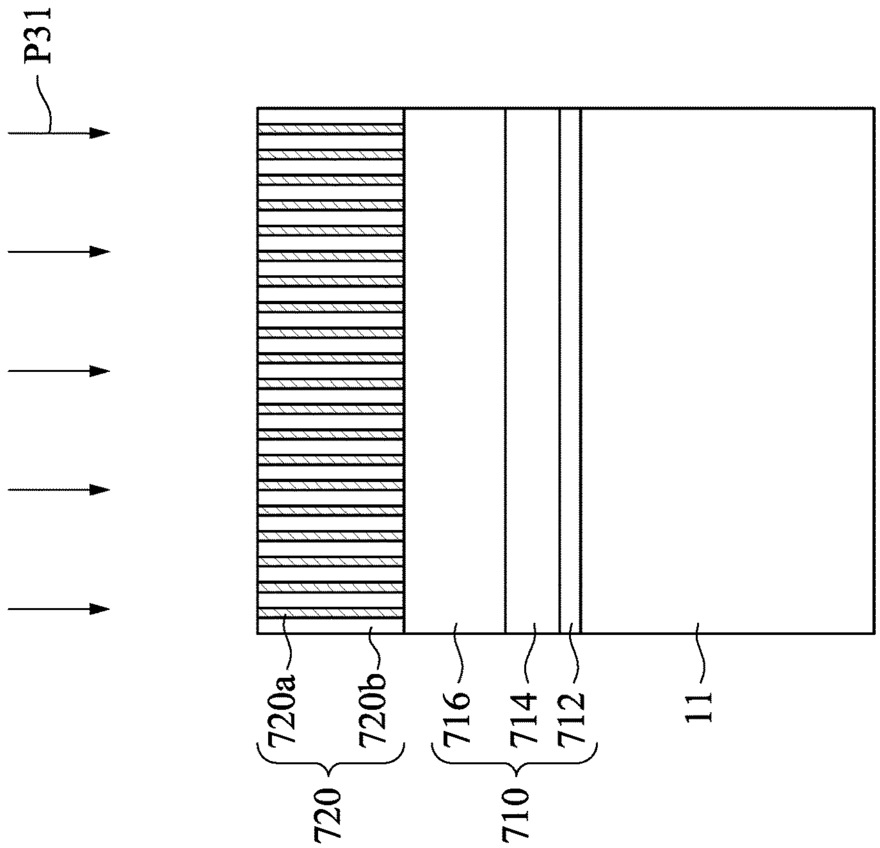
FIGS. 8A to 8D illustrate cross-sectional views of intermediate stages in the formation of active regions of a semiconductor structure in accordance with some embodiments of the present disclosure.
Figure 8A:
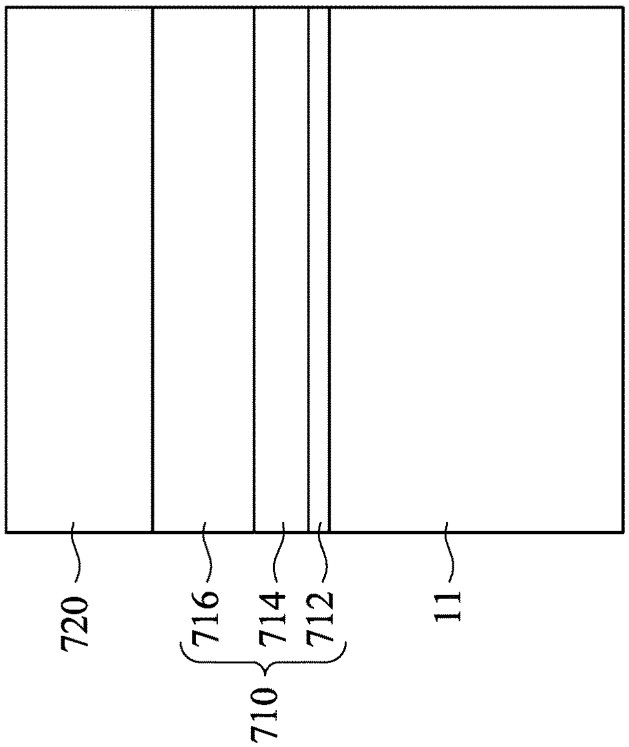
Figure 8D:
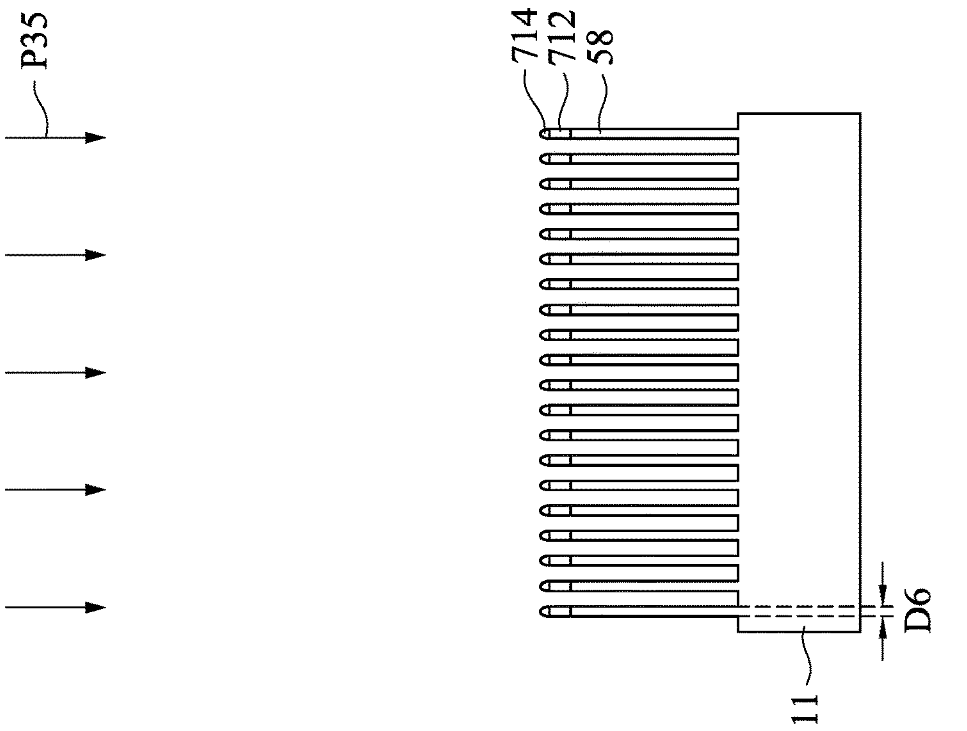
Figure 8C:
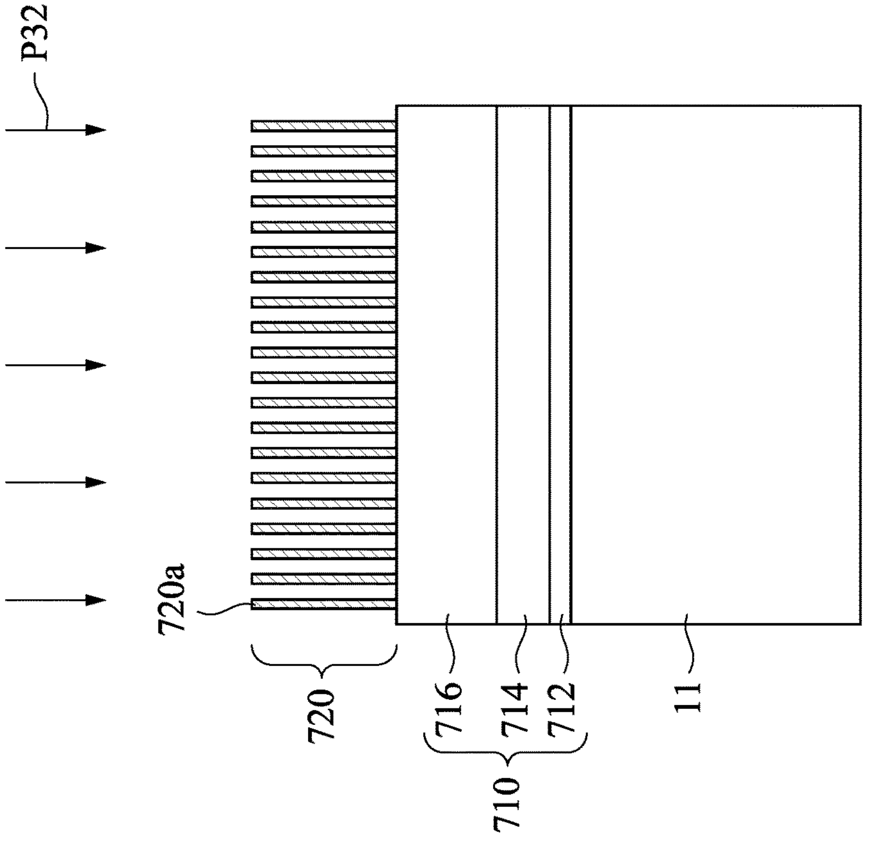

As shown in FIG. 8C, the exposed portions 720*a* of the photoresist layer 720 remain on the hard mask stack 710. As shown in FIG. 8D, one or more etching process P35 is performed to "open" the hard mask stack 710 by using the exposed portions 720*a* of the photoresist layer 720 as a mask. In other words, the hard mask stack 710 is patterned by using the photoresist layer 720. Subsequently, the patterned hard mask stack 710 may serve as a mask in the etching process on the substrate 11. In some embodiments, the etching process P35 may lead to a loss (i.e., the loss of the hard mask stack 710 and the exposed portions 720*a* of the photoresist layer 720). That is, the etching process P35 would consume the hard mask stack 710 and exposed portions 720*a* of the photoresist layer 720, and thus the hard mask stack 710 may be damaged as shown in FIG. 8D. Therefore, the substrate 11 is patterned into separated regions aligning with the hard mask stack 710 to have trenches T1 therein, since the hard mask stack 710 may serve as a mask during the etching process P35. Portions of the substrate 11 between the neighboring trenches T1 can be referred to as the semiconductor fin 58. In some embodiments, the semiconductor fin 58 may have a lateral dimension D6 less than about 15 nm.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a mandrel having a composition including an organometallic material and a photoacid generator. The organometallic material in the mandrel can absorb the radiation during the lithography process, which in turn reduces the critical dimension of the patterned features. Secondly, the organometallic material may lower the thickness of the mandrel, such that the collapse risks of the mandrel or the pattern of the spacer elements can be reduced. Thirdly, the organometallic material may provide a high etching selectivity relative to the underlying layer, such that the underlying layer can be only minimally consumed during an etching process. In addition, the photoacid generator in the mandrel can allow the mandrel serving as a positive tone resist or a negative tone resist for the lithography process.

In some embodiments, a method includes depositing a photoresist layer over a target layer, the photoresist layer comprising an organometallic material; exposing the photoresist layer to an extreme ultraviolet (EUV) radiation; developing the exposed photoresist layer to form a photoresist pattern; forming a spacer on a sidewall of the photoresist pattern; removing the photoresist pattern; after removing the photoresist pattern, patterning the target layer through the spacer. In some embodiments, the photoresist layer absorbs the EUV radiation having a wavelength in a range from about 13.3 to about 13.9 nm. In some embodiments, the organometallic material has a metal element comprising tin or zirconium. In some embodiments, the photoresist layer has a thickness less than about 20 nm. In some embodiments, developing the exposed photoresist layer is performed by a plasma etching process. In some embodiments, the plasma etching process gas is performed by introducing a gas mixture comprising HBr on the exposed photoresist layer. In some embodiments, the plasma etching process is performed by turning on a bias power source having a frequency in a range from about 13.56 MHz to about 2.45 GHz. In some embodiments, the plasma etching process is performed under a pressure in a range from about 3 mtorr to about 100 mtorr. In some embodiments, the plasma etching process is performed at a temperature in a range from about −140° C. to about 100° C. In some embodiments, the patterned target layer has a lateral dimension less than about 15 nm from a cross-sectional view.

In some embodiments, a method includes depositing a metal-containing mandrel layer over a target layer, the metal-containing mandrel layer serving as a developed resist; exposing the metal-containing mandrel layer by using a reflective reticle to form a pattern having an exposed portion and an unexposed portion; removing the unexposed portion of the metal-containing mandrel layer, while remains the exposed portion of the metal-containing mandrel layer in place; forming a metal oxide spacer on a sidewall of the exposed portion of the metal-containing mandrel layer; after forming a metal oxide spacer, removing the exposed portion of the metal-containing mandrel layer; after removing the exposed portion of the metal-containing mandrel layer, patterning the target layer through the metal oxide spacer. In some embodiments, the exposed portion of the metal-containing mandrel layer is exposed to a radiation emitted from a droplet in an extreme ultraviolet radiation lithography system, and the metal-containing mandrel layer comprises a metal element that has a same composition as the droplet. In some embodiments, removing the unexposed portion of the metal-containing mandrel layer is performed by an inductively coupled plasma apparatus, a capacitively coupled plasma apparatus, or a micro wave apparatus. In some embodiments, removing the exposed portion of the metal-containing mandrel layer is performed by a dry etching process. In some embodiments, forming the metal oxide spacer includes: comformally depositing a metal oxide layer over the exposed portion of the metal-containing mandrel layer; performing a plasma etching process, by introducing a gas mixture comprising $Cl_2$ or $BCl_3$ on the metal oxide layer to remove horizontal portions of the metal oxide layer, such that a metal oxide spacer is formed on the sidewall of the unexposed portion of the metal-containing mandrel layer. In some embodiments, the metal oxide spacer comprises titanium oxide.

In some embodiments, a method includes depositing a dielectric layer over a target layer; depositing a metal-containing photoresist layer over the dielectric layer; exposing the metal-containing photoresist layer to a radiation having a wavelength in a range from about 13.3 to about 13.9 nm; after exposing the metal-containing photoresist layer, developing the metal-containing photoresist layer to form a photoresist pattern; patterning the dielectric layer by using the photoresist pattern; etching the target layer through the patterned dielectric layer by using the patterned dielectric layer as an etch mask. In some embodiments, the metal-containing photoresist layer has a composition comprising $SnO_xC_yH_z$ or $ZrO_xC_yH_z$. In some embodiments, the metal-containing photoresist layer is silicon-free. In some embodiments, developing the metal-containing photoresist layer is performed by an anisotropic etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a hard mask stack over a target layer, the hard mask stack comprising a first silicon oxide mask layer, a tungsten carbide mask layer over the first silicon oxide mask layer, and a second silicon oxide mask layer over the tungsten carbide mask layer;

depositing a photoresist layer over the second silicon oxide mask layer of the hard mask stack, the photoresist layer being silicon-free and comprising an organometallic material, wherein the organometallic material has a metal element comprising zirconium, and the organometallic material comprises a metal core bonded to a photo-cleavable ligand having $sp^3$-hybridization and a non-photo-cleavable ligand having a crosslinkable functional group;

exposing the photoresist layer to an extreme ultraviolet (EUV) radiation;

developing the exposed photoresist layer to form a photoresist pattern;

forming a spacer on a sidewall of the photoresist pattern;

removing the photoresist pattern; and after removing the photoresist pattern, patterning the target layer through the spacer and the hard mask stack.

2. The method of claim 1, wherein the photoresist layer absorbs the EUV radiation having a wavelength in a range from about 13.3 to about 13.9 nm.

3. The method of claim 1, wherein the photoresist layer has a thickness less than about 20 nm.

4. The method of claim 1, wherein developing the exposed photoresist layer is performed by a plasma etching process.

5. The method of claim 4, wherein the plasma etching process gas is performed by introducing a gas mixture comprising HBr on the exposed photoresist layer.

6. The method of claim 4, wherein the plasma etching process is performed by turning on a bias power source having a frequency in a range from about 13.56 MHz to about 2.45 GHz.

7. The method of claim 1, wherein the photoresist layer is in contact with a top surface of the second silicon oxide mask layer.

8. The method of claim 7, wherein the second silicon oxide mask layer is in contact with a top surface of the tungsten carbide mask layer.

9. A method, comprising:

forming a hard mask stack over a target layer, the hard mask stack comprising a first dielectric mask layer, a metal-containing second mask layer over the first dielectric mask layer, and a third dielectric mask layer over the metal-containing second mask layer;

depositing a silicon-free metal-containing mandrel layer over the third dielectric mask layer of the hard mask stack, the silicon-free metal-containing mandrel layer serving as a developed resist and having a greater thickness than the first dielectric mask layer, the metal-containing second mask layer, and the third dielectric mask layer, wherein the silicon-free metal-containing mandrel layer comprises a zirconium-containing material, wherein the metal-containing mandrel layer comprises an organometallic material comprising a metal core bonded to a photo-cleavable ligand having $sp^3$-hybridization and a non-photo-cleavable ligand having a crosslinkable functional group;

exposing the silicon-free metal-containing mandrel layer by using a reflective reticle to form a pattern having an exposed portion and an unexposed portion;

removing the unexposed portion of the silicon-free metal-containing mandrel layer, while remaining the exposed portion of the silicon-free metal-containing mandrel layer in place;

forming a metal oxide spacer on a sidewall of the exposed portion of the silicon-free metal-containing mandrel layer, wherein the metal oxide spacer comprises titanium oxide and is in contact with the third dielectric mask layer of the hard mask stack;

after forming the metal oxide spacer, removing the exposed portion of the silicon-free metal-containing mandrel layer; and after removing the exposed portion of the silicon-free metal-containing mandrel layer, patterning the target layer through the metal oxide spacer.

10. The method of claim 9, wherein the exposed portion of the silicon-free metal-containing mandrel layer is exposed to a radiation emitted from a droplet in an extreme ultraviolet radiation lithography system, and the silicon-free metal-containing mandrel layer comprises a metal element that has a same composition as the droplet.

11. The method of claim 9, wherein removing the unexposed portion of the silicon-free metal-containing mandrel layer is performed by an inductively coupled plasma apparatus, a capacitively coupled plasma apparatus, or a micro wave apparatus.

12. The method of claim 9, wherein removing the exposed portion of the silicon-free metal-containing mandrel layer is performed by a dry etching process.

13. The method of claim 9, wherein forming the metal oxide spacer comprises:

conformally depositing a metal oxide layer over the exposed portion of the silicon-free metal-containing mandrel layer; and performing a plasma etching process, by introducing a gas mixture comprising $Cl_2$ or $BCl_3$ on the metal oxide layer to remove horizontal portions of the metal oxide layer, such that the metal oxide spacer is formed on the sidewall of the unexposed portion of the silicon-free metal-containing mandrel layer.

14. The method of claim 9, wherein the metal oxide spacer comprises titanium oxide.

15. The method of claim 9, wherein the silicon-free metal-containing mandrel layer comprises a quencher and a photoacid generator.

16. The method of claim 9, wherein the silicon-free metal-containing mandrel layer absorbs an extreme ultraviolet radiation having a wavelength in a range from about 13.3 to about 13.9 nm.

17. The method of claim 9, wherein the first dielectric mask layer and the third dielectric mask layer comprise silicon oxide, and the metal-containing second mask layer comprises tungsten carbide.

18. A method, comprising:

depositing a dielectric layer over a target layer;

depositing a silicon-free metal-containing photoresist layer serving as a mandrel over the dielectric layer, wherein the silicon-free metal-containing photoresist layer has a composition comprising ZrOxCyHz, and the metal-containing photoresist layer comprises a metal core bonded to a photo-cleavable ligand having sp3-hybridization and a non-photo-cleavable ligand having a crosslinkable functional group;

exposing the silicon-free metal-containing photoresist layer to a radiation having a wavelength in a range from about 13.3 nm to about 13.9 nm;

after exposing the silicon-free metal-containing photoresist layer, developing the silicon-free metal-containing photoresist layer to form a silicon-free photoresist pattern;

forming a metal oxide spacer on a sidewall of the silicon-free photoresist pattern, wherein the silicon-free photoresist pattern has a thickness less than 20 nm and maintains a sidewall profile sufficient to support the metal oxide spacer without collapsing;

after forming the metal oxide spacer, removing the silicon-free photoresist pattern;

patterning the dielectric layer by using the metal oxide spacer; and etching the target layer through the patterned dielectric layer by using the patterned dielectric layer as an etch mask.

19. The method of claim 18, wherein the silicon-free metal-containing photoresist layer has a thickness less than about 20 nm.

20. The method of claim 18, wherein the dielectric layer serves as a hard mask stack, the hard mask stack comprising a first silicon oxide layer, a tungsten carbide layer over the first silicon oxide layer, and a second silicon oxide layer over the tungsten carbide layer, and wherein a thickness of the first silicon oxide layer is less than a thickness of the tungsten carbide layer, and the thickness of the tungsten carbide layer is less than a thickness of the second silicon oxide layer.

* * * * *